(12) United States Patent
Myers

(10) Patent No.: US 10,747,655 B2
(45) Date of Patent: Aug. 18, 2020

(54) METHOD AND SYSTEM FOR PROGRAMMATICALLY TESTING A USER INTERFACE

(71) Applicant: Express Scripts Strategic Development, Inc., St. Louis, MO (US)

(72) Inventor: Christopher M. Myers, Dublin, OH (US)

(73) Assignee: Express Scripts Strategic Development, Inc., St. Louis, MO (US)

(*) Notice: Subject to any disclaimer, the term of this patent is extended or adjusted under 35 U.S.C. 154(b) by 79 days.

(21) Appl. No.: 16/196,321

(22) Filed: Nov. 20, 2018

(65) Prior Publication Data

US 2020/0159651 A1 May 21, 2020

(51) Int. Cl.
*G06F 11/36* (2006.01)
*G06N 3/04* (2006.01)
*G06F 30/20* (2020.01)

(52) U.S. Cl.
CPC ...... *G06F 11/3688* (2013.01); *G06F 11/3664* (2013.01); *G06F 11/3696* (2013.01); *G06F 30/20* (2020.01); *G06N 3/0454* (2013.01); *G06N 3/0472* (2013.01)

(58) Field of Classification Search
CPC .............................. G06F 11/3688; G06F 30/20
USPC ........................................................ 717/124
See application file for complete search history.

(56) References Cited

U.S. PATENT DOCUMENTS

| | | | |
|---|---|---|---|
| 6,925,454 B2* | 8/2005 | Lam | G06Q 10/063 706/45 |
| 7,137,103 B2* | 11/2006 | Aizenbud-Reshef | G06F 11/3676 717/124 |
| 7,415,437 B2* | 8/2008 | Marvin, III | G06Q 10/06 705/37 |
| 8,490,193 B2* | 7/2013 | Sarraute Yamada | H04L 41/0823 709/206 |
| 10,020,982 B2 | 7/2018 | Iwamura et al. | |
| 2003/0005413 A1* | 1/2003 | Beer | G06F 11/3664 717/125 |

(Continued)

OTHER PUBLICATIONS

Written Opinion and Search Report, Application PCT/US19/62152, dated Mar. 19, 2020.

(Continued)

*Primary Examiner* — Lewis A Bullock, Jr.
*Assistant Examiner* — Theodore E Hebert
(74) *Attorney, Agent, or Firm* — Harness, Dickey & Pierce, PLC

(57) ABSTRACT

A computer system for testing a user interface (UI) includes a test execution module and an analysis module. The analysis module is configured to (i) analyze a state of the UI, (ii) in response to determining that the state satisfies criteria for a goal associated with the UI, output a success indicator, and (iii) in response to determining that the state does not satisfy the criteria, output a set of actions. The test execution module is configured to, in response to the output being the set of actions: execute an action from the set of actions; update a test distance, and supplement test data. The test execution module is further configured to (i) in response to the output being the success indicator, store the test distance and the test data in a collection of completed tests and (ii) determine a shortest path to the goal in the UI.

14 Claims, 51 Drawing Sheets

(56) References Cited

U.S. PATENT DOCUMENTS

| | | | | |
|---|---|---|---|---|
| 2005/0114829 A1* | 5/2005 | Robin | .................... | G06Q 10/06 |
| | | | | 717/101 |
| 2009/0043621 A1* | 2/2009 | Kershaw | ................ | G06Q 10/06 |
| | | | | 705/7.16 |
| 2010/0064282 A1* | 3/2010 | Triou | .................. | G06F 11/3696 |
| | | | | 717/125 |
| 2013/0326427 A1* | 12/2013 | Elias | ........................ | G06F 9/451 |
| | | | | 715/854 |
| 2016/0275233 A1 | 9/2016 | Sukup et al. | | |
| 2018/0171762 A1 | 6/2018 | Pabon et al. | | |
| 2018/0256964 A1 | 9/2018 | Sukup et al. | | |
| 2019/0250891 A1* | 8/2019 | Kumar | ................. | G06K 9/6257 |

OTHER PUBLICATIONS https://www.genesys.com/solutions/customer-service, as early as Nov. 20, 2018.
https://www.nuance.com/healthcare.html, as early as Nov. 20, 2018.

* cited by examiner

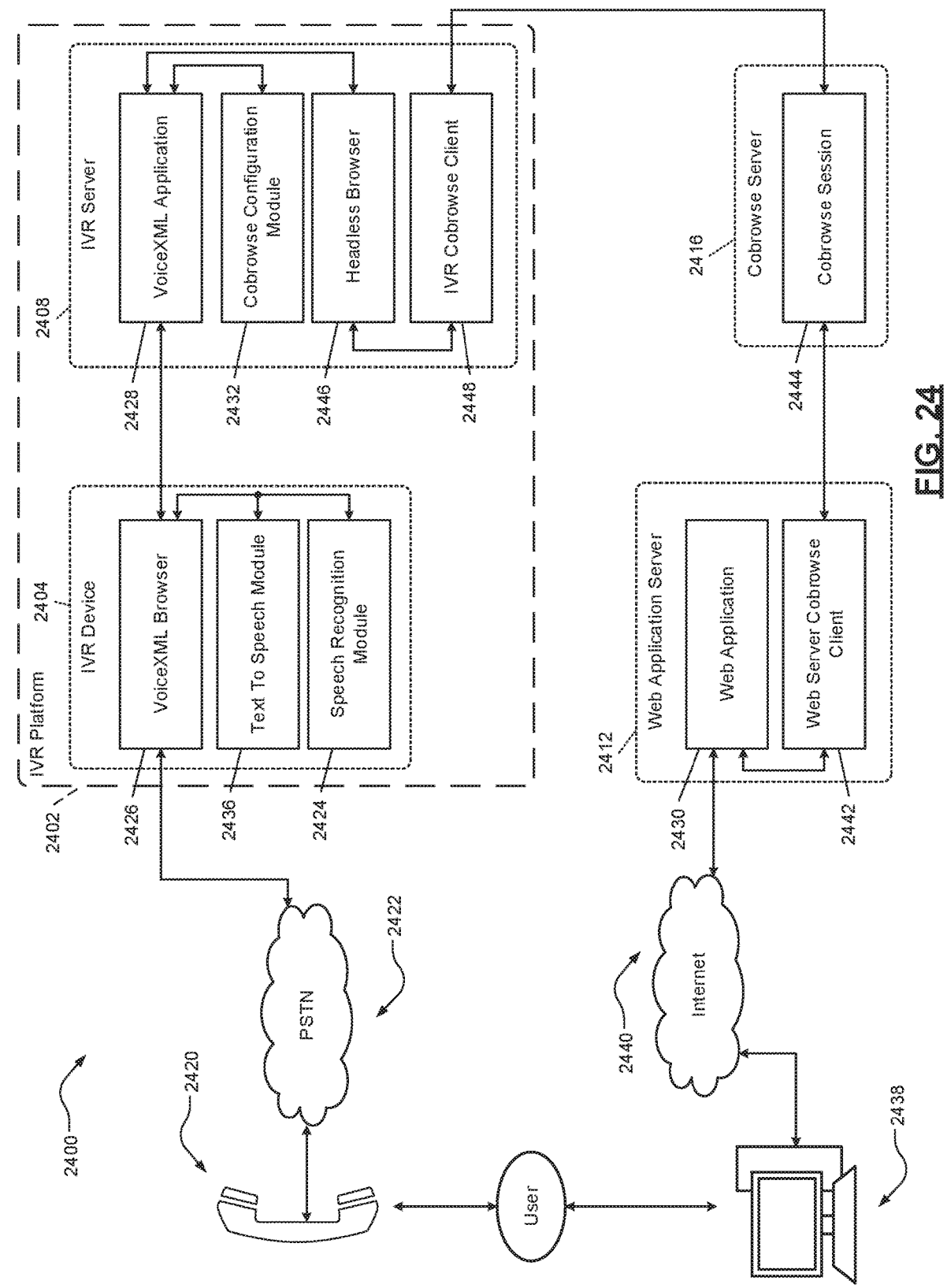

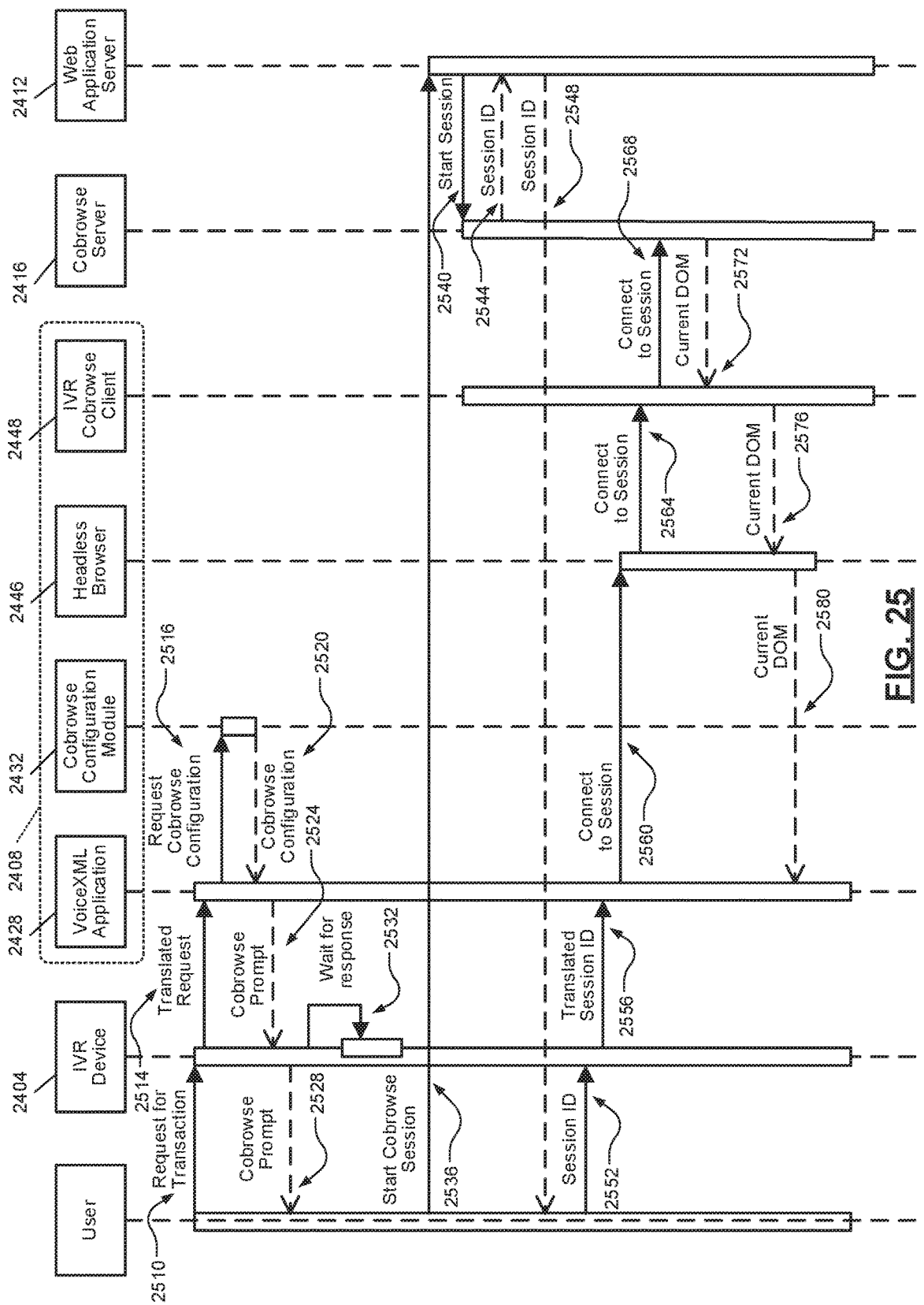

METHOD AND SYSTEM FOR PROGRAMMATICALLY TESTING A USER INTERFACE

FIELD

The present disclosure relates to user interface testing and, more particularly, to determining a shortest path to a goal in the user interface to transform the user interface.

BACKGROUND

Currently, entities such as companies offer customers a variety of methods to access information—for example, a status of an order that the customer placed. The customer may call the company in an attempt to obtain the information. Alternatively, the customer may access a web page associated with the company to obtain the information. The customer may need to navigate a user interface (UI) of an application to access the information. As an example, the customer may need to log in to a web application with a username and password before they are able to access the information. Many customers may be unable to properly navigate the UI—for example, to log in to the web application and navigate to the pertinent screen—and, therefore, may opt to call the company to obtain the information.

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

A computer system for testing a user interface (UI) is disclosed. The computer system includes a test creation module configured to obtain testing parameters. The testing parameters include (i) a location at which the UI can be accessed and (ii) criteria for a goal associated with the UI. The computer system also includes a test execution module configured to (i) obtain a state of the UI based on the location and (ii) set a current position to a predetermined location within the UI. The system further includes an analysis module configured to (i) analyze a designated state of the UI, (ii) in response to determining that the designated state satisfies the criteria for the goal, output a success indicator, and (iii) in response to determining that the designated state of the UI does not satisfy the criteria for the goal, determine a set of possible actions based on UI elements within the designated state and set the outcome to the set of possible actions. The test execution module is configured to provide a state of the UI to the analysis module and receive the output from the analysis module. The test execution module is also configured to, in response to the received output being the set of possible actions: select an action associated with a first UI element from the set of possible actions; execute the selected action; identify a point of the first UI element; update a test distance based on (i) coordinates of the point and (ii) coordinates of the current position; set the current position to the point; and supplement test data with (i) the selected action and (ii) the set of possible actions. The test execution module is further configured to (i) in response to the received output being the success indicator, store the test distance and the test data in a collection of completed tests and (ii) determine a shortest path to the goal in the UI based on the collection of completed tests.

In other features, the testing parameters include a number of permitted tests. The test execution module is configured to increment a counter in response to the received output being the success indicator. Determining the shortest path includes selecting, in response to determining that a value of the counter is greater than or equal to the number of permitted tests, a completed test of the collection of completed tests with the shortest test distance.

In yet other features, the point is a closest point of the first UI element to the current position and updating the test distance includes (i) determining a distance between the coordinates of the current position and the coordinates of the point and (ii) adding the determined distance to the test distance.

In other features, the analysis module is configured to, for each action in the set of possible actions, (i) determine a probability that performing the action will result in the goal and (ii) store the determined probability in the set of possible actions. Selecting the action from the set of possible includes selecting the action from the set of possible actions based on probabilities stored in the set of possible actions.

In further features, the computer system includes a neural network module configured to operate a plurality of neural networks. The analysis module is configured to selectively use at least one neural network of the plurality of neural networks to determine the probability that performing the action will result in the goal.

In yet further features, the plurality of neural networks includes at least one of a long short-term memory neural network and a convolutional neural network.

In other features, the computer system includes a training module configured to, in response to the received output being the success indicator: train the plurality of neural networks using the test data; determine a performance of the plurality of neural networks after training based on the probabilities stored in the collection of completed tests; and in response to determining that a value of the performance of the plurality of neural networks after training is greater than a predetermined value, set a status of the plurality of neural networks to trained.

In further features, the computer system includes a Monte Carlo module configured to perform a Monte Carlo simulation to generate a random value and a reweighting module configured to (i) in response to the status of the plurality of neural networks being trained, update each probability stored in the test data based on an output of at least one neural network of the plurality of neural networks and (ii) in response to the status of the plurality of neural networks not being trained, update each probability stored in the test data with a random value generated by the Monte Carlo module.

A method for testing a user interface (UI) is disclosed. The method includes obtaining testing parameters. The testing parameters include (i) a location at which the UI can be accessed and (ii) criteria for a goal associated with the UI. The method also includes: obtaining a state of the UI based on the location; setting a current position to a predetermined location within the UI; analyzing a designated state of the UI; in response to determining that the designated state satisfies the criteria for the goal, setting an output to a success indicator; and in response to determining that the designated state does not satisfy the criteria for the goal, (i) determining a set of possible actions based on UI elements within the designated state and (ii) setting the output to the set of possible actions. The method further includes, in response to the output being the set of possible actions:

selecting an action associated with a first UI element from the set of possible actions; executing the selected action; identifying a point of the first UI element; updating a test distance based on (i) coordinates of the point and (ii) coordinates of the current position; setting the current position to the point; and supplement test data with (i) the selected action and (ii) the set of possible actions. The method also includes, (i) in response to the output being the success indicator, storing the test distance and the test data in a collection of completed tests and (ii) determining a shortest path to the goal in the UI based on the collection of completed tests.

In other features, the testing parameters include a number of permitted tests. The method includes incrementing a counter in response to the output being the success indicator. Determining the shortest path includes, in response to determining that a value of the counter is greater than or equal to the number of permitted tests, selecting a completed test of the collection of completed tests with the shortest test distance.

In yet other features, the point is a closest point of the first UI element to the current position. Updating the test distance includes (i) determining a distance between the coordinates of the current position and the coordinates of the point and (ii) adding the determined distance to the test distance.

In other features, the method includes, for each action in the set of possible actions, (i) determining a probability that performing the action will result in the goal and (ii) storing the determined probability in the set of possible actions. Selecting the action from the set of possible actions includes selecting the action from the set of possible actions based on probabilities stored in the set of possible actions.

In further features, the method includes, in response to the output being the success indicator: training a plurality of neural networks using the test data; determining a performance of the plurality of neural networks after training based on the probabilities stored in the collection of completed tests; and in response to determining that a value of the performance of the plurality of neural networks after training is greater than a predetermined value, setting a status of the plurality of neural networks to trained.

In yet further features, the method includes, in response to the status of the plurality of neural networks being trained, updating each probability stored in the test data based on an output of at least one neural network of the plurality of neural networks and in response to the status of the plurality of neural networks not being trained, updating each probability stored in the test data with a random value.

A non-transitory computer-readable medium storing processor-executable instructions is disclosed. The instructions include obtaining testing parameters. The testing parameters include (i) a location at which a user interface (UI) can be accessed and (ii) criteria for a goal associated with the UI. The instructions also include: obtaining a state of the UI based on the location; setting a current position to a predetermined location within the UI; analyzing a designated state of the UI; in response to determining that the designated state satisfies the criteria for the goal, setting an output to a success indicator; and in response to determining that the designated state does not satisfy the criteria for the goal, (i) determining a set of possible actions based on UI elements within the designated state and (ii) setting the output to the set of possible actions. The instructions further include, in response to the output being the set of possible actions: selecting an action associated with a first UI element from the set of possible actions; executing the selected action; identifying a point of the first UI element; updating a test distance based on (i) coordinates of the point and (ii) coordinates of the current position; setting the current position to the point; and supplementing test data with (i) the selected action and (ii) the set of possible actions. The instructions also include (i) in response to the output being the success indicator, storing the test distance and the test data in a collection of completed tests and (ii) determining a shortest path to the goal in the UI based on the collection of completed tests.

In other features, the testing parameters include a number of permitted tests. The instructions include incrementing a counter in response to the output being the success indicator. Determining the shortest path includes, in response to determining that a value of the counter is greater than or equal to the number of permitted tests, selecting a completed test of the collection of completed tests with the shortest test distance.

In yet other features, the point is a closest point of the first UI element to the current position. Updating the test distance includes (i) determining a distance between the coordinates of the current position and the coordinates of the point and (ii) adding the determined distance to the test distance.

In other features, the instructions include, for each action in the set of possible actions, (i) determining a probability that performing the action will result in the goal and (ii) storing the determined probability in the set of possible actions. Selecting the action from the set of possible includes selecting the action from the set of possible actions based on probabilities stored in the set of possible actions.

In further features, the instructions include, in response to the output being the success indicator: training a plurality of neural networks using the test data; determining a performance of the plurality of neural networks after training based on the probabilities stored in the collection of completed tests; and setting, in response to determining that a value of the performance of the plurality of neural networks after training is greater than a predetermined value, a status of the plurality of neural networks to trained.

In yet further features, the instructions include (i) in response to the status of the plurality of neural networks being trained, updating each probability stored in the test data based on an output of at least one neural network of the plurality of neural networks and (ii) in response to the status of the plurality of neural networks not being trained, updating each probability stored in the test data with a random value.

A computer system for improving a user interface (UI) is disclosed. The computer system includes a reinforcement module configured to obtain (i) path information indicating a shortest path to a goal in the UI and (ii) a set of user interaction experiments associated with seeking the goal. Each experiment in the set of user interaction experiments includes user tracking data, the path information includes a plurality of steps, and each step of the plurality of steps is associated with a page of the UI. The computer system also includes a distance module configured to, for each page of the UI, determine a reinforcement distance for the page based on the set of user interaction experiments and a step analysis module configured to, for each step of the plurality of steps, determine a count of times that the user tracking data of the set of user interaction experiments indicates a deviation from the step. The determination is based on the determined reinforcement distance for the page of the UI associated with the step. The reinforcement module is configured to, for each step of the plurality of steps, (i) determine whether the step requires reinforcement based on the count and (ii) in response to determining that the step requires reinforcement, generate a reinforcement for the step. Generating the reinforcement includes at least one of generating a prompt for an action associated with the step and altering a UI element associated with the step.

In other features, determining a reinforcement distance for a page includes determining at least one distance between user tracking data of the set of user interaction experiments and the shortest path.

In yet other features, determining a reinforcement distance for a page includes determining (i) a median successful distance for the page based on the user tracking data of a first subset of user interaction experiments that successfully reached the goal and (ii) a median failure distance for the page based on the user tracking data of a second subset of user interaction experiments.

In further features, the distance module is configured to, for each page of the UI, generate at least one random distance that is less than the median successful distance for the page and greater than the median failure distance for the page. The computer system includes a prediction module configured to, for each sample in user tracking data of an experiment in the set of user interaction experiments, predict an outcome of the experiment based on (i) a generated random distance for the page associated with the sample, (ii) coordinates of the sample, and (iii) coordinates of a point along the shortest path and compare the predicted outcome to a stored outcome of the experiment. The prediction module is also configured to output a result of the comparisons.

In other features, predicting an outcome of the experiment includes (i) calculating a distance between the coordinates of the sample and the coordinates of the point along the shortest path and (ii) determining the predicted outcome based on a comparison of the determined distance and the random distance for the page associated with the sample. Comparing the predicted outcome to the stored outcome includes, in response to the predicted outcome matching the stored outcome, incrementing a successful prediction count. Outputting the result of the comparisons includes outputting the successful prediction count.

In yet other features, the distance module is configured to, for each randomly generated distance, generate a fitness value based at least on the successful prediction count outputted by the prediction module. The computer system includes an analysis module configured to perform a cluster analysis of the generated fitness values.

In further features, the distance module is configured to, for each page of the UI, in response to the cluster analysis of the generated fitness values identifying a single cluster, set the randomly generated distance associated with the page with the highest fitness value as the reinforcement distance for the page.

A method for improving a user interface (UI) is disclosed. The method includes obtaining (i) path information indicating a shortest path to a goal in the UI and (ii) a set of user interaction experiments associated with seeking the goal. Each experiment in the set of user interaction experiments includes user tracking data, the path information includes a plurality of steps, and each step of the plurality of steps is associated with a page of the UI. The method also includes for each page of the UI, determining a reinforcement distance for the page based on the set of user interaction experiments and for each step of the plurality of steps, determining a count of times that the user tracking data of the set of user interaction experiments indicates a deviation from the step. The determination is based on the determined reinforcement distance for the page of the UI associated with the step. The method also includes determining whether the step requires reinforcement based on the count and in response to determining that the step requires reinforcement, generating a reinforcement for the step. Generating the reinforcement includes at least one of generating a prompt for an action associated with the step and altering a UI element associated with the step.

In other features, determining the reinforcement distance for a page includes determining at least one distance between user tracking data of the set of user interaction experiments and the shortest path.

In yet other features, determining the reinforcement distance for a page includes determining (i) a median successful distance for the page based on the user tracking data of a first subset of user interaction experiments that successfully reached the goal and (ii) a median failure distance for the page based on the user tracking data of a second subset of user interaction experiments.

In further features, determining the reinforcement distance for a page includes generating at least one random distance that is less than the median successful distance for the page and greater than the median failure distance for the page. The method also includes, for each sample in user tracking data of an experiment in the set of user interaction experiments, predicting an outcome of the experiment based on (i) a generated random distance for the page associated with the sample, (ii) coordinates of the sample, and (iii) coordinates of a point along the shortest path and comparing the predicted outcome to a stored outcome of the experiment.

In other features, predicting the outcome of the experiment includes calculating a distance between the coordinates of the sample and the coordinates of the point along the shortest path and determining the predicted outcome based on a comparison of the determined distance and the random distance for the page associated with the sample. Comparing the predicted outcome to the stored outcome includes, in response to the predicted outcome matching the stored outcome, incrementing a successful prediction count.

In yet other features, determining the reinforcement distance for a page includes, for each randomly generated distance, generating a fitness value based on at least the successful prediction count associated with randomly generated distance and performing a cluster analysis of the generated fitness values.

In further features, determining the reinforcement distance for a page includes, in response to the cluster analysis of the generated fitness values identifying a single cluster, setting the randomly generated distance associated with the page with the highest fitness value as the reinforcement distance for the page.

A non-transitory computer-readable medium storing processor-executable instructions is disclosed. The instructions include obtaining (i) path information indicating a shortest path to a goal in a user interface (UI) and (ii) a set of user interaction experiments associated with seeking the goal. Each experiment in the set of user interaction experiments includes user tracking data, the path information includes a plurality of steps, and each step of the plurality of steps is associated with a page of the UI. The instructions also include, for each page of the UI, determining a reinforcement distance for the page based on the set of user interaction experiments and for each step of the plurality of steps, determining a count of times that the user tracking data of the set of user interaction experiments indicates a deviation from the step. The determination is based on the determined reinforcement distance for the page of the UI associated with the step. The instructions further include, for each step of the plurality of steps, determining whether the step requires reinforcement based on the count and in response to determining that the step requires reinforcement, generating a reinforcement for the step. Generating the reinforcement includes at least one of generating a prompt for an action associated with the step and altering a UI element associated with the step.

In other features, determining the reinforcement distance for a page includes determining (i) a median successful distance for the page based on the user tracking data of a first subset of user interaction experiments that successfully reached the goal and (ii) a median failure distance for the page based on the user tracking data of a second subset of user interaction experiments.

In yet other features, determining the reinforcement distance for a page includes generating at least one random distance that is less than the median successful distance for the page and greater than the median failure distance for the page. The instructions also include, for each sample in user tracking data of an experiment in the set of user interaction experiments, predicting an outcome of the experiment based on (i) a generated random distance for the page associated with the sample, (ii) coordinates of the sample, and (iii) coordinates of a point along the shortest path. The instructions further include comparing the predicted outcome to a stored outcome of the experiment.

In further features, predicting the outcome of the experiment includes (i) calculating a distance between the coordinates of the sample and the coordinates of the point along the shortest path and (ii) determining the predicted outcome based on a comparison of the determined distance and the random distance for the page associated with the sample. Comparing the predicted outcome to the stored outcome includes, in response to the predicted outcome matching the stored outcome, incrementing a successful prediction count.

In other features, determining the reinforcement distance for a page includes, for each randomly generated distance, (i) generating a fitness value based on at least the successful prediction count associated with the randomly generated distance and (ii) performing a cluster analysis of the generated fitness values.

In yet other features, determining the reinforcement distance for a page includes, in response to the cluster analysis of the generated fitness values identifying a single cluster, setting the randomly generated distance associated with the page with the highest fitness value as the reinforcement distance for the page.

A system for integrating a telephone system and a computing system is disclosed. The system includes an interactive voice response (IVR) platform configured to obtain a computer-readable command based on an audio input from a user and in response to obtaining the computer-readable command, (i) determine a web application that corresponds to the computer-readable command, (ii) determine a goal in the web application associated with the computer-readable command, and (iii) obtain information indicating a shortest user interface path to the goal in the web application. The system also includes a cobrowse client configured to receive a document object model (DOM) of a current state of the web application from a cobrowse session for a web server hosting the web application. The IVR platform is configured to, based on the DOM from the cobrowse client, determine a next user interface action along the shortest user interface path and generate a voice prompt for the user based on the next user interface action. The cobrowse client is configured to receive an updated DOM in response to execution by the user of the next user interface action.

In other features, the IVR platform is configured to connect to the cobrowse client using a headless browser.

In yet other features, obtaining the audio input from the user includes obtaining the audio input via a telephone of the user.

In other features, the IVR platform is configured to obtain a cobrowse session identifier from the user, transmit the cobrowse session identifier to the cobrowse session, and receive the DOM of the current state in response to transmitting the cobrowse session identifier.

In further features, obtaining the cobrowse session identifier includes generating a voice instruction for the user that requests the user to (i) initiate the cobrowse session and (ii) provide the cobrowse session identifier to the IVR platform.

In other features, the IVR platform is configured to, in response to expiration of a predetermined time period subsequent to generating the voice prompt during which no updated DOM is received, (i) determine a reinforcement based on the next user interface action along the shortest user interface path and (ii) generate an audio reinforcement prompt for the user based on the determined reinforcement.

In further features, the audio reinforcement prompt specifies a location of a user interface element associated with the next user interface action.

A method for integrating a telephone system and a computer system is disclosed. The method includes: obtaining a computer-readable command based on an audio input from a user; determining a web application that corresponds to the computer-readable command; determining a goal in the web application associated with the computer-readable command; obtaining information indicating a shortest user interface path to the goal in the web application; receiving a document object model (DOM) of a current state of the web application from a cobrowse session for a web server hosting the web application; and determining a next user interface action along the shortest user interface path. The method also includes generating a voice prompt for the user based on the next user interface action and receiving an updated DOM in response to execution by the user of the next user interface action.

In other features, receiving the DOM of the current state of the web application includes accessing a cobrowse client via a headless browser.

In yet other features, obtaining the audio input from the user includes obtaining the audio input via a telephone of the user.

In other features, the method includes obtaining a cobrowse session identifier from the user; transmitting the cobrowse session identifier to the cobrowse session; and receiving the DOM of the current state includes receiving the DOM in response to transmitting the cobrowse session identifier.

In further features, obtaining the cobrowse session identifier includes generating a voice instruction for the user that requests the user to (i) initiate the cobrowse session and (ii) provide the cobrowse session identifier via a PSTN.

In other features, the method includes, in response to expiration of a predetermined time period subsequent to generating the voice prompt during which no updated DOM is received, (i) determining a reinforcement based on the next user interface action along the shortest user interface path and (ii) generating an audio reinforcement prompt for the user based on the determined reinforcement.

In further features, the audio reinforcement prompt specifies a location of a user interface element associated with the next user interface action.

A non-transitory computer-readable medium storing processor-executable instructions is disclosed. The instructions include: obtaining a computer-readable command based on an audio input from a user; determining a web application that corresponds to the computer-readable command; determining a goal in the web application associated with the computer-readable command; obtaining information indicating a shortest user interface path to the goal in the web application; receiving a document object model (DOM) of a current state of the web application from a cobrowse session for a web server hosting the web application; and determining a next user interface action along the shortest user interface path. The instructions also include generating a voice prompt for the user based on the next user interface action and receiving an updated DOM in response to execution by the user of the next user interface action.

In other features, obtaining the audio input from the user includes obtaining the audio input via a telephone of the user.

In yet other features, the instructions includes: obtaining a cobrowse session identifier from the user; transmitting the cobrowse session identifier to the cobrowse session; and receiving the DOM of the current state includes receiving the DOM in response to transmitting the cobrowse session identifier.

In further features, obtaining the cobrowse session identifier includes generating a voice instruction for the user that requests the user to (i) initiate the cobrowse session and (ii) provide the cobrowse session identifier via a PSTN.

In other features, the instructions include, in response to expiration of a predetermined time period subsequent to generating the voice prompt during which no updated DOM is received, (i) determining a reinforcement based on the next user interface action along the shortest user interface path and (ii) generating an audio reinforcement prompt for the user based on the determined reinforcement.

In further features, the audio reinforcement prompt specifies a location of a user interface element associated with the next user interface action.

Further areas of applicability of the present disclosure will become apparent from the detailed description, the claims, and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings.

FIG. 24 is a functional block diagram of an example customer migration system.

FIG. 25 is a sequence diagram that represents an example initiation of a cobrowse session by the customer migration system.

In the drawings, reference numbers may be reused to identify similar and/or identical elements.

DETAILED DESCRIPTION

Introduction

A user interface (UI) provides access to information and may permit various actions to be performed. However, a user may need to perform certain actions in the UI before the user is able to access information of interest. As an example, a user may need to first log in with a username and password. Then, before they can access the information, they may need to navigate to a certain screen of the UI and select a particular button. Many users may not be able to efficiently navigate the UI to obtain the information.

In various implementations, a shortest path to a goal in a UI—such as logging in and obtaining an order status—may be automatically determined. The length of the path may be measured using a variety of metrics, such as the number of inputs required, the total movement of the mouse, the number of keystrokes or mouse click events, etc. In various implementations, the length of the path may be assessed based on total Euclidean distance of mouse travel—that is, the sum of linear movements to each UI element where interaction is necessary (for example, from a starting point to a textbox, from the textbox to a submit button, and from the location of the submit button to a link that is to be selected).

The shortest path may be used to enhance the UI. For example, empirical data (such as eye or mouse movement) measured while users are interacting with the UI may be used to determine when users of the UI are more likely to deviate from the determined shortest path. The UI may be enhanced based on the determined deviations—for example, UI elements associated with the deviations may be changed, prompts related to the shortest path may be generated, and/or elements of the UI can he highlighted to aid users in successfully navigating the UI.

These UI enhancements may also be used by a customer migration system to automatically guide a user who has called an interactive voice response (IVR) platform (such as a customer service number) to a particular state of a UI. For example, the customer migration system may assist the user in successfully logging in to a web application and navigating to a state of the web site where the user can obtain the desired information. The customer migration system may instruct the user to access a web page and then generate audio and visual prompts based on the UI enhancements to guide the user to perform actions in the UI that correspond to the determined shortest path to the goal.

Figure 1:
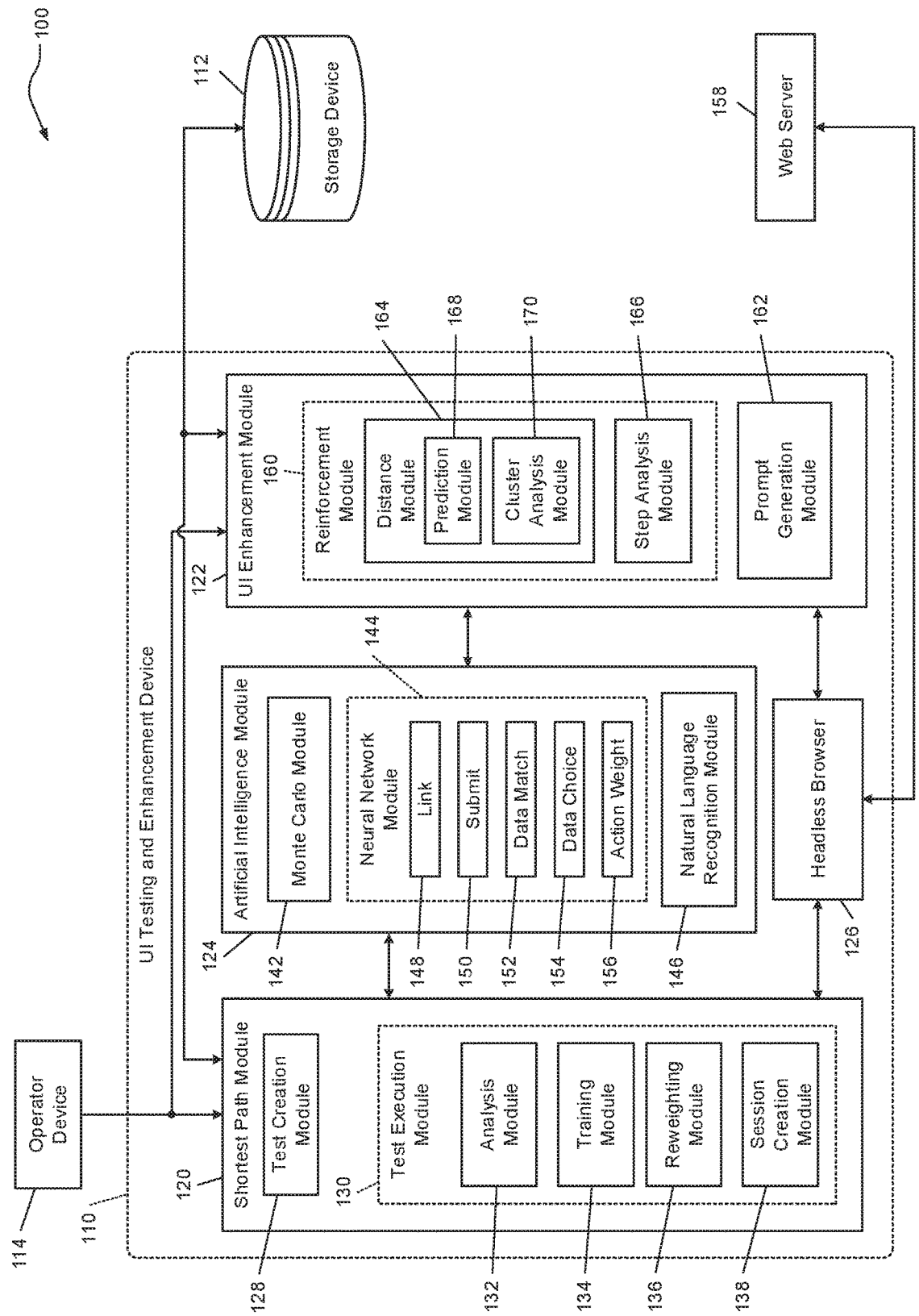
FIG. 1 is a functional block diagram of an example system for testing a user interface (UI).

FIG. 1 is a block diagram an of example implementation of a system 100 for testing a UI. The system 100 includes a UI testing and enhancement device 110, a storage device 112, and an operator device 114. The UI testing and enhancement device 110 may include a shortest path module 120, a UI enhancement module 122, an artificial intelligence (AI) module 124, and a headless browser 126. The storage device 112 may include nonvolatile storage in communication with the shortest path module 120 and the UI enhancement module 122.

The shortest path module 120 determines a shortest path to a goal in a UI. For example, the shortest path module 120 may determine the least number of steps to log in to a web application. A step consists of an action taken on a page of the UI—for example, clicking on a link or entering data into a text entry field. Execution of a step may change the state of the UI—that is, transitioning to a different screen or state of the UI, or changing the current state or screen so that more or different information or choices are available.

The shortest path module 120 includes a test creation module 128 and a test execution module 130. The test execution module 130 includes an analysis module 132, a training module 134, a reweighting module 136, and a session creation module 138.

The AI module 124 includes a Monte Carlo module 142, a neural network module 144, and a natural language recognition module 146. The Monte Carlo module 142 performs a Monte Carlo simulation to generate pseudorandom values. The neural network module 144 may include a link neural network 148, a submit neural network 150, a data match neural network 152, a data choice neural network 154, and an action weight neural network 156, each of which is described in more detail below.

The link neural network 148, the submit neural network 150, the data choice neural network 154, and the action weight neural network 156 each generate a probability that a given input will result in reaching the goal. For example, the data match neural network 152 generates a probability that a piece of data matches a data entry field—such as the probability that a particular text string matches a text entry field. The natural language recognition module 146 parses a text input and determines whether the input contains a specified text string. For example, the natural language recognition module 146 may be used to determine if a state of the UI includes a specific text string.

The headless browser 126 is a web browser that does not have a graphical user interface. The headless browser 126 may include a command-line interface used to load and interact with web pages, such as web pages of a web application hosted on a web server 158.

The test creation module 128 obtains test parameters and generates test configuration data. The test parameters may include a starting address of the UI, a goal, a maximum number of permitted steps to the goal, the number of tests to be conducted, and variable data. The variable data may include text strings—such as usernames or passwords—or menu options that may be entered into data entry fields of the UI. In some implementations, the test creation module 128 may receive the test parameters from the operator device 114. In other implementations, the test creation module 128 may retrieve previously stored test parameters from the storage device 112. The test creation module 128 provides the test configuration data to the test execution module 130. The test creation module 128 may also store the test configuration data in the storage device 112.

The test execution module 130 uses the test configuration data generated by the test creation module 128 to perform tests on the UI to determine a shortest path in the UI to the specified goal. In response to receiving the test configuration data from the test creation module 128, the test execution module 130 initiates the first test of the UI. For example, the test execution module 130 instructs the headless browser 126 to load the starting page of the UI. The headless browser 126 loads the requested web page and provides a document object model (DOM) of the loaded web page to the test execution module 130.

The test execution module 130 sets a position of the cursor to a predetermined position (such as the center) of the UI, marks each variable in the test configuration as unused, and sets the state of the neural networks in the neural network module 144 to untrained. The test execution module 130 uses the analysis module 132 to analyze the current state of the UI—in other words, the currently loaded web page.

The analysis module 132 may use the DOM received from the headless browser 126 to perform the analysis.

The analysis module 132 first determines whether the current state of the UI satisfies the goal criteria—for example, that the loaded web page includes goal text. The analysis module 132 may use the natural language recognition module 146 to parse the text of the loaded web page to determine whether it includes the goal text. In response to locating the goal text, the analysis module 132 determines that the current test is a success. The current test is considered a failure when a maximum number of steps has been reached without the goal text being found. In response to determining that the current test is neither a success or failure, the analysis module 132 determines whether the current state of the UI includes interactive elements—for example, links, data entry fields, and elements that submit data—that can be executed to change the state of the UI.

The analysis module 132 assigns a probability to an action associated with each interactive element located in the loaded page. The probability represents the likelihood that executing the action will result in reaching the goal. If the neural networks in the neural network module 144 are trained, the analysis module 132 uses the neural networks in the neural network module 144 to determine the probability. The analysis module 132 also assigns a weighting to each type of action link, entry field, and submit. If the neural networks in the neural network module 144 are trained, the analysis module 132 uses the neural networks in the neural network module 144 to determine the weight for each action type. The analysis module 132 then determines a weighted probability for each action. The analysis module 132 provides each identified action and the associated weighted probability to the test execution module 130. If the neural networks in the neural network module 144 are not yet trained, the analysis module 132 uses the Monte Carlo module 142 to assign random values for the probabilities of action success and action type success.

The test execution module 130 selects the action with the highest probability among the actions provided by the analysis module 132. The test execution module 130 determines the distance between the current position and the nearest point of the interactive element associated with the selected action. The test execution module 130 updates a total distance of the current test based on the calculated distance and then stores both the calculated distance as well as the total distance. The test execution module 130 instructs the headless browser to perform the selected action. The executed action is referred to as a step and the screen of the UI that results from the execution of the action is a state. In other words, performing a step results in transitioning the UI from a first state to a second state or results in transforming the first state.

The test execution module 130 concludes that the current test is a failure (that is, not a shortest pat) if the total distance of the current test is greater than a previously identified path to the goal. Otherwise, the test execution module 130 proceeds with the test and analyzes the current state of the UI, as described above.

In response to determining that the current test is either a success or failure, the test execution module 130 logs the results of the completed test. In response to determining that the current test was a success, the test execution module 130 stores the steps of the current test as the shortest path to the goal. The test execution module 130 then determines whether the number of completed tests has reached the maximum number of tests. If so, the test execution module 130 outputs the shortest path found to the goal.

If more tests are needed, the test execution module 130 begins a new test. If the just-completed test was a success, the training module 134 trains (or, after the first training, retrains or supplements the training of) the neural networks in the neural network module 144. The training module uses the results of the completed, successful test to generate training data. The training module 134 saves the neural networks in the neural network module 144 and the associated state of the neural networks—such as trained or untrained. In some implementations, the training module 134 may store both the neural networks and their associated state in storage device 112.

The training module 134 then retrains the link neural network 148, the submit neural network 150, the data match neural network 152, the data choice neural network 154, and the action weight neural network 156 using the generated training data. Once the neural networks have been retrained, the training module 134 determines the performance of the retrained networks. For example, the training module 134 sets the state of the neural networks in the neural network module 144 to trained. The training module 134 then uses the analysis module 132 to analyze each step of each completed test and produces a list of possible actions and associated probabilities. Since the status of the neural networks in the neural network module 144 is set to trained, the probabilities produced by the analysis module 132 will be based on the newly trained networks. For each action in each analyzed step, the training module 134 calculates a change between the previously determined probability and the newly determined probability.

The training module 134 determines the performance of the networks based on the calculated changes. In response to determining that retaining did not improve the performance of the neural networks in the neural network module 144, the training module restores the neural networks in the neural network module 144 to their previous state. For example, the training module may retrieve the stored networks and associated state from the storage device 112.

Next, the reweighting module 136 recalculates probabilities, such as for every action in every state of the last completed test. The reweighting module 136 calculates the probabilities using the neural networks in the neural network module 144, if they are trained, or updates the probabilities with new random values. The use of the neural networks in the neural network module 144 will result in probabilities that more closely match the actual probability that each action will result in the goal.

The test execution module 130 selects an action among the reweighted actions. The test execution module 130 bases the selection on the reweighted probability of each action and the total distance required to reach the action from the initial state of the UI.

The session creation module 138 determines the steps required to reach the action selected by the test execution module 130 from the initial URL of the UI. The session creation module 138 executes the determined steps required to reach the action and the headless browser 126 returns the DOM of the resulting web page. The analysis module 132 then analyzes the current state of the UI, as described above. The test execution module 130 continues to execute new tests until the maximum number of tests has been reached.

The UI enhancement module 122 generates prompts and other aids that can be used to guide a user to a goal in a UI based on a shortest path to the goal and eye tracking experiments that correspond to the UI. Eye tracking experiments are a form of UI usability tests that include tracking data based on either the gaze of a user or the movement of a mouse cursor by the user while the user is navigating a UI to reach a goal. The eye tracking experiments are used to identify where a user of the UI is likely to deviate from the shortest path to the goal. The UI enhancement module 122 determines a distance for each page of the UI that represents a deviation from the shortest path that may require reinforcement of a shortest path step to aid the user in reaching the goal.

The UI enhancement module 122 includes a reinforcement module 160 and a prompt generation module 162. The reinforcement module 160 determines which steps of a shortest path may need reinforcement. The reinforcement module 160 bases the determination on the eye tracking experiments associated with the UI. The UI enhancement module 122 determines which steps of the shortest path require reinforcement based on the determination of the reinforcement module 160 and a received reinforcement percentage.

The reinforcement module 160 includes a distance module 164 and a step analysis module 166. The distance module 164 determines a reinforcement distance for each URL of the UI based on the eye tracking experiments associated with the goal and the shortest path to the goal. The reinforcement distance is a distance from a shortest path step—for example, the distance between a cursor and a point on the shortest path—that indicates that the step may require reinforcement.

The distance module 164 includes a prediction module 168 and a cluster analysis module 170. The distance module 164 obtains parameters for determining the distance, such as weighting values for a fitness algorithm and a permitted number of evolutions. An evolution consists of the selection of random reinforcement distances for each URL of the UI that are then used by the prediction module 168 to predict the success or failure of a single eye tracking experiment. The number of permitted evolutions represents the number of different sets of random reinforcement distances that are generated and used to predict the outcome of different eye tracking experiments.

The distance module 164 compares tracking data in each eye tracking experiment to the shortest path and determines a distance between each sample included in the eye tracking data and a corresponding point on the shortest path. The distance module 164, for each URL of the UI, calculates the median distance between eye tracking samples associated with successful tests and the shortest path. Successful tests include tests in which the user reached the goal in the UI—for example, the user successfully logged in to a web application. The distance module 164, for each URL of the UI, also calculates the median distance between eye tracking samples associated with failed tests and the shortest path. Failed tests include tests in which the user did not reach the goal—for example, the user was unable to log in to the web application. Failed tests may also include tests in which the user reached the goal, but did not follow the shortest path to the goal. For example, although the user may have eventually logged in to the web application, they did not do so in the fewest number of steps possible.

The distance module 164 uses the determined median distances for each URL as upper and lower bounds for generating random reinforcement distances for each URL. For example, the distance module 164 set the lower bound for a URL equal to the median success distance for the URL and set the upper bound for the URL equal to the median failure distance. In some implementations, the distance module 164 may use the Monte Carlo module 142 to generate the random distances.

The prediction module 168 then performs an evolution using the randomly generated reinforcement distances and the first eye tracking experiment. For each sample in the eye tracking experiment, the prediction module 168 determines whether the randomly generated reinforcement distances and the shortest path indicates that the experiment was a success (the user reached the goal) or a failure (the user either did not reach the goal or did not follow the shortest path to the goal). The prediction module 168 then compares the predicted outcome of the experiment with the stored outcome of the experiment. For each evolution, the prediction module 168 outputs the number of times that the correct outcome of the experiment was predicted, the number of times the experiment was incorrectly predicted to be a success, and the number of times the experiment was incorrectly predicted to be a failure. The reinforcement module 160 stores the output of the prediction module 168 after each evolution.

The distance module 164 continues generating random reinforcement distances for each URL and the prediction module 168 performs an evolution using the randomly generated reinforcement distances and a new eye tracking experiment until the maximum number of permitted evolutions has been reached.

In response to performing the maximum number of permitted evolutions, the distance module 164 determines a fitness value for each randomly generated reinforcement distance using the stored outputs of the prediction module 168 and the obtained weighting values. The cluster analysis module 170 then performs a cluster analysis of a plot of each fitness value versus the test distance associated with the fitness value. In some implementations, the cluster analysis module 170 may use the density-based spatial clustering of applications with noise (DBSCAN) algorithm to perform the cluster analysis. In other implementations, the cluster analysis module 170 may use the mean shift technique to perform the cluster analysis. In yet other implementations, the cluster analysis module 170 may use another suitable cluster analysis technique or algorithm to analyze the plot of fitness values versus randomly generated distances.

In response to determining that the cluster analysis module 170 identified a single cluster of fitness values versus reinforcement distances for each URL of the UI, the distance module 164 outputs a reinforcement distance for each URL. For each URL, the distance module 164 outputs the reinforcement distance associated with the URL with the highest fitness value.

In response to determining that the cluster analysis module 170 did not identify a single cluster of fitness values versus reinforcement distances for each URL, the distance module 164 sets new upper and lower bounds for each URL. For each URL, the distance module 164 sets the upper bound to the largest distance in the most successful cluster associated with the URL and sets the lower bound to the smallest distance in the most successful cluster. The most successful cluster is the cluster that includes the largest number of data points.

The distance module 164 resets the number of performed evolutions to zero. The distance module 164 then begins generating random reinforcement distances for each URL using the new upper and lower bounds and the prediction module 168 performs evolutions using the randomly generated reinforcement distances until the maximum number of permitted evolutions has been reached.

The distance module 164 determines fitness values for the newly generated random reinforcement distances based on the output of the prediction module 168. The cluster analysis module 170 then analyzes the new fitness values. The process continues in this manner until the distance module 164 outputs a reinforcement distance for each URL.

The step analysis module 166 determines, based on the reinforcement distance for each URL, the number of times that the eye tracking experiments indicate that a user deviated from a step of the shortest path. For example, the step analysis module 166 compares each sample included in an eye tracking experiment to an associated step in the shortest path and determines, based on the reinforcement distance for the URL associated with the shortest path step, whether the sample indicates that the user deviated from the shortest path step.

The prompt generation module 162 generates prompts for each step of the shortest path. The prompts may be used to aide a user of the UI in completing the step. The prompt generation module 162 generates the prompts based on the action included in the step of the shortest path. For example, the prompt generation module 162 may generate a prompt instructing a user to click on a link included in a shortest path step. As another example, the prompt generation module 162 may instruct the user to enter text into a data entry field—for example, typing in a username.

The prompt generation module 162 may use a DOM element that corresponds to the action included in the shortest path step to generate the prompt. In some implementations, the prompt generation module 162 includes details of the interactive element of the UI obtained from the DOM element—for example, the name of or text associated with the element—in the generated prompt. The prompt generation module 162 may use the headless browser 126 to obtain the DOM element.

The UI enhancement module 122 determines if the step requires reinforcement based on the reinforcement percentage and the results of the step analysis module 166. For example, the UI enhancement module 122 calculates a ratio of the number of times an eye tracking sample indicated that a user deviated from the shortest path step and the total number of eye tracking samples associated with the step. The UI enhancement module 122 determines that the step requires reinforcement in response to determining that the calculated ratio is equal to or greater than the reinforcement percentage.

In response to determining that a step of the shortest path requires reinforcement, the UI enhancement module 122 generates a reinforcement for the step. In some implementations, the reinforcement may include an additional prompt that includes more information about the action to be executed by the user. For example, the additional prompt may inform the user of the location of the interactive element on the screen. In other implementations, the reinforcement may include instructions to highlight the interactive element. In yet other implementations, the reinforcement may include both the additional prompt and the highlighting instructions. The UI enhancement module 122 stores the generated prompts and reinforcements, along with the shortest path. For example, the UI enhancement module 122 may store the information in the storage device 112.

In various implementations, the shortest path generated by the shortest path module 120 and the prompts and reinforcements generated by the UI enhancement module 122 may be used to alter the UI to improve the usability of the UI and the associated application. For example, interactive elements of the UI—such as links, buttons, and data entry fields—may be repositioned, either automatically or manually, to reduce the total distance required to reach a goal. The UI testing and enhancement device 110 may then perform additional tests on the altered UI. For example, the shortest path module 120 may generate a new shortest path for the altered UI to determine if the repositioned elements improved the UI—in other words, whether total distance of the shortest path was reduced.

Additionally, new eye tracking experiments may be performed on a UI that incorporates the generated UI enhancements. The UI enhancement module 122 may use the data from the new eye tracking experiments to determine if the enhancements improved the usability of the UI. For example, the UI enhancement module 122 may determine that UI enhancements resulted in an overall reduction in the deviation from the shortest path—that is, fewer steps of the shortest path require reinforcement.

Neural Networks

Figure 2:
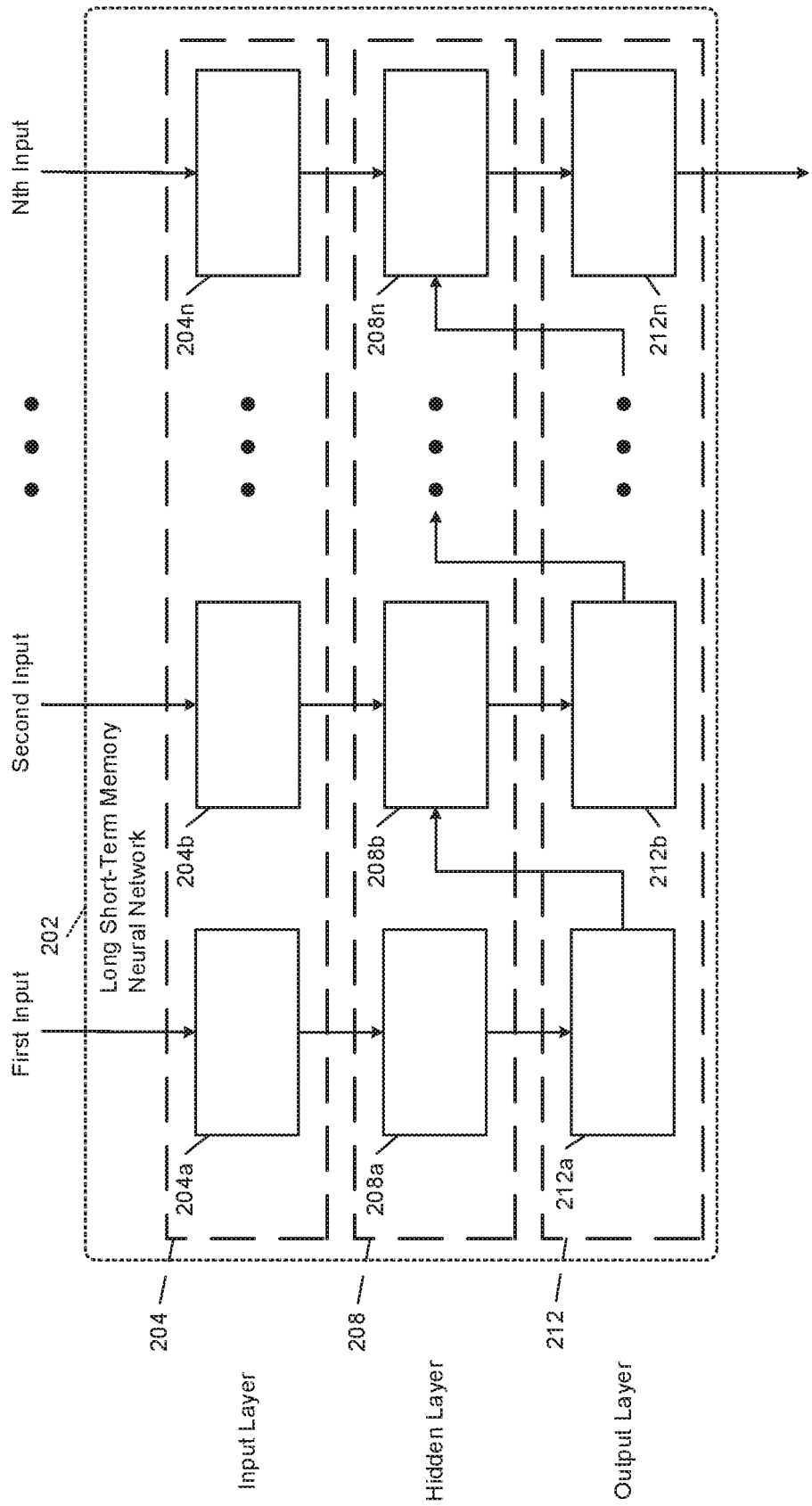
FIG. 2 is a functional block diagram of an example long short-term memory neural network.

In various implementations, the link neural network 148, the submit neural network 150, the data choice neural network 154, and the action weight neural network 156 may be implemented as long short-term memory (LSTM) neural networks. LSTM neural networks are feedforward neural networks. FIG. 2 is a functional block diagram of a generic example LSTM neural network 202. The LSTM neural network 202 includes an input layer 204, a hidden layer 208, and an output layer 212. The input layer 204 includes inputs 204a, 204b . . . 204n. The hidden layer 208 includes "neurons" 208a, 208b . . . 208n. The output layer 212 includes outputs 212a, 212b . . . 212n.

Each neuron of the hidden layer 208 receives an input from the input layer 204 and outputs a value to the corresponding output in the output layer 212. For example, the neuron 208a receives an input from the input 204a and outputs a value to the output 212a. Each neuron, other than the first neuron 208a, also receives the output of the previous neuron as an input. For example, the neuron 208b receives an input from the input 204b and an input from the output 212a. In this way the output of each neuron is fed forward to the next neuron in the hidden layer 208. The last output 212n in the output layer 212 outputs a probability associated with the inputs 204a-204n. Although the input layer 204, the hidden layer 208, and the output layer 212 are depicted as each including three elements, the input layer 204, the hidden layer 208, and the output layer 212 may contain any number of elements. In various implementations, each layer of the LSTM neural network 202 must include the same number of elements as each of the other layers of the LSTM neural network 202.

Figure 3:
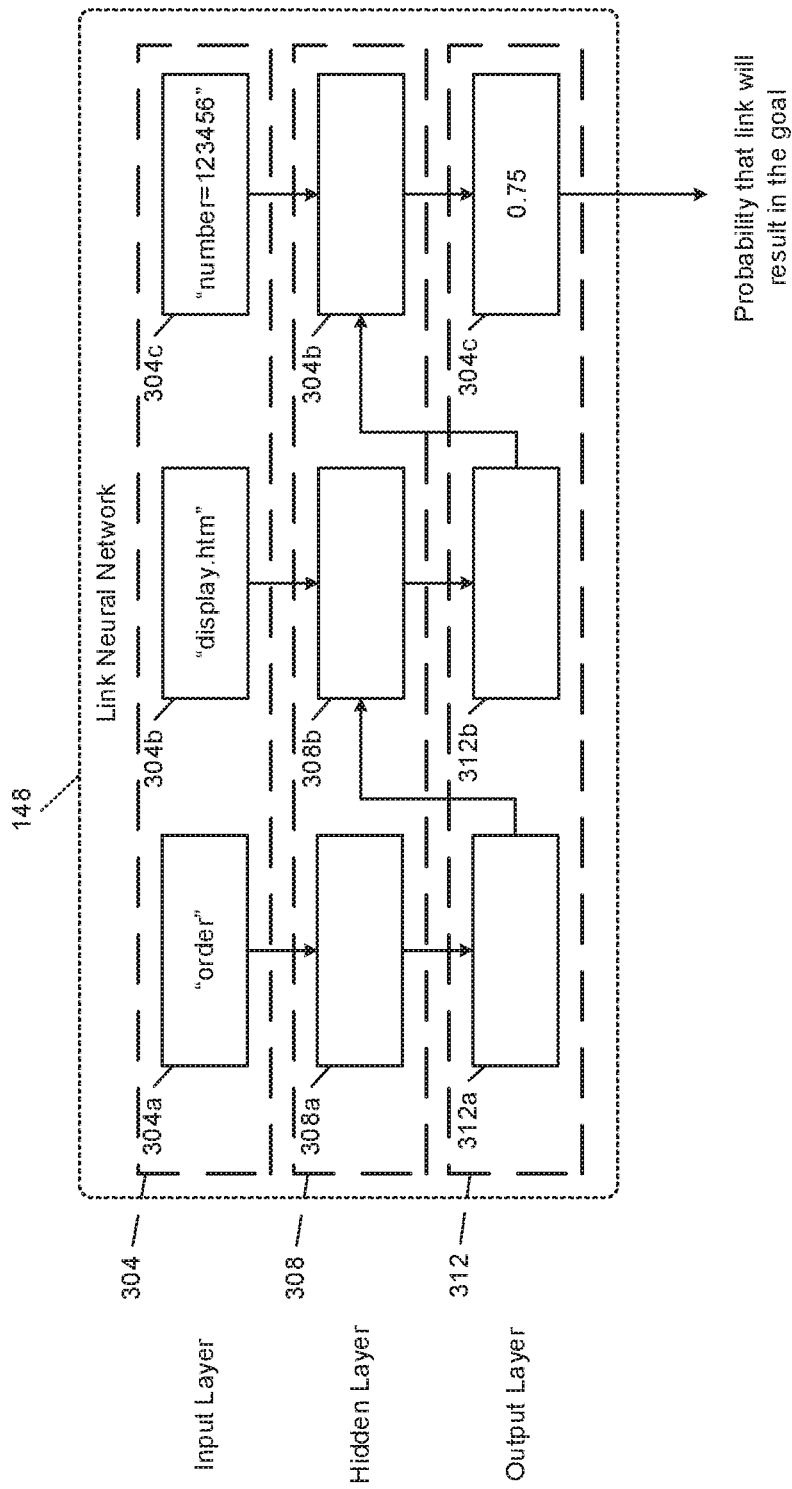
FIG. 3 is a functional block diagram of an example link neural network.

FIG. 3 is a functional block diagram of an example implementation of the link neural network 148. The link neural network 148 includes an input layer 304, a hidden layer 308, and an output layer 312. The input layer 304 includes inputs 304a, 304b, and 304c. The hidden layer 308 includes neurons 308a, 308b, and 308c. The output layer 312 includes outputs 312a, 312b, and 312c.

The link neural network 148 is depicted as processing the link "company.com/order/display.htm?number=123456". The link is parsed to create inputs for inputs 304a, 304b, and 304c. For example, the static portion of the link—"company.com"—is discarded. The remaining portion of the link is separated into inputs based on the format and syntax of the link. Specifically, "order" is provided to input 304a, "display.htm" is provided to input 304b, and "number=123456" is provided to input 304c.

In the example depicted in FIG. 3, the output of the link neural network 148 is 0.75, which represents the probability that execution of the inputted link will result in the goal.

Although the link neural network 148 is depicted as including three neurons, the link neural network 148 may include more or fewer neurons.

Figure 4:
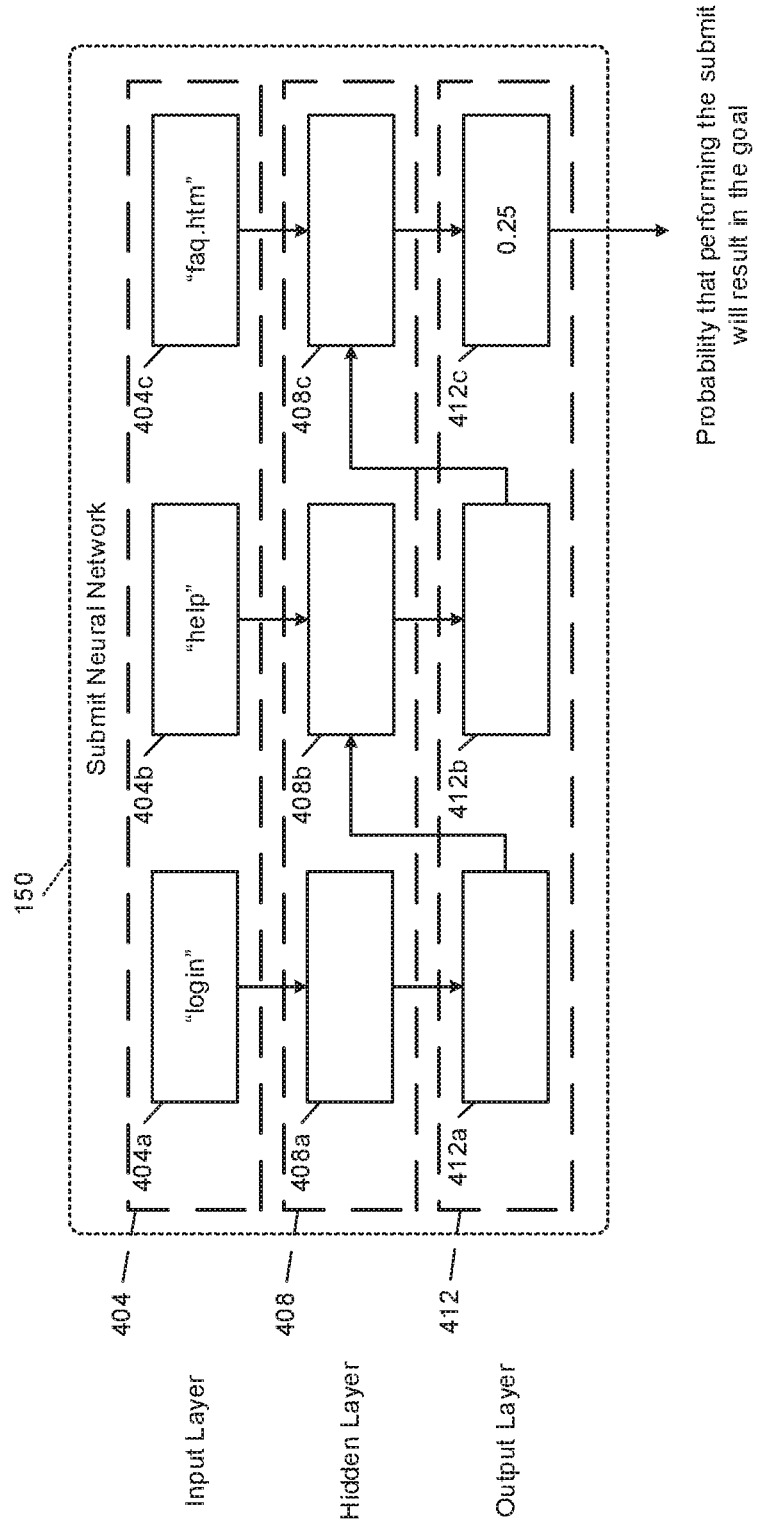
FIG. 4 is a functional block diagram of an example submit neural network.

FIG. 4 is a functional block diagram of an example implementation of the submit neural network 150. The submit neural network 150 includes an input layer 404, a hidden layer 408, and an output layer 412. The input layer 404 includes inputs 404a, 404b, and 404c. The hidden layer 408 includes neurons 408a, 408b, and 408c. The output layer 412 includes outputs 412a, 412b, and 412c.

The submit neural network 150 is depicted as processing a submit named login located at "company.com/help/faq.htm". The name of the submit is provided to input 404a. The location of the submit is parsed to create inputs for inputs 404b and 404c. For example, the static portion of the location—"company.com"—is discarded and the remaining portion of the location is separated into different inputs based on the format and syntax of the location. Specifically, "help" is provided to input 404b and "faq.htm" is provided to input 404c.

In the example depicted in FIG. 4, the output of the submit neural network 150 is 0.25, which represents the probability that execution of the inputted submit will result in the goal. Although the submit neural network 150 is depicted as including three neurons, the submit neural network 150 may include more or fewer neurons.

Figure 5A:
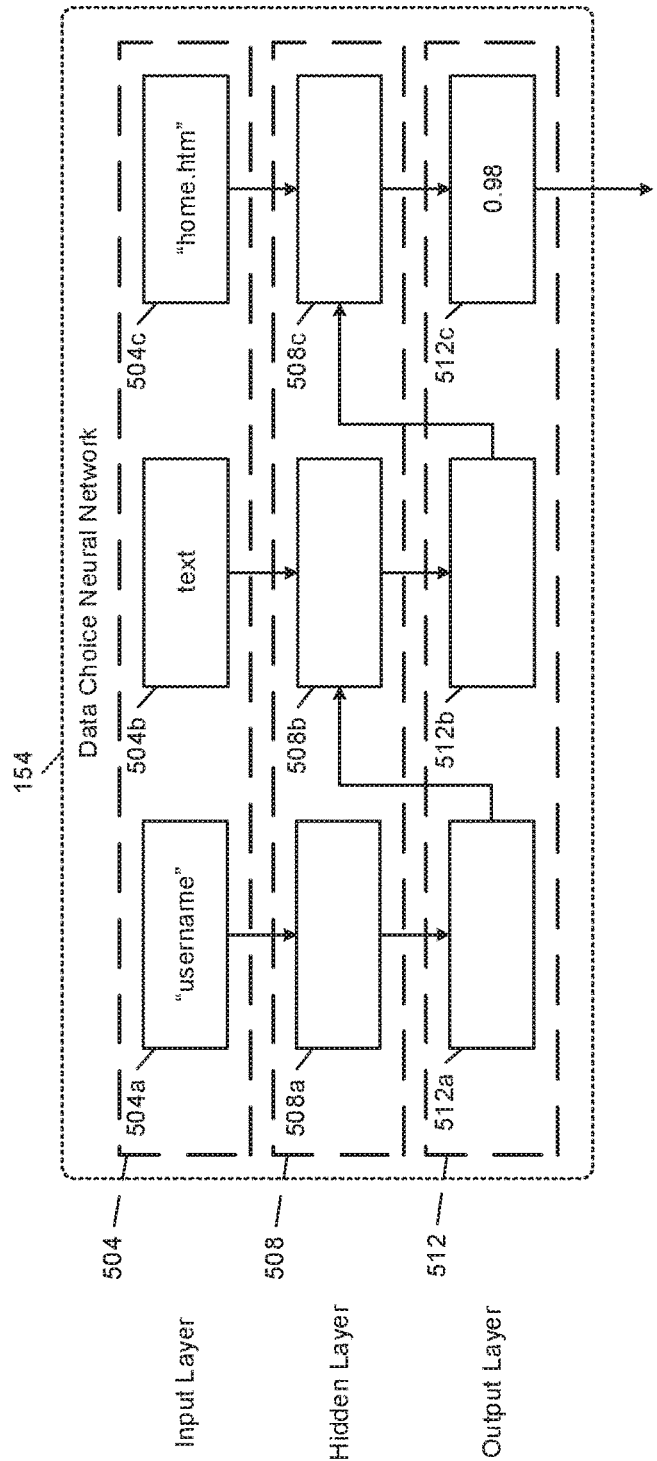
FIG. 5A is a functional block diagram of an example data choice neural network.

FIG. 5A is a functional block diagram of an example implementations of the data choice neural network 154. The data choice neural network 154 includes an input layer 504, a hidden layer 508, and an output layer 512. The input layer 504 includes inputs 504a, 504b, and 504c. The hidden layer 508 includes neurons 508a, 508b, and 508c. The output layer 512 includes outputs 512a, 512b, and 512c.

The data choice neural network 154 is depicted as processing a text data entry field named "username" located at "company.com/help/faq.htm". The name of the data entry field is provided to the input 504a. The data entry field type—text—is provided to the input 504b. The location of the data entry is parsed to create an input for the input 504c. For example, the static portion of the location—company.com—is discarded and the remaining portion of the location is separated, if necessary, into inputs based on the format and syntax of the location. In the example depicted in FIG. 5A, the remaining portion of the location does not require separation. In other words, "home.htm" is simply provided to the input 504c.

In the example depicted in FIG. 5A, the output of the data choice neural network 154 is 0.98, which represents the probability that entering text into the inputted data entry field will result in the goal. Although the data choice neural network 154 is depicted as including three neurons, the data choice neural network 154 may include more than three neurons.

Figure 5B:
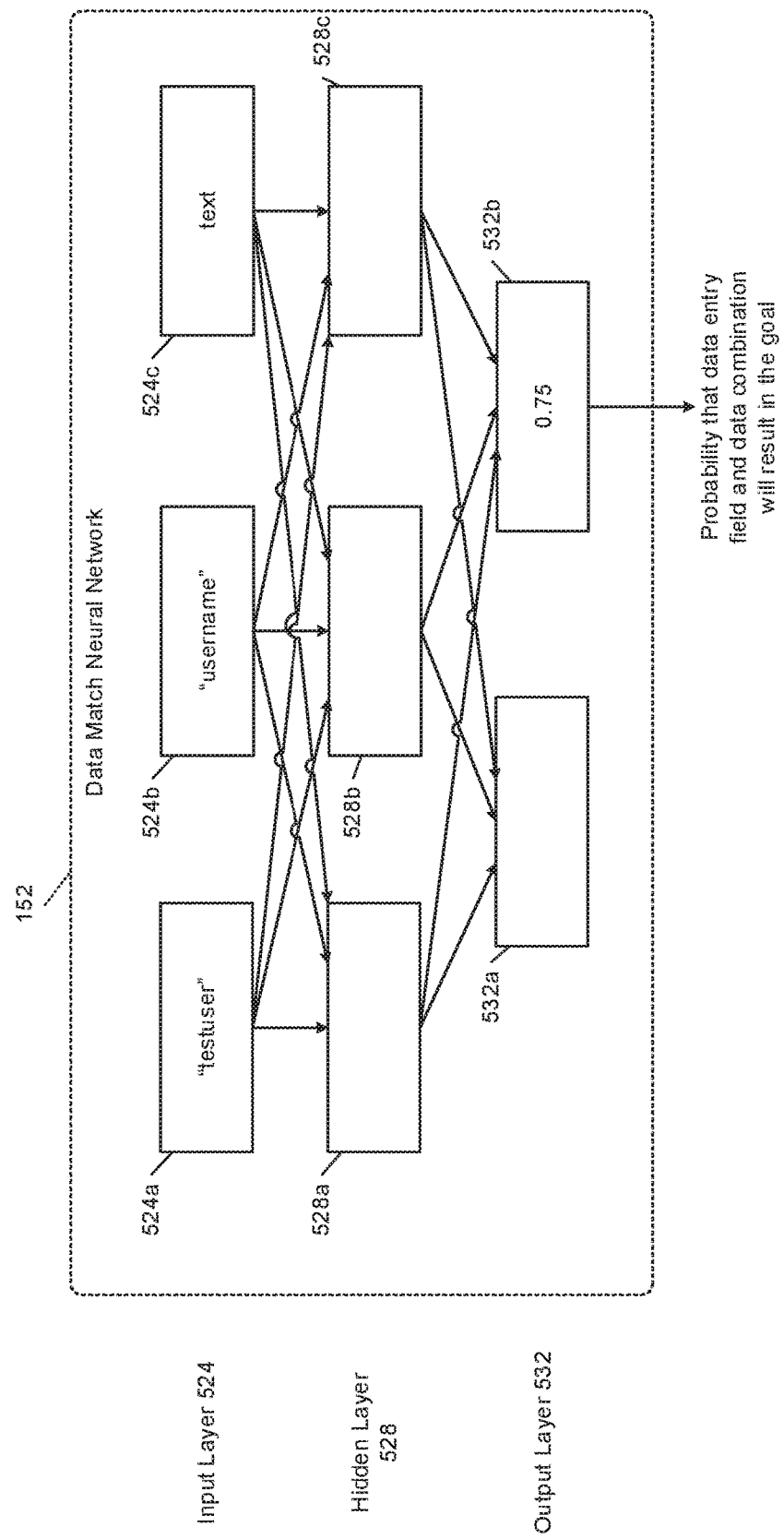
FIG. 5B is a functional block diagram of an example data match neural network.

FIG. 5B is a functional block diagram of an example implementation of the data match neural network 152. The data match neural network 152 is a convolutional neural network. Similar to LSTM neural networks, convolutional neural networks include an input layer, a hidden layer, and an output layer. However, in a convolutional neural network, the output layer includes one fewer output than the number of neurons in the hidden layer and each neuron is connected to each output. Additionally, each input in the input layer is connected to every neuron in the hidden layer.

The data match neural network 152 includes an input layer 524, a hidden layer 528, and an output layer 532. In FIG. 5B, the input layer 524 includes inputs 524a, 524b, and 524c; the hidden layer 528 includes neurons 528a, 528b, and 528c; and the output layer 532 includes outputs 532a and 532b.

The data match neural network 152 is depicted as processing a text data entry named "username" that is paired with the data "testuser." The paired data—"testuser"—is provided to the input 524a. The data entry field name—"username"—is provided to the input 524b. The data entry field type—test—is provided to the input 524c. In the example depicted in FIG. 5B, the output of the data match neural network 152 is 0.75, which represents the probability that the inputted data should be entered into the inputted data entry field.

Figure 6:
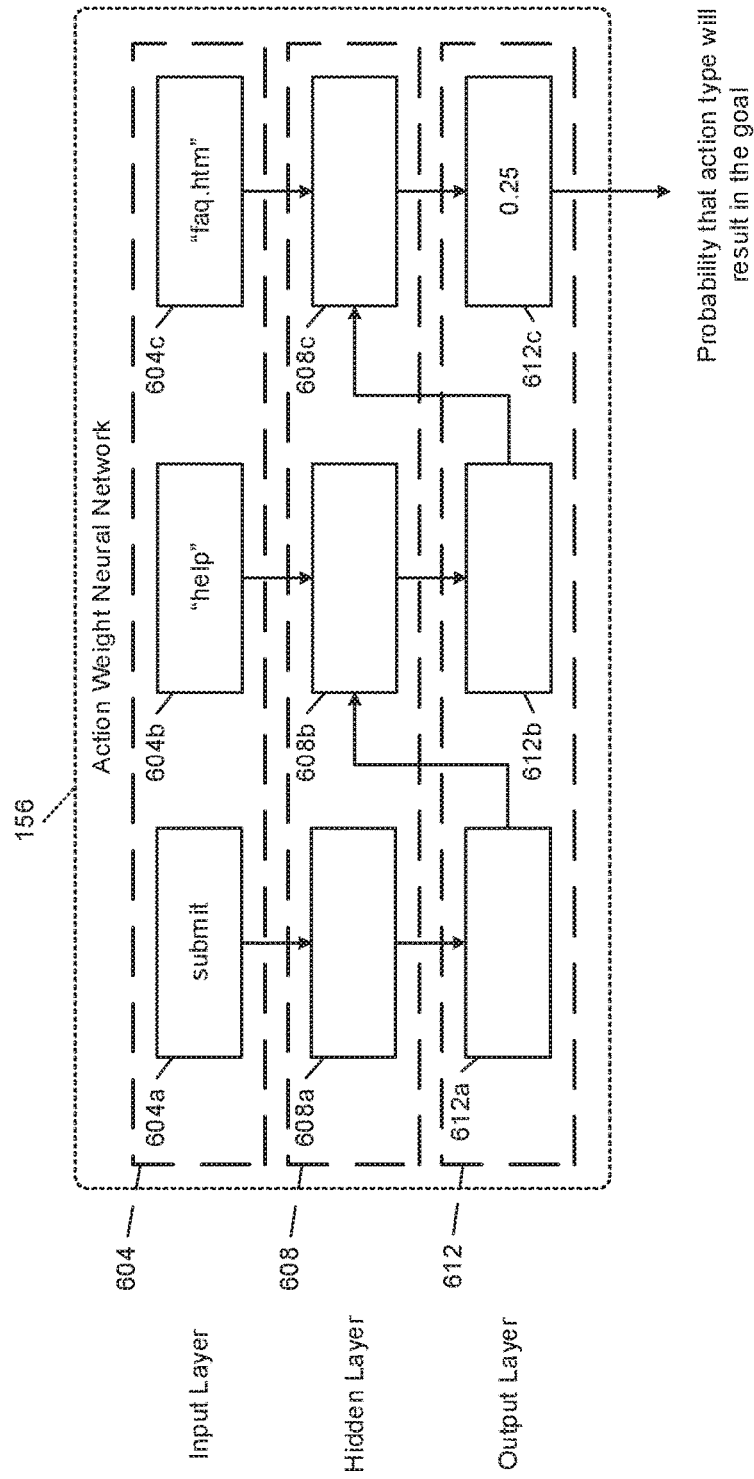
FIG. 6 is a functional block diagram of an example action weight neural network.

FIG. 6 is a functional block diagram of an example implementation of the action weight neural network 156. The action weight neural network 156 includes an input layer 604, a hidden layer 608, and an output layer 612. The input layer 604 includes inputs 604a, 604b, and 604c. The hidden layer 608 includes neurons 608a, 608b, and 608c. The output layer 612 includes outputs 612a, 612b, and 612c.

The action weight neural network 156 is depicted as processing a submit action type that is located at "company.com/help.faq.htm". The action type is provided to the input 604a. The location of the action is parsed to create inputs for the inputs 604b and 604c. For example, the static portion of the location—"company.com"—is discarded and the remaining portion of the location is separated into inputs based on the format and syntax of the location. Specifically, "help" is provided to the input 604b and "faq.htm" is provided to the input 604c.

In the example depicted in FIG. 6, the output of the action weight neural network 156 is 0.25, which represents the probability that executing a submit located at "company.com/help/faq.htm" will result in the goal. Although the action weight neural network 156 is depicted as including three neurons, the action weight neural network 156 may include more than three neurons and as few as two neurons.

Shortest Path Determination

Figure 7A:
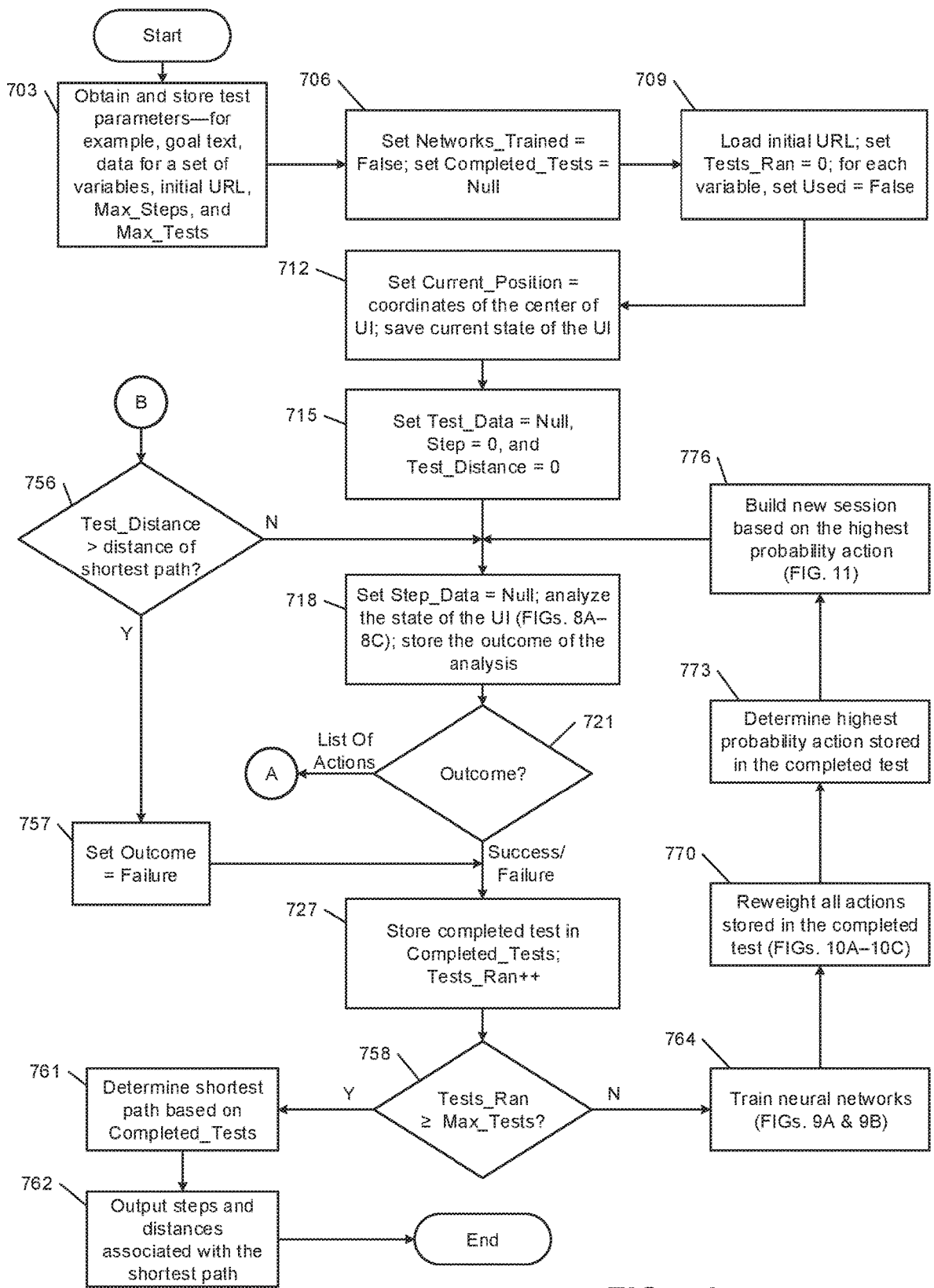
FIGS. 7A and 7B are a flowchart depicting an example method of determining a shortest path to a given goal in a UI.
Figure 7B:
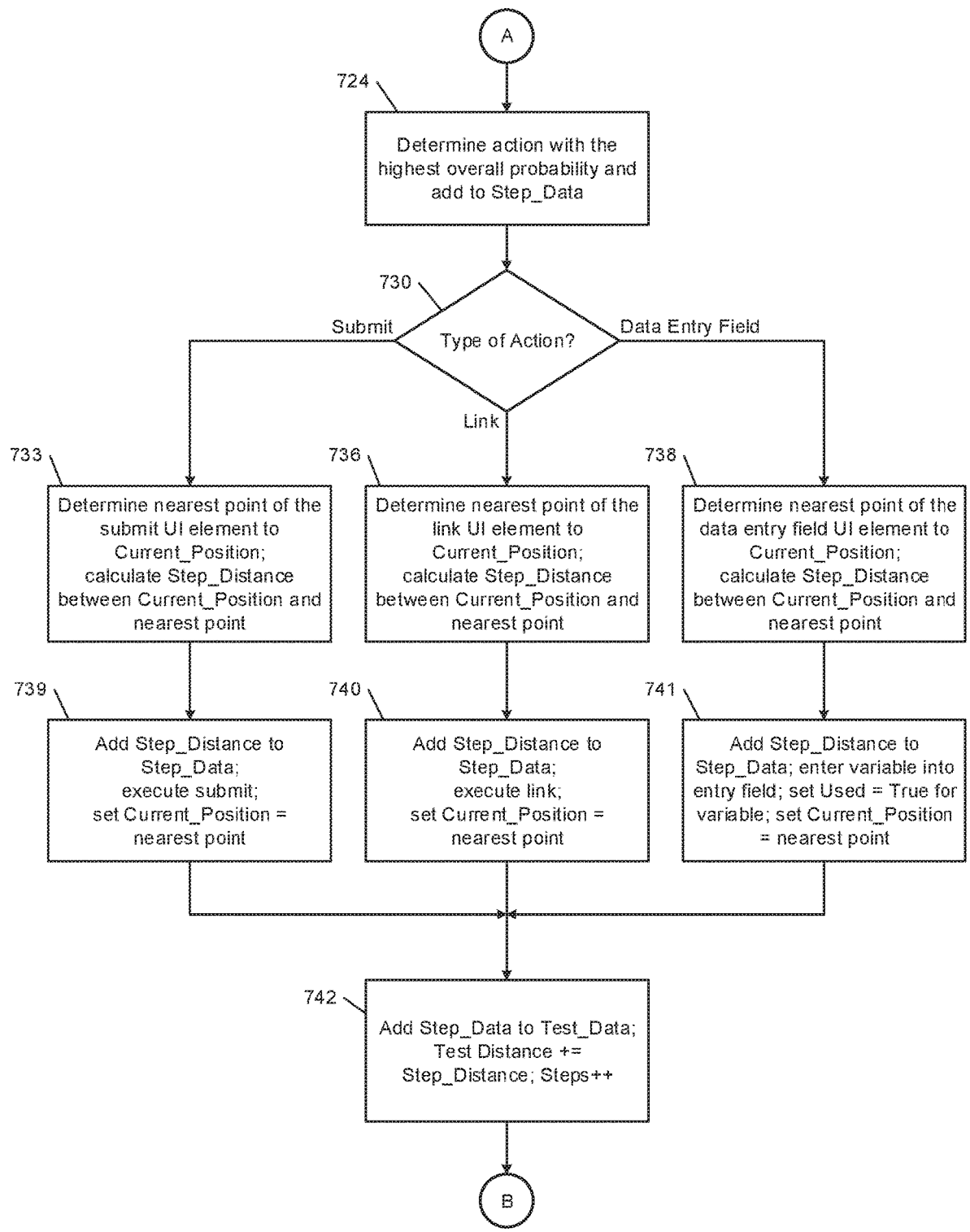

FIGS. 7A and 7B are a flowchart depicting an example method of determining a shortest path to a goal in a UI. Although the example method is described below with respect to the UI testing and enhancement device 110, the method may be implemented in other devices and/or systems. In various implementations, control may be performed by the shortest path module 120.

Control begins at 703 of FIG. 7A. At 703, control obtains test parameters: for example, goal text, data for a set of variables, an initial URL of a UI to be tested, the maximum number of permitted steps per test, and the maximum number of permitted tests. Control then stores the test parameters as test configuration data. For example, control may store the test configuration data in the storage device 112. Control continues with 706, where control initializes values associated with the tests. For example, control sets the training status of the neural networks (Networks Trained) to false and Completed_Tests to Null. Control then continues with 709, where control loads the initial URL and sets the number of executed tests (Tests_Ran) to zero.

At 709, control, for each variable in the stored configuration data, sets a used status flag (Used) to false. Control then continues with 712, where control sets the current position (Current_Position) to the center of the UI. At 712, control also stores the result of loading the initial URL, the current state of the UI, as Initial State, and then control continues with 715. At 715, control initializes the data associated with the first test: for example, control sets Test Data to Null, Step to zero, and Test Distance to zero. Control then progresses to 718.

At 718, control initializes the data associated with the current step—for example, control sets Step_Data to Null. Control then analyzes the current state of the UI. For example, control may perform the method disclosed in FIGS. 8A-8C. The outcome of the analysis may be Success, Failure, or a list of actions. Success indicates that the current state of the UI includes the goal text or satisfies some other goal criteria. Failure may indicate that the current state includes neither the goal text nor any possible actions—such as traversing links, entering data into a data entry field, or submitting data that has been entered into a data entry field. Failure may instead indicate that the test has performed the max number of permitted steps and has not reached the goal.

A list of actions indicates that the current state includes at least one possible action that may be executed. Each action in the list of actions includes a probability that the action will result in reaching the goal. Control stores the results of the analysis. For example, control adds the outcome of success or failure to Test_Data and an outcome of a list of actions to Step_Data. Control then progresses to 721, where control determines whether the outcome of the analysis is a list of actions or a Success/Failure indicator. If the outcome is a list of actions, control progresses to 724 of FIG. 7B; otherwise, control transfers to 727.

At 724 of FIG. 7B, control determines an action to execute. For example, control selects the action with the highest overall probability among the listed actions. Control may use equations 1 and 2 below to determine the overall probability for each action.

$$P_{distance\_weighted} = \begin{cases} P_{action}, & \text{Test\_Distance} = 0 \quad (1) \\ P_{action} * \left(\frac{\text{Test\_Distance}}{\text{Action\_Distance}}\right), & \text{Test\_Distance} > 0 \end{cases}$$

$$P_{overall} = \frac{P_{weighted}}{\sum P_{distance\_weighted}} \quad (2)$$

$P_{action}$ is the probability of an action included in the list of actions. Action_Distance is the Euclidean distance between the current position and the nearest point of the UI element associated with the action. Test Distance is the total distance traveled in the UI during the current test. $\Sigma P_{distance\_weighted}$ is a summation of $P_{distance\_weighted}$ for each of the actions in the list of actions.

Control then progresses to 730 where control determines whether the selected action is a submit, a link, or an entry. In response to determining that the selected action is a submit, control progresses to 733; in response to determining that the selected action is a link, control progresses to 745; otherwise, control progresses to 748.

At 733, control determines a point of the UI element associated with the submit that is nearest to the current position (Current_Position). In various implementations, the coordinates of the nearest point are obtained from the list of actions for the selected action. Control then calculates the step distance (Step_Distance) as the Euclidean distance between Current_Position and the nearest point. Control then continues with 739, where control stores the step distance and executes the submit—for example, control adds Step_Distance to Step_Data and triggers a click on the UI element associated with the submit. At 739, control also updates Current_Position to the coordinates of the nearest point.

Returning to 736, control determines the point of the UI element associated with the link that is nearest to Current_Position. The coordinates may be stored in the list of actions for the selected action. Control then sets the step distance (Step_Distance) to the Euclidean distance between Current_Position and the nearest point. Control then continues with 740, where control stores the step distance and executes the link—for example, adds Step_Distance to Step_Data and triggers a click on the UI element associated with the link. At 740, control also sets Current_Position to the nearest point of the UI element associated with the link. For example, control may set Current_Position to the coordinates stored in the list of actions for the selected action. Control then progresses to 742.

Returning to 738, control determines the point of the UI element associated with the entry that is nearest to Current_Position. For example, the coordinates stored in the list of actions for the selected action. Control then sets the step distance (Step_Distance) to the Euclidean distance between Current_Position and the nearest point of the UI element associated with the entry. Control then continues with 741 where control stores the step distance and executes the entry—for example, adds Step_Distance to Step_Data and enters the variable associated with the action into the data entry field. At 741, control also marks the variable entered into the data entry field as used and sets Current_Position to the nearest point of the UI element associated with the entry. For example, control may set Used for the variable to True and Current_Position to the coordinates stored in the list of actions for the selected action. Control then progresses to 742.

At 742, control stores the progress of the current test—for example, control adds Step_Data to Test_Data, adds Step_Distance to Test Distance, and increases the number of steps taken by 1. Control then continues with 756 of FIG. 7A.

At 756 of FIG. 7A, control determines whether the current test distance is longer than an already determined path—in other words, whether the distance of the current test is longer than the shortest completed successful test. If so, control progresses to 757; otherwise control returns to 718. At 757, control sets the status of the current test to a failure. For example, control sets Outcome equal to failure. Control then continues with 727.

Returning to 727, control stores the current test as a completed test. For example, control adds the total distance of the test (Test Distance) and the data associated with the current test (Test_Data) to Completed_Tests. At 727, control increments Tests_Ran by one. Control progresses to 758 where control determines whether the number of tests that have been run (Tests_Ran) is equal to or greater than the number of permitted tests (Max_Tests). If so, control progresses to 761; otherwise control transfers to 764.

At 761, control determines a shortest path to the goal based on the stored completed tests (Completed_Tests). For example, control selects a successful test stored in Completed_Tests with the smallest total distance (Test_Distance) as the shortest path. Control progresses to 762, where control outputs the stored data associated with the selected test (Test_Data) as the shortest path. Control then ends.

At 764, control trains the neural networks. For example, control performs the method disclosed in FIGS. 9A and 9B. Control then progresses to 770 where control reweights the probabilities associated with the actions of every step of the completed test—for example, control may perform the method disclosed in FIGS. 10A-10C. Control then continues with 773, where control selects the action associated with the completed test that has the highest overall probability of resulting in the goal text. Control may use equations 1 and 2, as previously described, to determine the overall probability of each action. Control then progresses to 776, where control builds a new session based on the selected action. For example, control may perform the method disclosed in FIG. 11. Control then returns to 715.

Figure 8A:
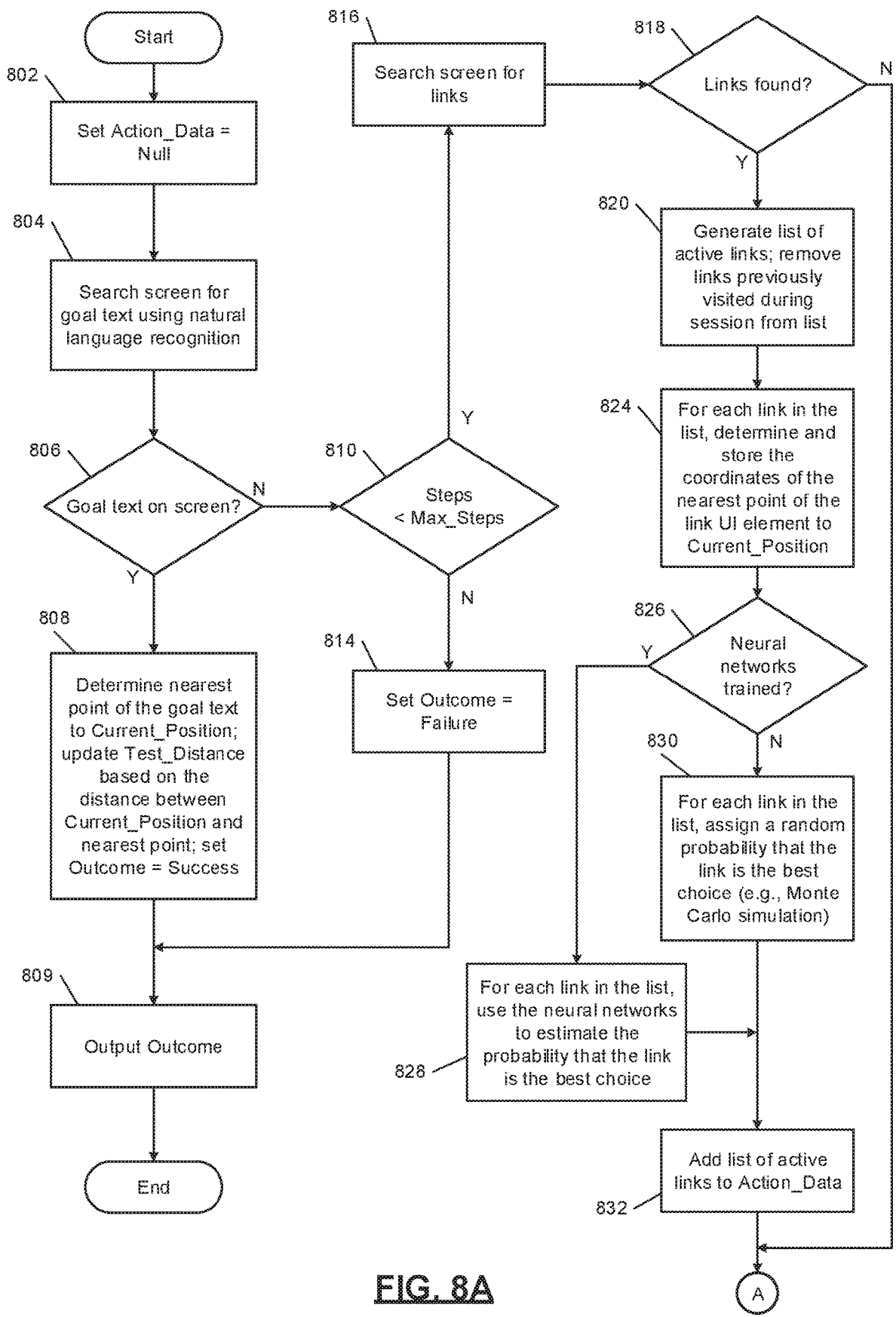
FIGS. 8A-8C are a flowchart depicting an example method of analyzing a state of a UI.
Figure 8B:
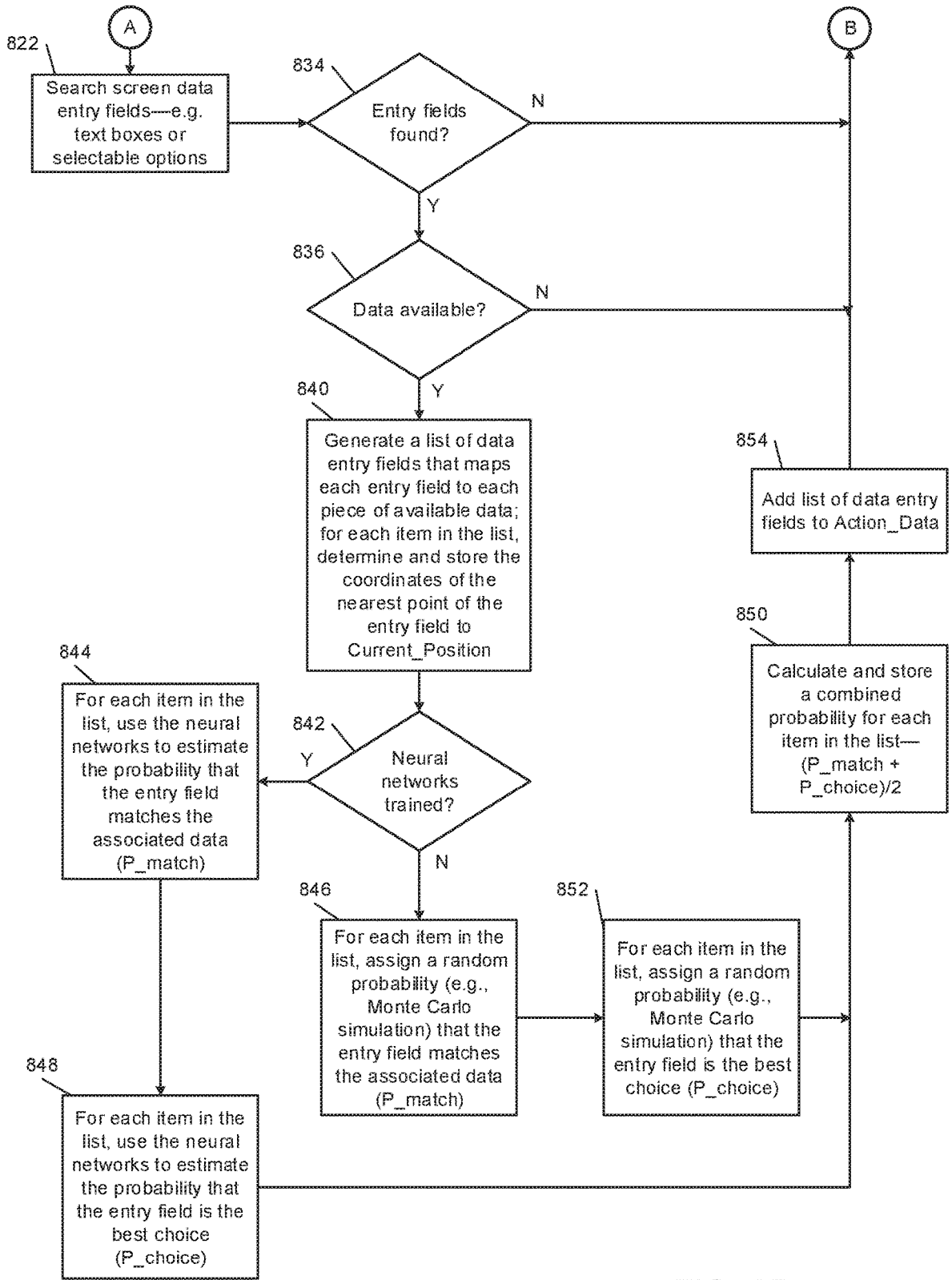
Figure 8C:
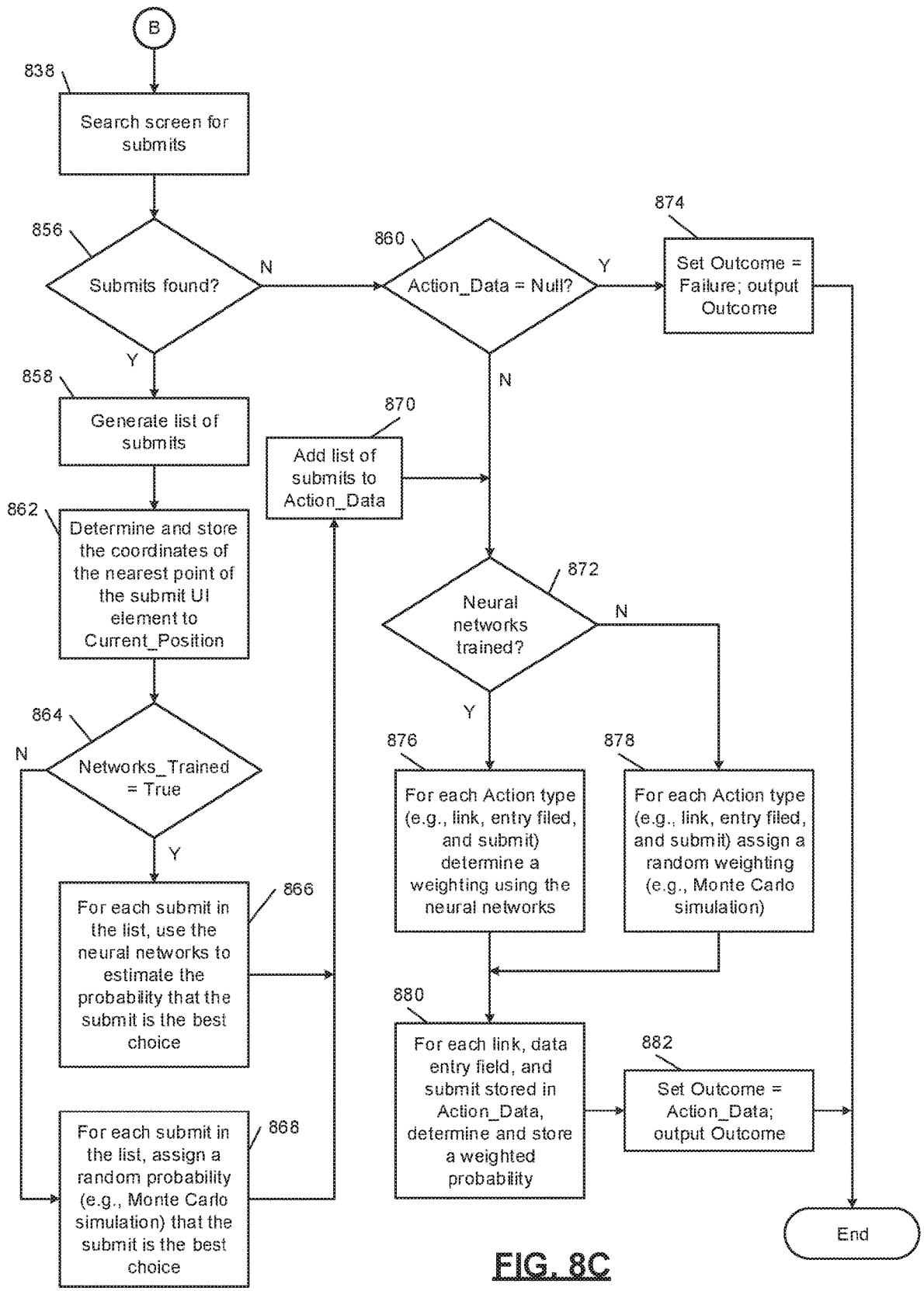

FIGS. 8A-8C are a flowchart depicting an example method of analyzing a state of a UI. Although the example method is described below with respect to the UI testing and enhancement device 110, the method may be implemented in other devices and/or systems. In various implementations, control may be performed by the shortest path module 120 and/or the analysis module 132.

Control begins at 802 of FIG. 8A. At 802, control initializes the action data for the state to be analyzed. For example, control sets Action_Data to Null. Control then progresses to 804, where control searches the current state—the screen—of the UI to determine whether the goal criteria have been satisfied. For example, in FIG. 8A, control determines whether the current state includes the goal text. Control may use the natural language recognition module 146 to match text found on the screen to the goal text. If, at 806, the goal text was found, control continues with 808; otherwise, control transfers to 810.

At 808, control updates the distance of the current test based on the location of the goal text. For example, control calculates the Euclidean distance between Current_Position and the point of the goal text that is nearest to Current_Position. Control adds the distance to Test_Distance. At 808, control also sets Outcome to Success to indicate that the current state includes the goal text. Control progresses to 809 where control outputs the value of Outcome. Control then ends.

Returning to 810, control determines whether the maximum number of permitted steps (Max_Steps) has been reached. If the number of steps in the current session is less than the maximum number of steps, control progresses to 816; otherwise, control transfers to 814. At 814, control sets Outcome to Failure. Control then progresses to 809.

At 816, control searches for links in the current state and then control progresses to 818. At 818, if one or more links were located in the current state, control continues with 820; otherwise, control transfers to 822 of FIG. 8B.

At 820, control generates a list of links found in the current state. Control removes any link from the list that has been previously visited during the current session. Control then continues with 824 where control, for each link in the list, determines and stores the coordinates of a point of an associated link UI element that is nearest to Current_Position. Control then progresses to 826, where control determines whether the neural networks are trained. If so, control progresses to 828; otherwise, control transfers to 830. At 828, control uses the link neural network 148 to estimate for each link in the list, the probability that the link will result in the goal. Control stores the probability for each link in the link list. Control then continues with 832.

At 830, control, for each link in the link list, assigns a random probability that the link will result in the goal and stores the probability in the link list. In some implementations, control may use the Monte Carlo module 142 to assign the random probabilities. Control continues with 832. At 832, control stores the link list—for example, control adds the link list and associated probabilities to Action_Data. Control progresses to 822 of FIG. 8B.

At 822 of FIG. 8B, control searches for data entry fields in the current state and then control progresses to 834. At 834, control determines whether any data entry fields were located in the current state. If so, control continues with 836; otherwise, control transfers to 838 of FIG. 8C.

At 836, control determines if the configuration data includes data that may be entered into the located data entry field—that is, variables not already marked as used. If so, control progresses to 840; otherwise, control transfers to 838 of FIG. 8C. At 840, control generates a list of all possible data entry fields and available data combinations. For each entry in the list, control determines and stores the coordinates of the nearest point of the data entry field to Current_Position. Control continues with 842.

At 842, control determines whether the neural networks are trained. If so, control progresses to 844; otherwise, control transfers to 846. At 844, for each data entry field and data combination in the list, control uses the data match neural network 152 to estimate the probability that the data entry field matches the data (P_match). Control progresses to 848 where, for each data entry field in the list, control uses the data choice neural network 154 to estimate the probability that entering data into the data entry field will result in the goal (P_choice). Control progresses to 850.

At 846, for each entry field data combination in the list, control assigns a random probability that the entry field matches the data (P_match). Control progresses to 852 where, for each entry field in the list, control assigns a random probability that entering data into the entry field will result in the goal text (P_choice). In some implementations, control may use the Monte Carlo module 142 to generate random probabilities for P_match and P_choice. Control continues with 850.

At 850, control calculates and stores a combined probability for each data entry field and data combination in the list. For example, control may average P_match and P_choice for each item in the list. Control then progresses to 854 where control stores the data entry field and data combination list—for example, control may add the list to Action_Data. Control continues with 838 of FIG. 8C.

At 838 of FIG. 8C, control searches for "submits"—for example, buttons or menu options that submit data entered into a data entry field—in the current state and then control progresses to 856. At 856, control determines whether any submits were located in the current state. If so, control continues with 858; otherwise, control transfers to 860.

At 858, control generates a list of submits found in the current state. Control continues with 862 where control, for each submit in the list, determines and stores the coordinates of the nearest point of the submit UI element to Current_Position. Control progresses to 864, where control determines whether the neural networks in the neural network module 144 are trained. If so, control progresses to 866; otherwise, control transfers to 868. At 866, control uses the submit neural network 150 to estimate the probability that each submit in the list will result in the goal. Control stores the probabilities in the submit list. Control continues with 870.

At 868, control assigns a random probability to each submit in the list and stores the probability in the submit list. In some implementations, control may use the Monte Carlo module 142 to assign the random probabilities. Control continues with 870.

At 860, control determines whether Action_Data is equal to Null—in other words, the current state fails to contain any links, data entry field and data combinations, or submits. If so, control progresses to 874; otherwise, control transfers to 872. At 874, control sets Outcome to Failure and then outputs Outcome. Control then ends.

Returning to 870, control stores the submit list—for example, control may add the submit list to Action_Data. Control continues with 872. At 872, control determines whether the neural networks in the neural network module 144 are trained. If so, control continues with 876; otherwise control transfers to 878. At 876, control uses the action weight neural network 156 to determine a probability weighting for each action type—for example, links, data entry fields, and submits. Control then progresses to 880.

At 878, control assigns a random probability weighting to each action type—for example, links, entry fields, and submits. In some implementations, control may use the Monte Carlo module 142 to determine the random probability weightings. Control then progresses to 880.

At 880, control determines and stores a weighted probability for each stored action—in other words, for each link, data entry field and data combination, and submit stored in Action_Data. For example, control may use equations 3 and 4 below to calculate each weighted probability ($P_{action}$).

$$P_{weighted} = W_{type} * P_{unweighted} * \left( \frac{\sum (\text{Distance})}{\text{Distance}} \right) \quad (3)$$

$$P_{action} = \frac{P_{weighted}}{\sum P_{weighted}} \quad (4)$$

$P_{unweighted}$ is the stored probability for the action, $W_{type}$ is the probability weighting for the action type of the action, and Distance is the Euclidean distance between the current position (Current_Position) and the nearest point stored for each action in Action_Data. Equation 4 is used to normalize the weighted probability ($P_{weighted}$) of each action.

Control continues with 882 where control outputs the results of the analysis of the current state of the UI. For example, control sets Outcome to Action_Data and then outputs Outcome. Control then ends.

Figure 9A:
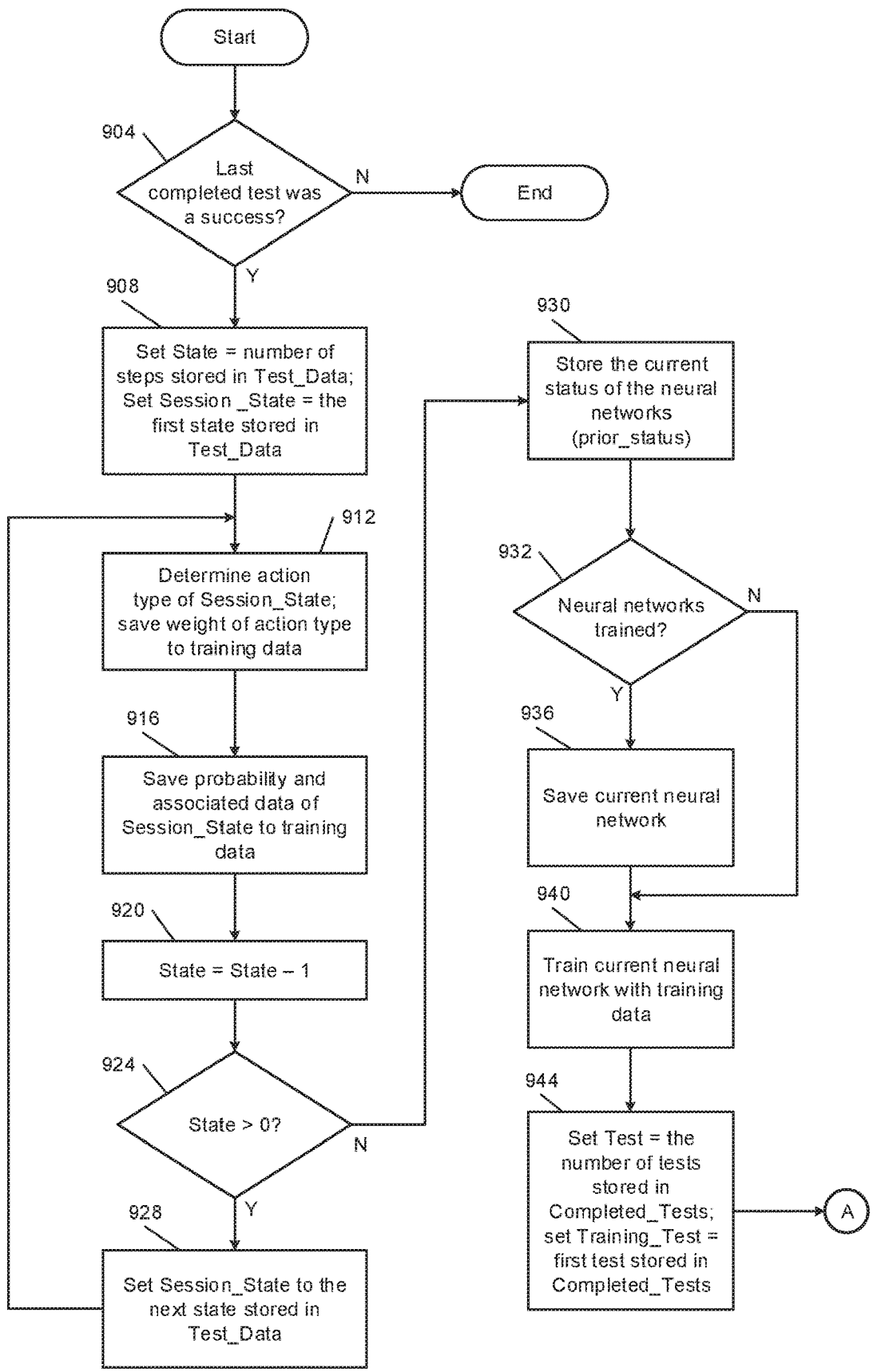
FIGS. 9A and 9B are a flowchart depicting an example method of training neural networks using completed shortest path tests.
Figure 9B:
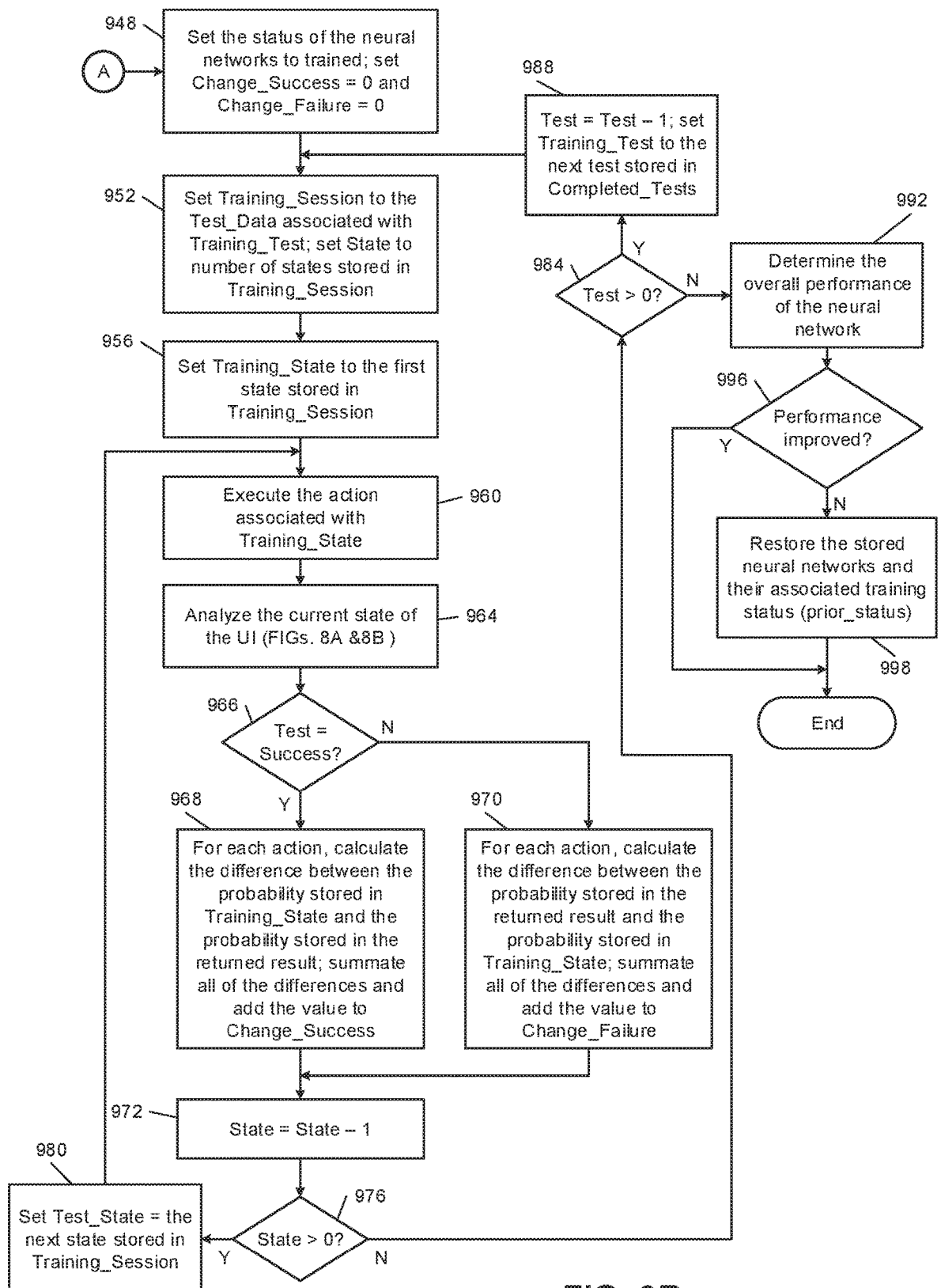

FIGS. 9A and 9B are a flowchart depicting an example method of training the neural networks in the neural network module 144 based on completed shortest path tests. Although the example method is described below with respect to the UI testing and enhancement device 110, the method may be implemented in other systems. In various implementations, control may be performed by the shortest path module 120 and/or the training module 134.

Control begins at 904 of FIG. 9A in response to control receiving a completed test. At 904, control determines whether the completed test was a success. If so, control continues with 908; otherwise, control ends. In other words, only successful tests are used to train neural networks in the neural network module 144. At 908, control sets State to the number of states in the completed test—for example, the number of states stored in Test_Data. Control also sets current state (Session_State) to the first state of the successful test—for example, the first step stored in Test_Data.

Control then continues with 912, where control determines the action type associated with an action executed in the current state (Session_State). Control adds the action weight of the determined action type to training data. Control then progresses to 916 where control saves the unweighted probability of the executed action and any data associated with the executed action—for example, a link, a data entry field and data combination, or a submit—to training data. Control continues with 920, where control decrements State by one. Control then progresses to 924.

At 924, control determines whether there are any additional states in the completed test. For example, control determines whether State is greater than zero. If so, control progresses to 928; otherwise, control transfers to 930. At 928, control sets Session_State to the next state of the completed test—for example, the next state stored in Test_Data. Control then returns to 912.

At 930, control stores the current training status of the neural networks in the neural network module 144. Control progresses to 932, where control determines whether the neural networks in the neural network module 144 are trained—that is, whether the value of Networks_Trained is true. If so, control progresses to 936; otherwise, control transfers to 940. At 936, control saves the current neural networks. Control then progresses to 940.

At 940, control uses the training data to train the neural networks. Control progresses to 944, where control sets Test to the number of completed tests—for example, the number of tests stored in Completed_Tests. Control uses Training_Test to step through each stored test. At 944, control also sets Training_Test to the first test stored in Completed_Tests. Control continues with 948 of FIG. 9B.

At 948 of FIG. 9B, control sets the status of the neural networks in the neural network module 144 to trained. At 948, control also sets Change_Success to zero and Change_Failure to zero. Change_Success and Change_Failure are used to store the differences between the previously calculated probabilities and the probabilities that the newly trained neural networks produce. Control continues with 952 where control sets Training_Session to the Test_Data associated with Training_Test. At 952, control also sets State to the number of states stored in Training_Session. Control uses State to step through each state stored in Training_Session. Control progresses to 956 where control sets Training_State to the first state stored in Training_Session. Control continues with 960.

At 960, control executes the action associated with Training_State and control continues with 964. At 964, control analyzes the state of the UI after the action is executed—for example, control may perform the method disclosed in FIGS. 8A-8C. Control then progresses to 966 where control determines whether the test associated with the action (Training_Session) was a success. If so, control continues with 968; otherwise, control transfers to 970. At 968, for each action identified during the analysis, control calculates the difference between the probability stored in Training_State and the probability generated by the analysis. Control then performs a summation of all of the differences and adds the value of the summation to Change Success. Control progresses to 972.

At 970, for each action identified during the analysis, control calculates the difference between the probability generated by the analysis and the probability stored in Training_State. Control then performs a summation of the differences and adds the value of the summation to Change_Failure. Control then continues with 972.

At 972, control decrements State by 1. Control continues with 976 where control determines whether there are any additional states stored in Training_Session—in other words, State is greater than zero. If so, control continues with 980; otherwise, control transfers to 984. At 980, control sets Test State to the next state stored in Training_Session. Control then returns to 960.

At 984, control determines whether there are any additional tests stored in Completed_Tests—that is, Test is greater than zero. If so, control continues with 988; otherwise, control transfers to 992. At 988, control decrements Test by one and sets Training_Test to the next completed test—for example, the next test stored in Completed_Tests. Control then returns to 952.

At 992, control determines the overall performance of the newly trained neural network. For example, control may use equation 5 below to calculate the overall performance (Performance).

$$\text{Performance} = \text{Change\_Success} + \text{Change\_Failure} \quad (5)$$

Control then continues with 996, where control determines if the overall performance of the trained neutral network represents an improvement of the neural networks. For example, control determines if Performance is greater than or equal to zero. If so, the newly trained neural networks are an improvement over the prior networks and control ends. If Performance is less than zero, the newly trained neural networks are not an improvement and control transfers to 998. At 998, control restores the old neural networks—in other words, control restores the neural networks to the state that they were in just prior to the most recent training. At 998, control also sets the training status of the neural networks (Networks_Trained) to the status associated with the old neural networks (prior_status). Control then ends.

Figure 10A:
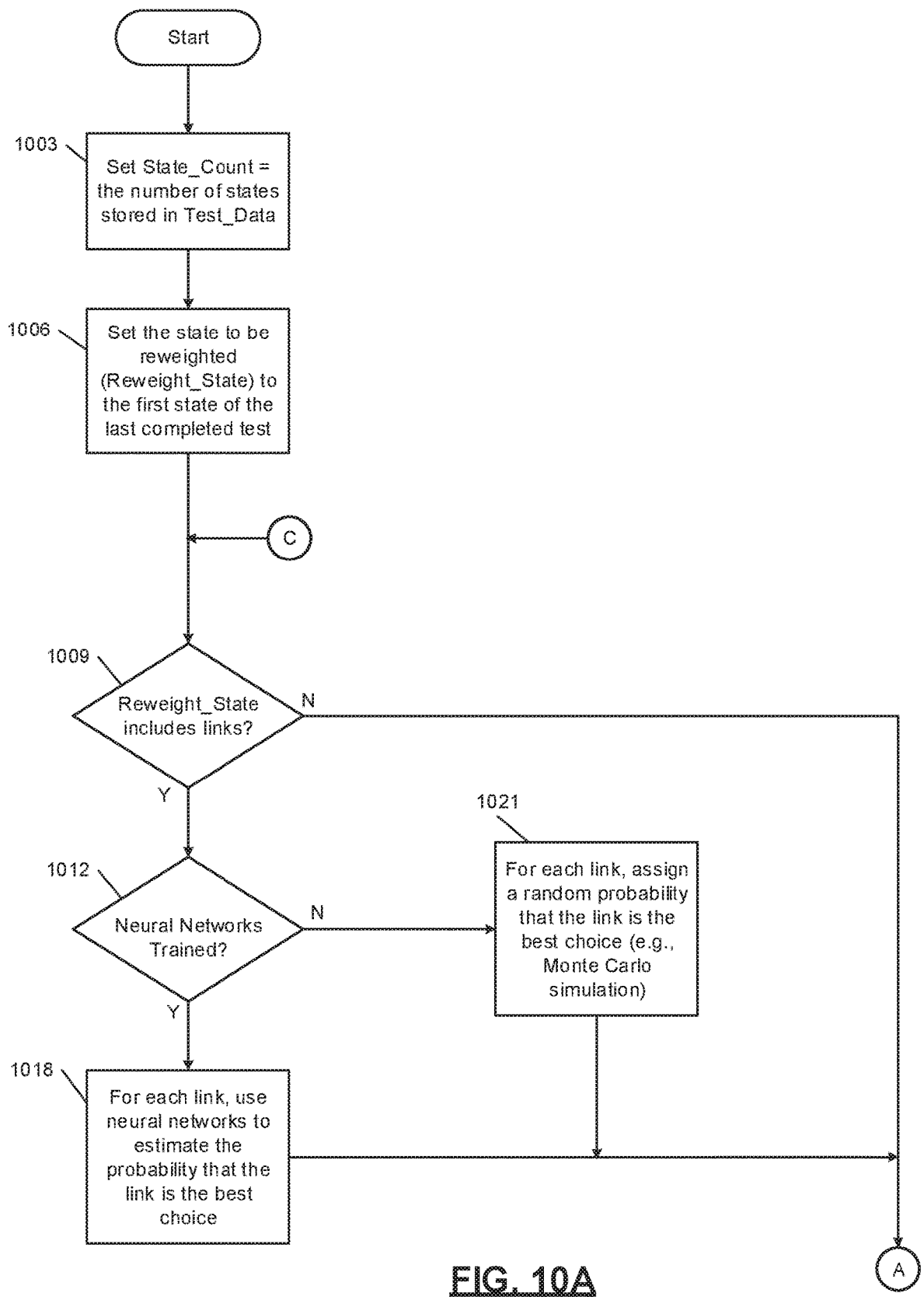
FIGS. 10A-10C are a flowchart depicting an example method of reweighting actions in stored states.
Figure 10B:
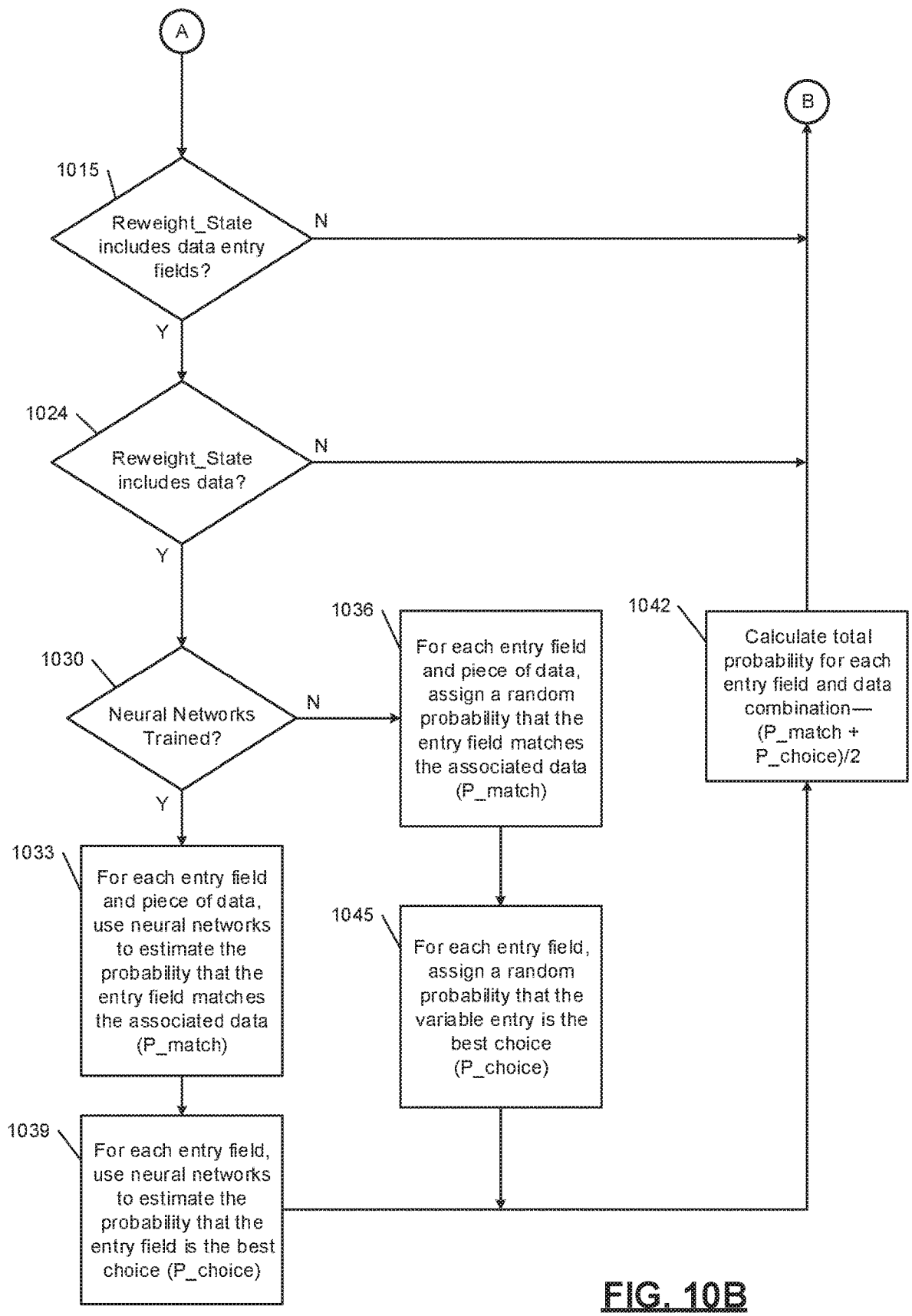
Figure 10C:
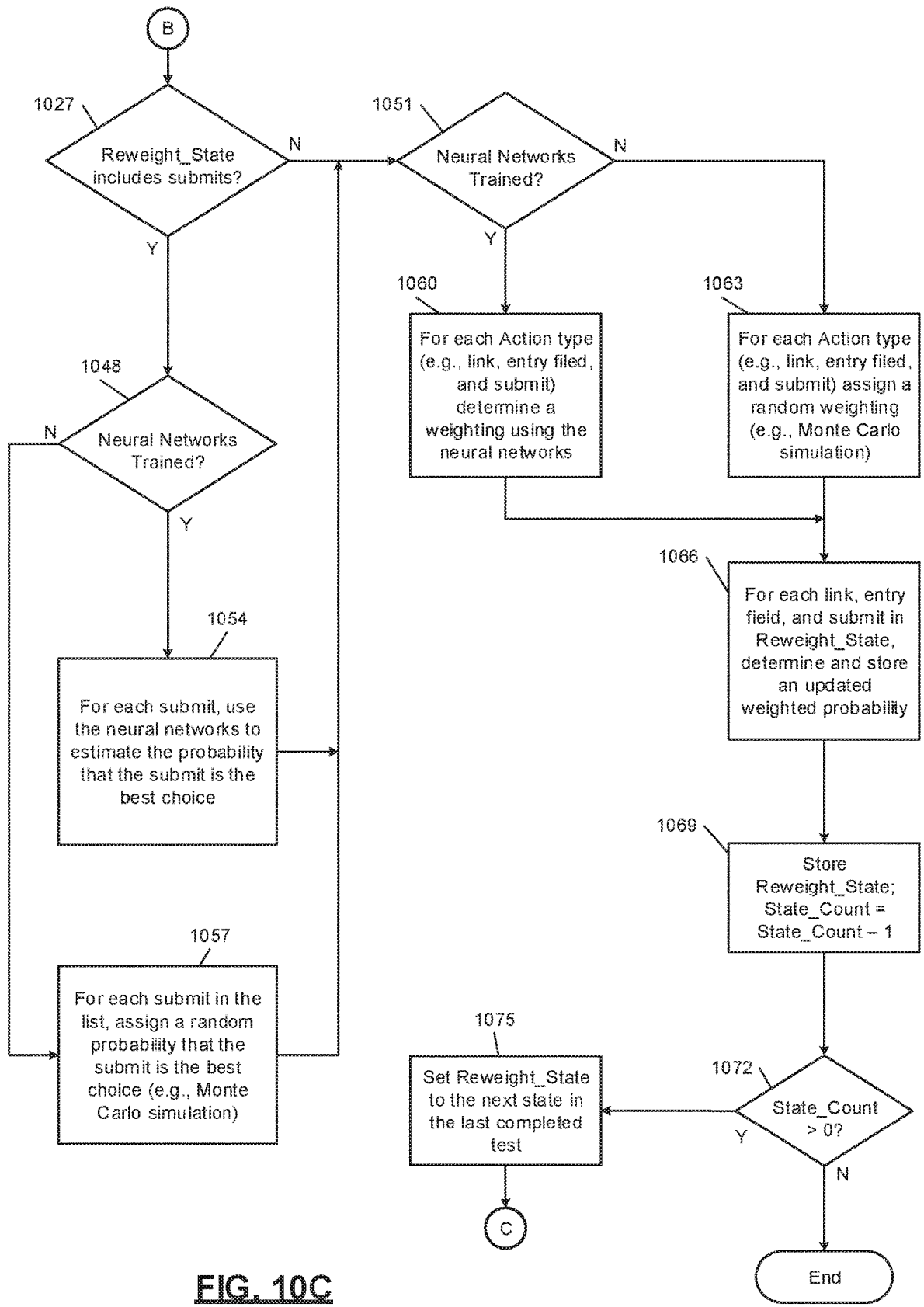

FIGS. 10A-10C are a flowchart depicting an example method of reweighting actions in a completed shortest path test. Although the example method is described below with respect to the UI testing and enhancement device 110, the method may be implemented in other systems. In various implementations, control may be performed by the shortest path module 120 and/or the reweighting module 136.

Control begins at 1003 of FIG. 10A, where control determines the number of states to be reweighted—for example, control sets State_Count to the number of steps stored in Test_Data. Control progresses with 1006, where control sets the state to be reweighted (Reweight_State) to the first state of the last completed test—the first step stored in Test_Data. Control then continues with 1009.

At 1009, control determines whether the state to be reweighted includes links. If so, control progresses to 1012; otherwise control transfers to 1015 of FIG. 10B. At 1012, control determines whether the neural networks in the neural network module 144 are trained. If so, control progresses to 1018; otherwise control transfers to 1021. At 1018, for each link in the state to be reweighted, control uses the neural networks in the neural network module 144 to estimate the probability that the link will result in the goal text and then stores the estimated probabilities—for example, in Reweight_State. Control then progresses to 1015 of FIG. 10B.

At 1021, for each link in the state to be reweighted, control assigns a random probability that the link will result in the goal and then stores the random probabilities—for example, in Reweight_State. In some implementations, control may use the Monte Carlo module 142 to generate the random probabilities. Control then progresses to 1015 of FIG. 10B.

At 1015 of FIG. 10B, control determines whether the state to be reweighted (Reweight_State) includes a data entry field. If so, control continues with 1024; otherwise control transfers to 1027 of FIG. 10C. At 1024, control determines whether the state to be reweighted (Reweight_State) includes data. If so, control continues with 1030; otherwise, control transfers to 1027 of FIG. 10C.

At 1030, control determines if the neural networks are trained. If so, control continues with 1033; otherwise, control transfers to 1036. At 1033, for each possible data entry field and data combination in the state to be reweighted, control uses the neural networks in the neural network module 144—for example, the data match neural network 152—to estimate the probability that the data entry field matches the data (P_match). Control continues with 1039 where, for each data entry field in the state to be reweighted, control uses neural networks in the neural network module 144—for example, the data choice neural network 154—to estimate the probability that entering data into the entry field will result in the goal text (P_choice). Control progresses to 1042.

At 1036, for each entry field and each piece of data in the state to be reweighted, control assigns a random probability that the entry field matches the data (P_match). Control progresses to 1045 where, for each entry in the state to be reweighted, control assigns a random probability that entering data into the data entry field will result in the goal (P_choice). In some implementations, control may use the Monte Carlo module 142 to generate random probabilities for P_match and P_choice. Control then progresses to 1042.

At 1042, control calculates a combined probability for each data entry field and data combination. For example, control may average P_match and P_choice for each data entry field and data combination in the state to be reweighted. Control stores the combined probabilities—for example, in Reweight_State. Control then continues with 1027 of FIG. 10C.

At 1027 of FIG. 10C, control determines whether the state to be reweighted includes submits. If so, control progresses to 1048; otherwise, control transfers to 1051. At 1048, control determines whether the neural networks are trained. If so, control progresses to 1054; otherwise, control transfers to 1057. At 1054, for each submit in the state to be reweighted, control uses neural networks in the neural network module 144—for example, the submit neural network 150—to estimate the probability that executing the submit will result in the goal text and then stores the estimated probabilities—for example, in Reweight_State. Control then progresses to 1051.

At 1057, for each submit in the state to be reweighted, control assigns a random probability that the submit will result in the goal text and then stores the random probabilities—for example, in Reweight_State. In some implementations, control may use the Monte Carlo module 142 to generate the random probabilities. Control then progresses to 1051.

At 1051, control determines whether the neural networks in the neural network module 144 are trained. If so, control continues with 1060; otherwise, control transfers to 1063. At 1060, control uses the action weight neural network 156 to determine a probability weighting for each action type—for example, links, data entry fields, and submits. Control continues with 1066. At 1063, control assigns a random probability weighting to each action type—for example, links, entry fields, and submits. In some implementations, control may use the Monte Carlo module 142 to determine the random probability weightings. Control continues with 1066.

At 1066, control determines and stores an updated weighted probability for each link, data entry field and data combination, and submit in the state to be reweighted—in other words, for each action in Reweight_State. Control may use equations 3 and 4, as previously described, to calculate each weighted probability. Control then progresses to 1069.

At 1069, control stores the reweighted state—for example, control may set the state in Test_Data that corresponds to the reweighted state to Reweight_State. At 1069, control also decrements State_Count by one. Control continues with 1072 where control determines whether there are any additional states to be reweighted—that is, whether State_Count is greater than zero. If so, control continues with 1075 where control sets the state to be reweighted to the next state stored in the last completed test—for example, control sets Reweight_State to the next state stored in Test_Data. Control then returns to 1009 of FIG. 10A. If control determines that there are no additional states to be reweighted, control ends.

Figure 11:
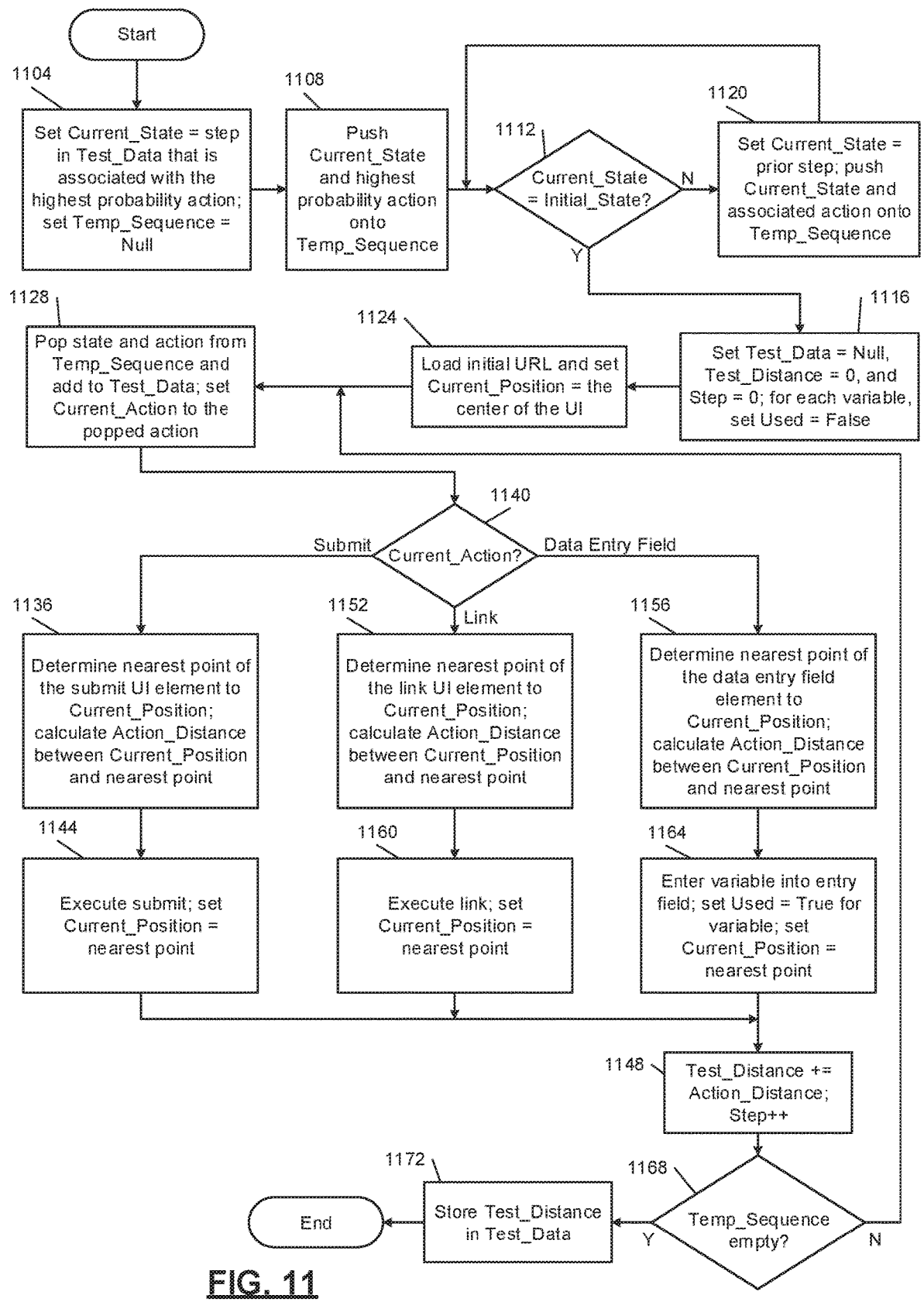
FIG. 11 is a flowchart depicting an example method of building a new UI session based on a selected shortest path action.

FIG. 11 is a flowchart depicting an example method of building a new UI session based on a selected action. Although the example method is described below with respect to the UI testing and enhancement device 110, the method may be implemented in other systems. In various implementations, control may be performed by the shortest path module 120 and/or the session creation module 138.

Control begins at 1104 upon selection of the highest probability action in a completed shortest path test. At 1104, control sets a current state variable (Current_State) to the step in the completed test that is associated with the selected action. At 1104, control also initializes a stack to temporarily hold a state sequence (Temp_Sequence) to Null. Control then progresses to 1108, where control pushes the current state (Current_State) onto the temporary stack (Temp_Sequence). Control continues with 1112, where control determines whether the current state is the initial state of the completed test. If so, control progresses to 1116; otherwise, control transfers to 1120.

At 1120, control sets the current state to the step prior to the current state—for example, the step prior to the current state in Test_Data. Control then pushes the current state (Current_State) and the action associated with the current state onto the temporary stack (Temp_Sequence). Control then returns to 1112.

At 1116, control initializes the state sequence for the new session—for example, control sets Test_Data to Null, Test_Distance to zero, Steps to zero, and, for each variable in the configuration data, Used to False. Control progresses to 1124, where control loads the initial URL and sets the current position to the center of the UI. Control continues with 1128, where control pops the top entry from the temporary stack (Temp_Sequence) and adds it to the test data (Test_Data). At 1128, control also sets the action associated with the entry to the current action (Current Action). Control continues with 1132.

At 1132, control determines the type of the current action. If the type is a submit, control progresses to 1136; if the type of the current action is a link, control transfers to 1152; if the type of the current action is a data entry field, control transfers to 1156. At 1136, control determines the nearest point of the UI element associated with the submit. Control then calculates the action distance (Action_Distance) as the Euclidean distance between Current_Position and the nearest point of the UI element associated with the submit. Control then continues with 1144, where control executes the submit—for example, control adds clicks on the UI element associated with the submit—and sets the current position (Current_Position) to the nearest point of the UI element associated with the submit. Control then progresses to 1148.

At 1152, control determines the nearest point of the UI element associated with the link. Control then calculates the action distance (Action_Distance) as the Euclidean distance between Current_Position and the nearest point of the UI element associated with the link. Control then continues with 1160, where control executes the link—for example, control triggers a clicker tap on the UI element associated with the link—and sets the current position (Current_Position) to the nearest point of the UI element associated with the link. Control then progresses to 1148.

At 1156, control determines the nearest point of the data entry field. Control then calculates the action distance (Action_Distance) as the Euclidean distance between Current_Position and the nearest point of data entry field. Control then continues with 1164, where control enters the variable associated with the action into the data entry field; marks the variable as used—sets Used to True—and sets Current_Position to the nearest point of the data entry field. Control then progresses to 1148.

At 1148, control updates the test distance and the number of steps. For example, control adds Action_Distance to Test_Distance and increments Step by one. Control then continues with 1168. At 1168, control determines whether the temporary stack (Temp_Sequence) is empty—for example, the size of Temp_Sequence is zero. If so, control continues with 1172; otherwise, control returns to 1128. At 1172, control adds the test distance to the stored state sequence—for example, control adds Test_Distance to Test_Data. Control then ends.

Figure 12A:
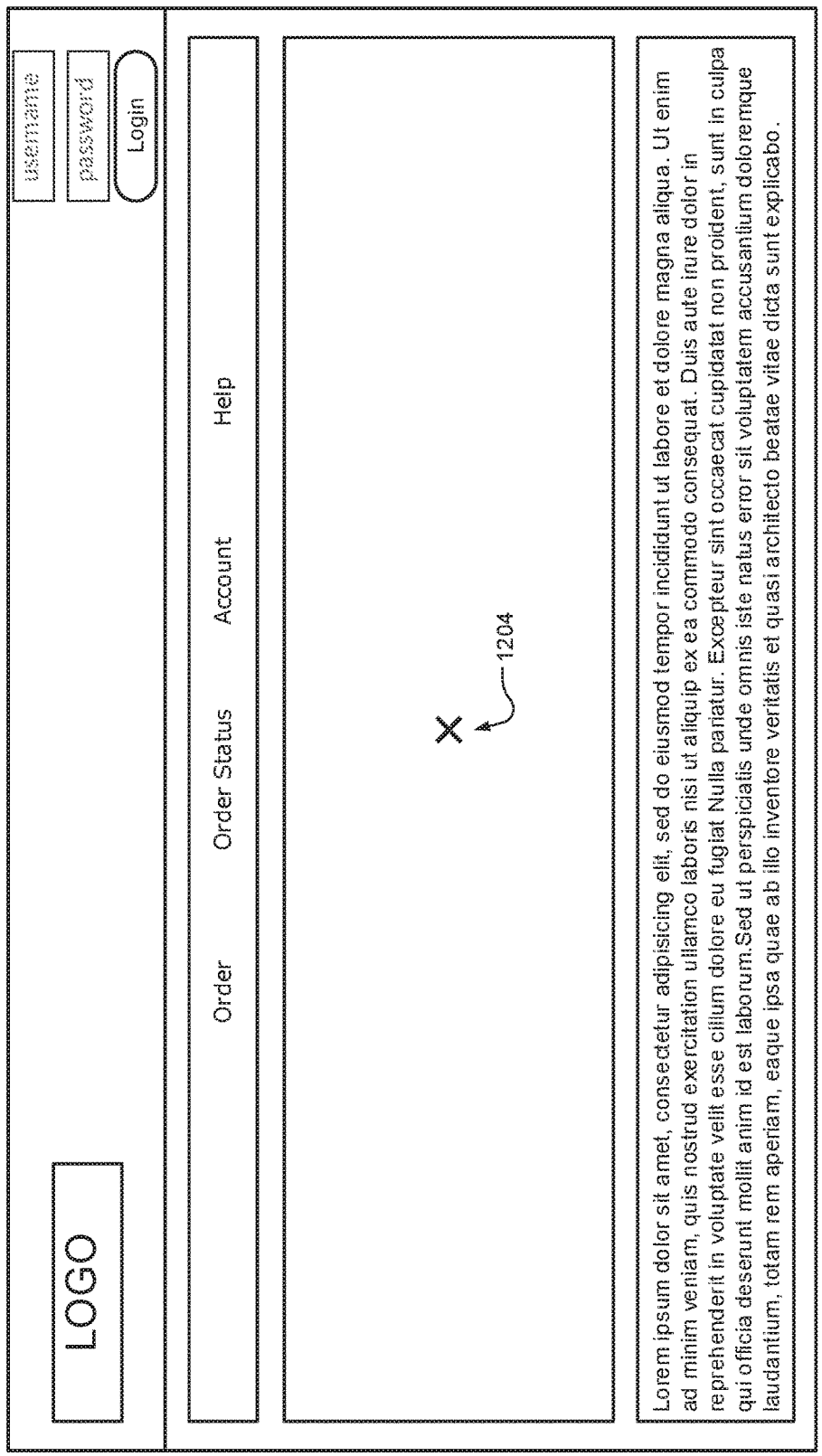
FIGS. 12A-12H are graphical representations of determining a shortest path to a goal in a specific example UI.

FIGS. 12A-12H are graphical representations of a process of determining a path to a goal in an example UI. Specifically, FIGS. 12A-12H depict an example process of determining a path to complete a login process in the example UI. FIG. 12A is a rendering of an initial state 1202 of the example UI. The process begins by setting the current position to the center of the screen 1204. Next, the initial state 1202 of the UI is analyzed.

Figure 12B:
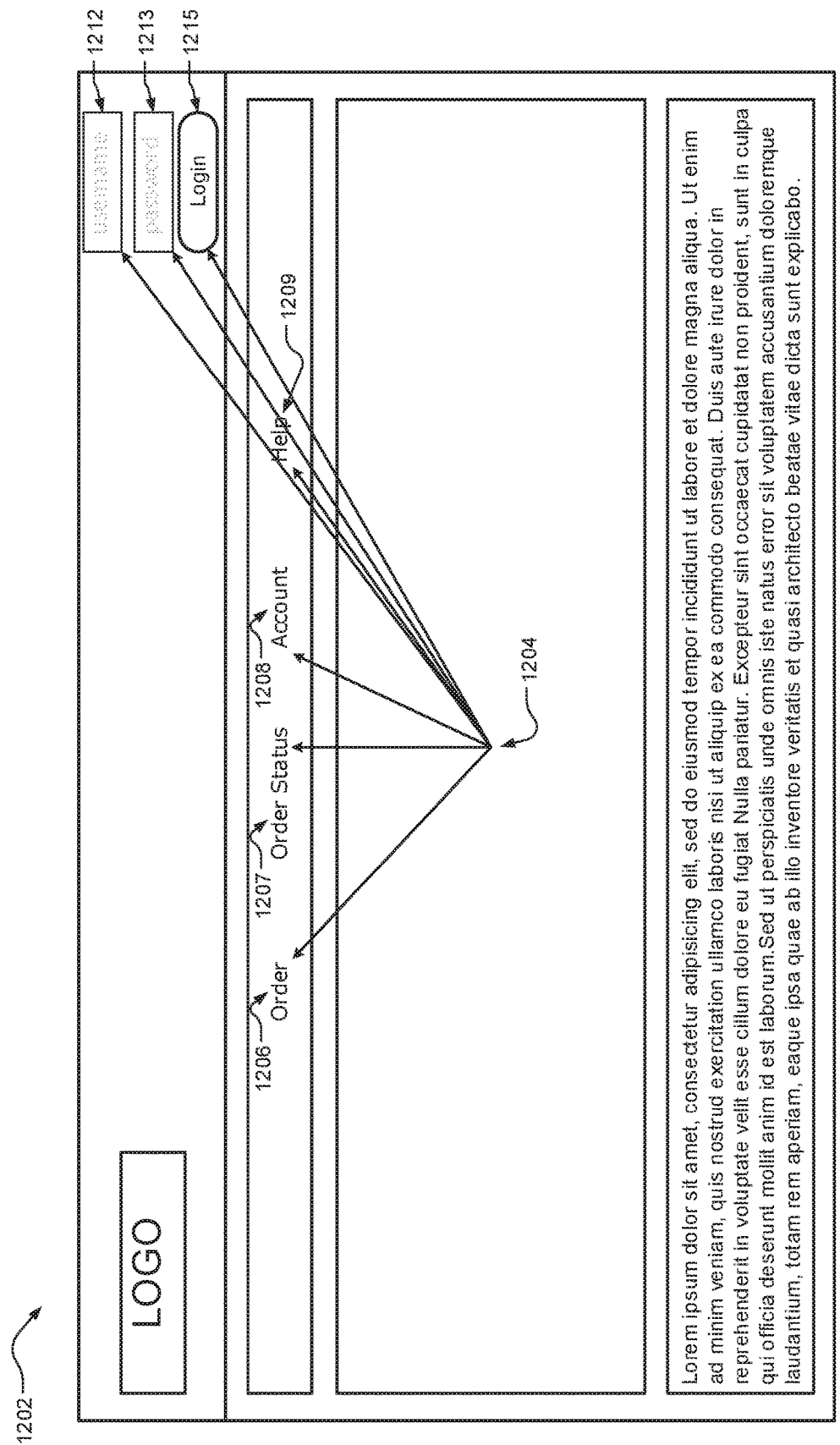

FIG. 12B is a graphical representation of the results of the analysis of the initial state 1202 of the UI: for example, an identification of all of the possible actions that may be taken in the initial state 1202 of the UI. Specifically, the analysis identified a first link 1206, a second link 1207, a third link 1208, and a fourth link 1209. The analysis also identified a first data entry field 1212, a second data entry field 1213, and a submit button 1215 labeled "Login." The arrows emanating from the center of the screen 1204 represent the distance from the current position to each identified action in the initial state 1202.

Figure 12C:
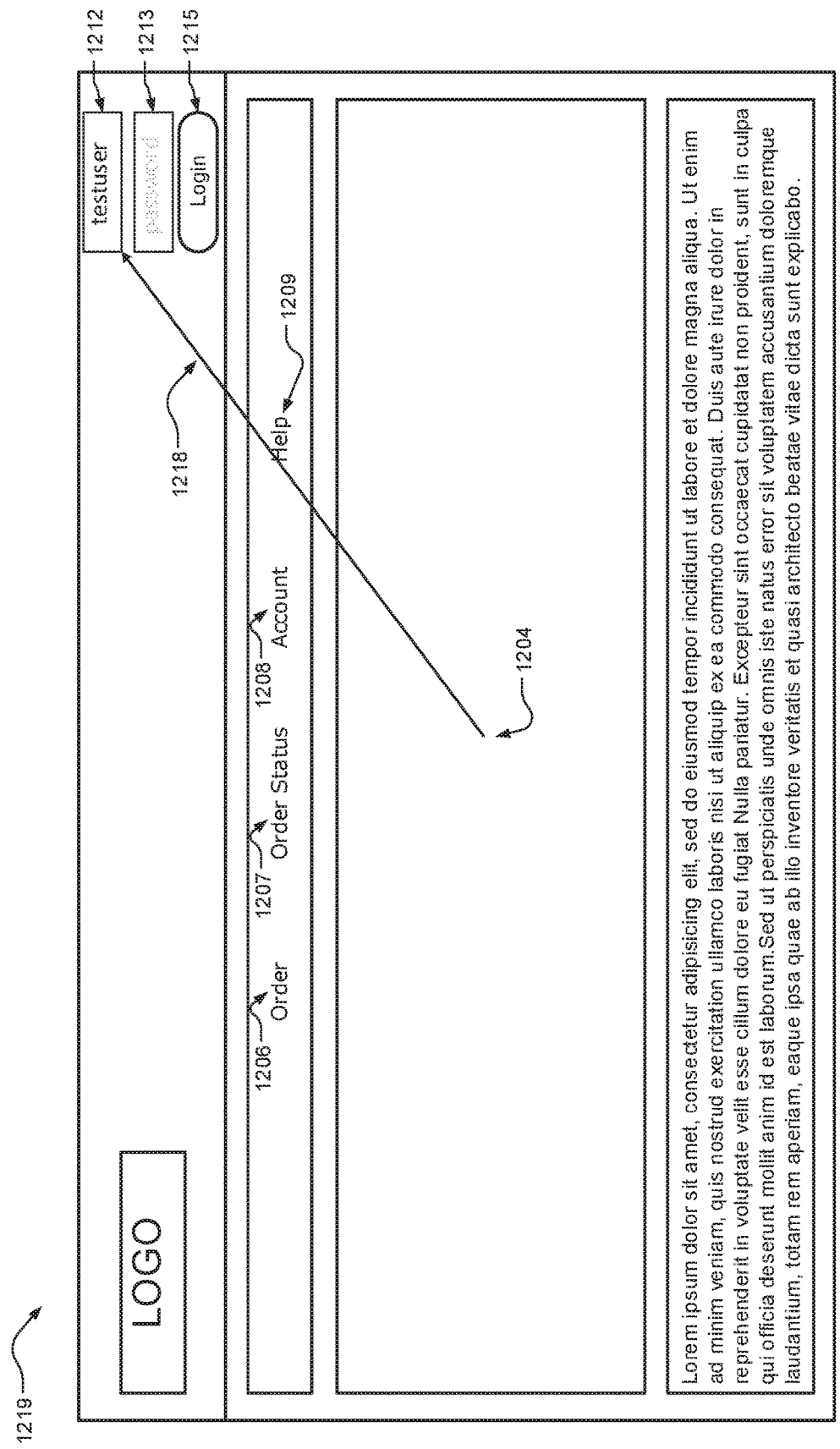

In FIG. 12C, the action selected as the first step in the shortest path is entering the text "testuser" into the first data entry field 1212. This selection may be made, as described above, based on weighted probabilities from trained neural networks. The distance between the current position—the center of the screen—and the location of the first data entry field is a first step distance 1218 that is stored as the distance of the shortest path. Performing the selected action results in the UI transitioning from the initial state 1202 to a second state 1219 and changing the current position to the location of the first data entry field 1212. Next, the second state 1219 of the UI is analyzed.

Figure 12D:
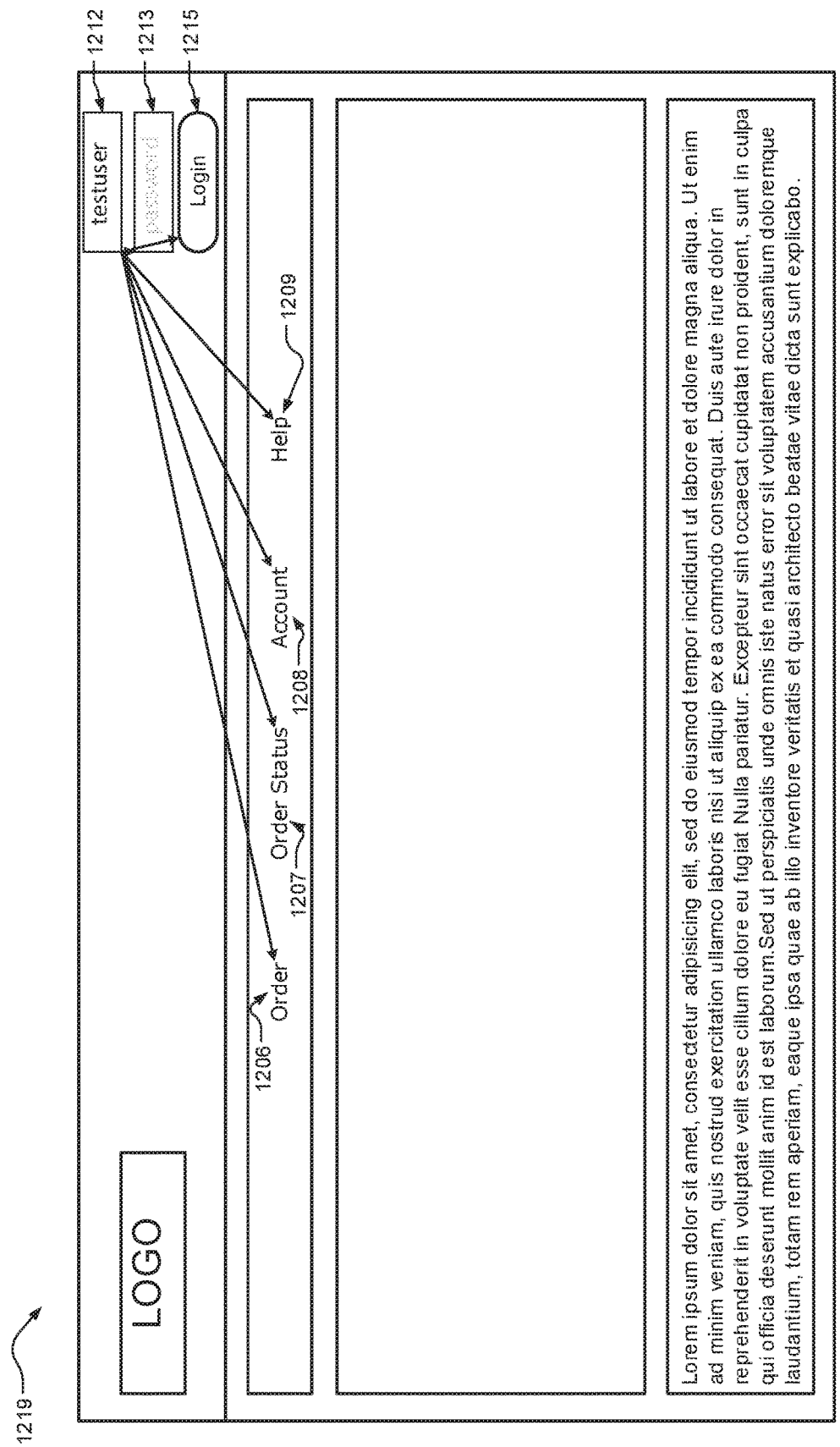

FIG. 12D is a graphical representation of the results of an analysis of possible actions that may be taken in the second state 1219 of the UI. Specifically, the analysis identified the first link 1206, the second link 1207, the third link 1208, the fourth link 1209, the second data entry field 1213, and the submit button 1215 as possible actions for the second step. The arrows emanating from the first data entry field 1212 represent the distances from the current position to each identified action in the second state 1219 of the UI.

Figure 12E:
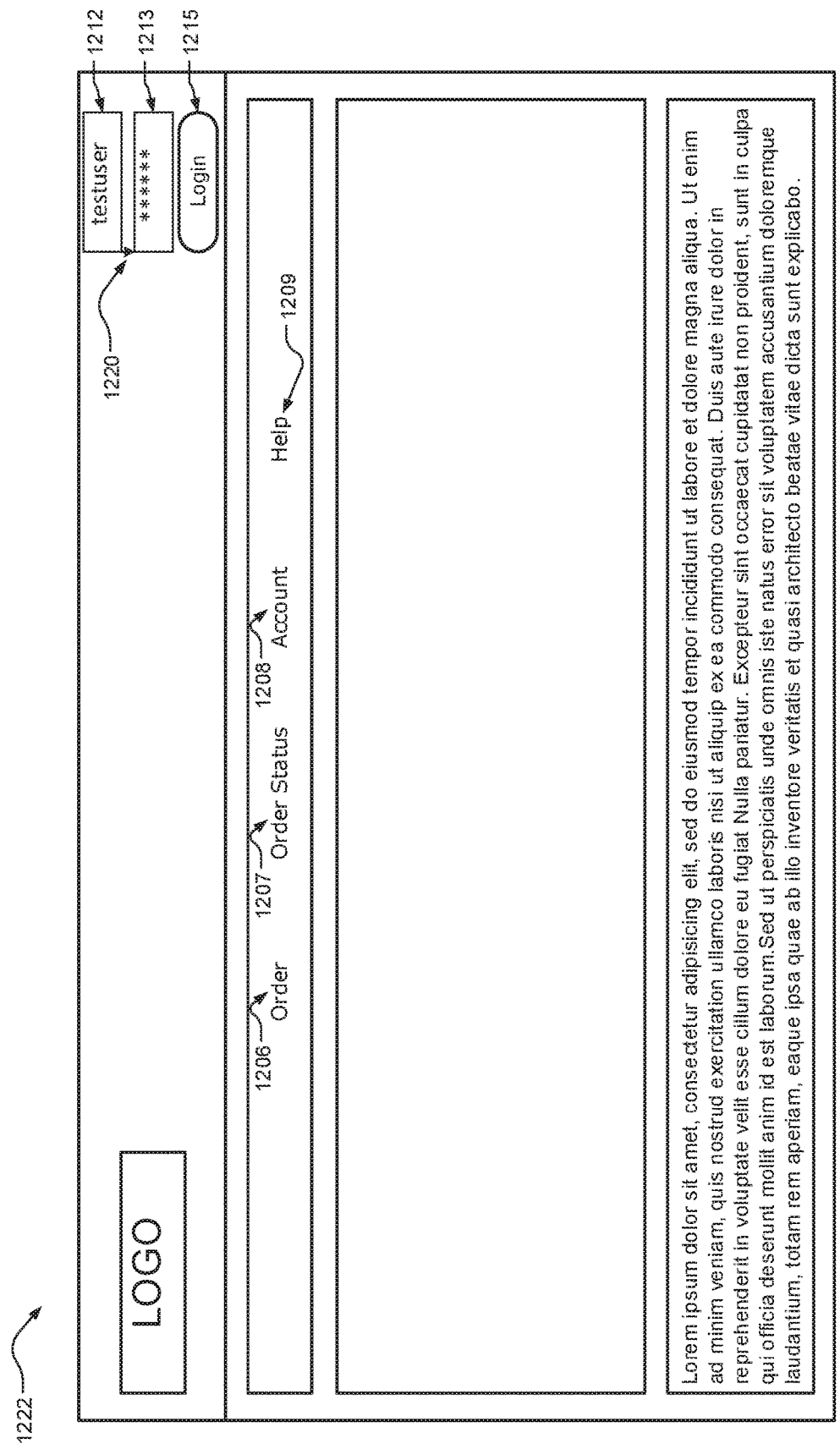

In FIG. 12E, the action selected as the second step is entering text into the second data entry field 1213—represented as "****". The distance between the current position—the location of the first data entry field 1212—and the location of the second data entry field 1213 is a second step distance 1220 that is added to the stored current path distance. Performing the selected action in the second state 1219 results in the UI transitioning to a third state 1222 and changing the current position to the location of the second data entry field 1213. Next, the third state 1222** of the UI is analyzed.

Figure 12F:
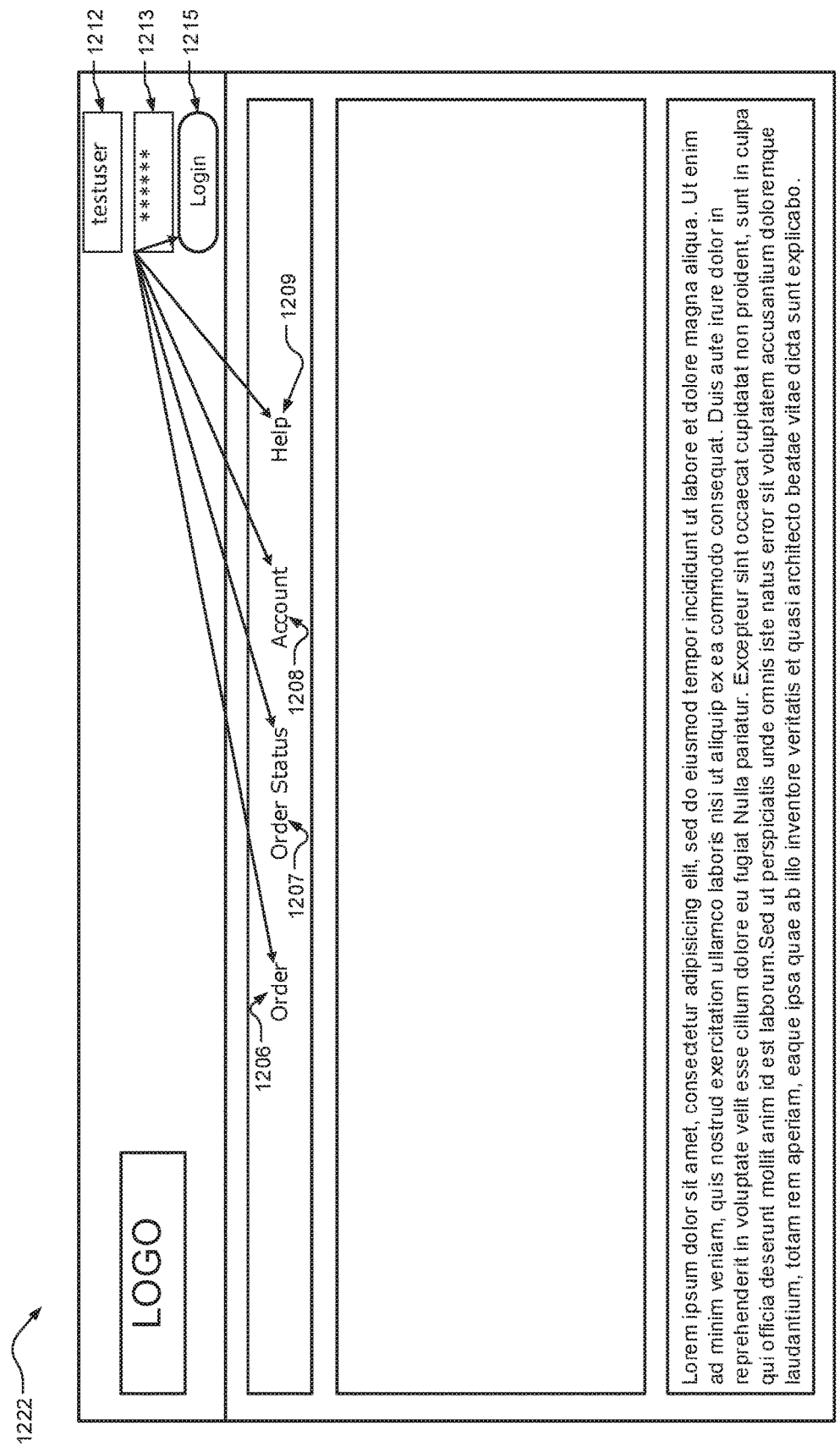

FIG. 12F is a graphical representation of the results of an analysis of the third state 1222 of the UI—in other words, all of the possible actions that may be taken in the third state 1222 of the UI. Specifically, the analysis identified the first link 1206, the second link 1207, the third link 1208, the fourth link 1209, and the submit button 1215 as possible actions for the third step of the shortest path. The arrows emanating from the second data entry field 1213 represent the distance from the current position to each identified action in the third state 1222.

Figure 12G:
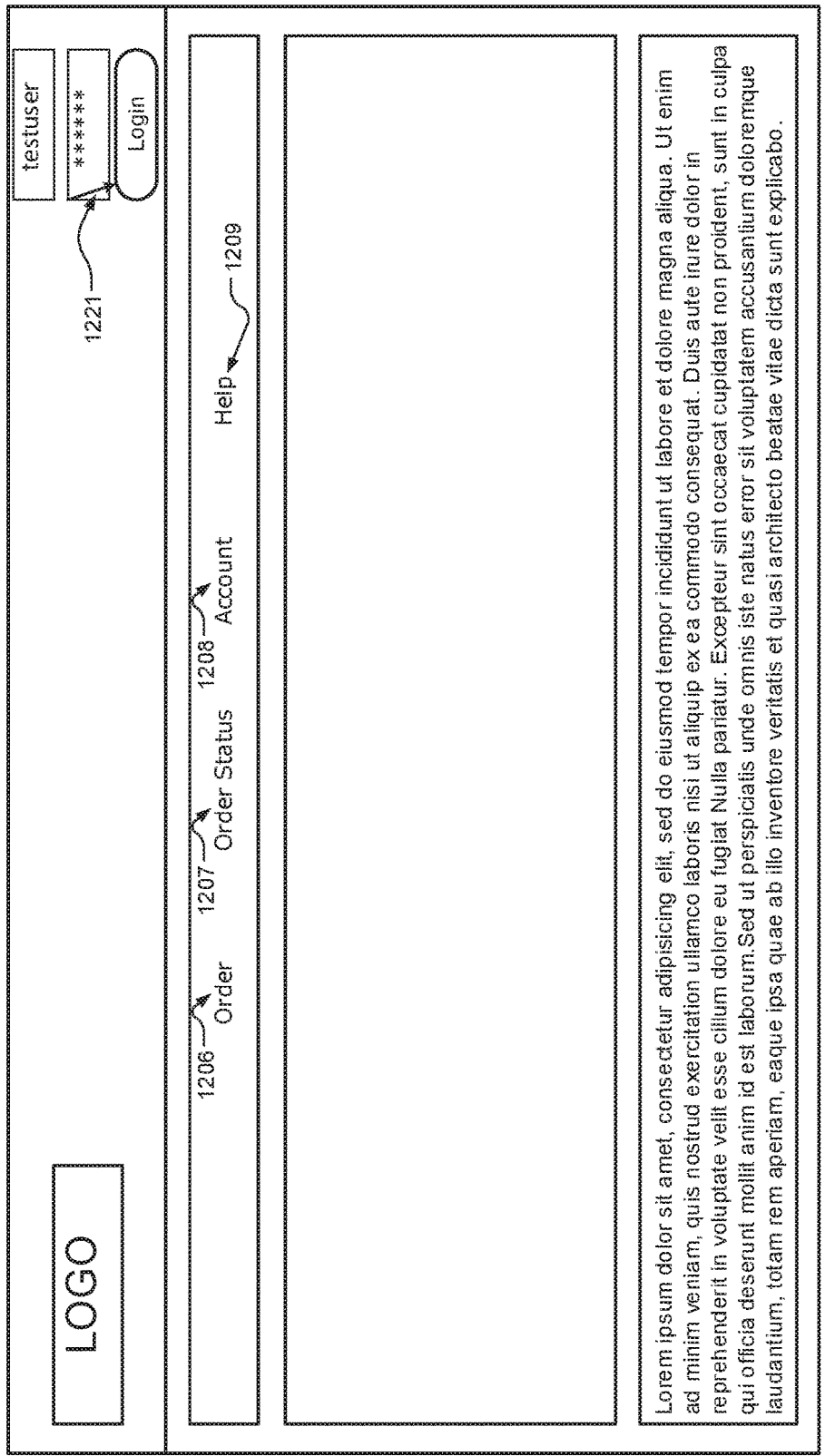

In FIG. 12G, the action selected as the third step is clicking the submit button 1215 labeled "Login." The distance between the current position—the location of the second data entry field 1213—and the location of the submit button 1215 labeled "Login." is a third step distance 1224 that is added to the stored current path distance. Performing the selected action in the third state 1222 results in the UI transitioning to a fourth state 1226 shown in FIG. 12H and changing the current position to the location of the submit button 1215 labeled "Login."

Figure 12H:
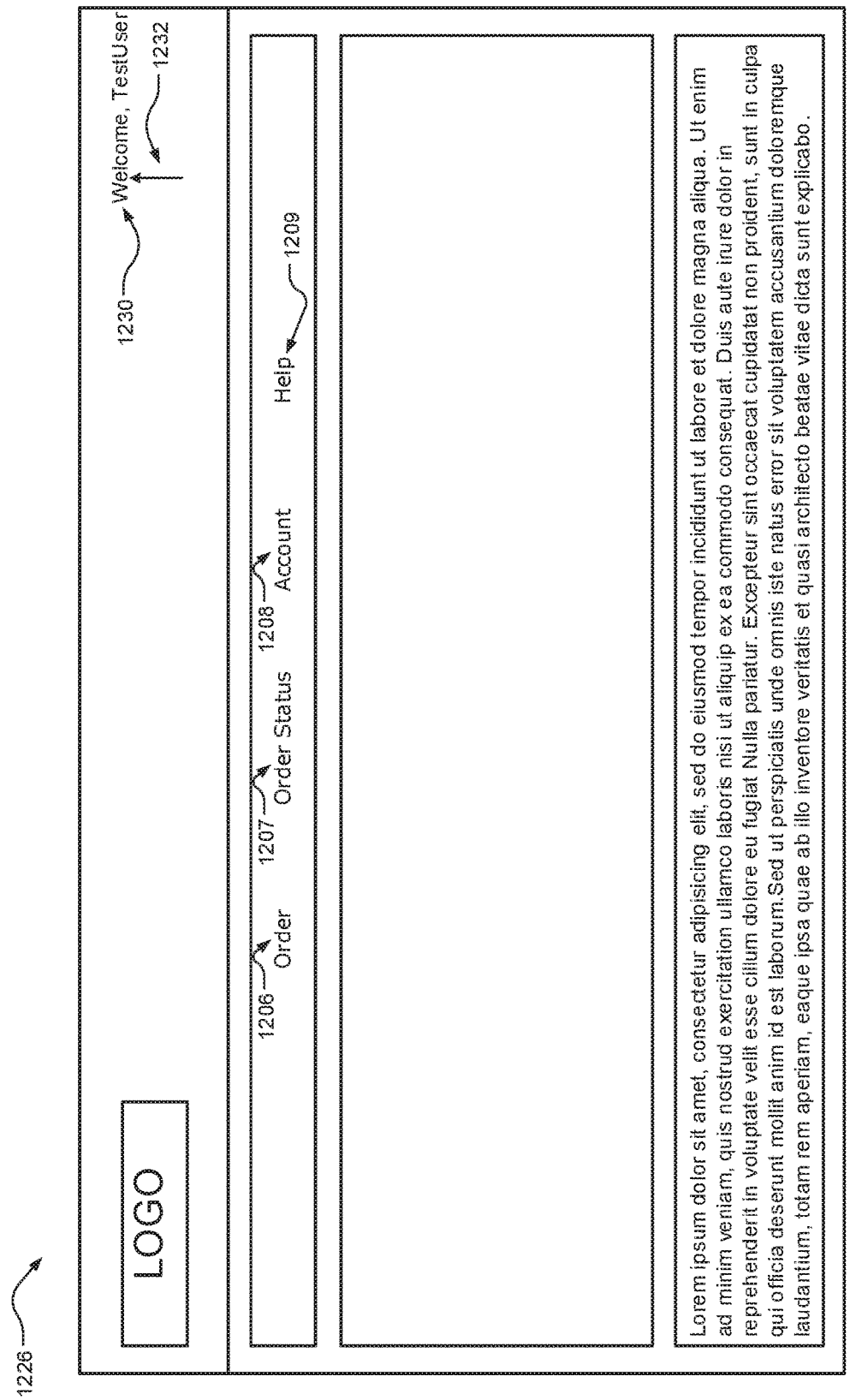

As shown in FIG. 12H, an analysis of the fourth state 1226 of the UI results in the identification of text 1230. The text 1230 matches the goal text (for example, "Welcome"), which indicates that the goal has been reached. The distance from the current position—the former location of the submit button 1215 labeled "Login"—to the location of the text 1230 is a fourth step distance 1232 that is added to the current path distance to determine the total distance of the current path. This path led to a successful outcome. Additional paths may be investigates to determine whether a successful path with a shorter total distance can be found.

User Interface Enhancement

Figure 13:
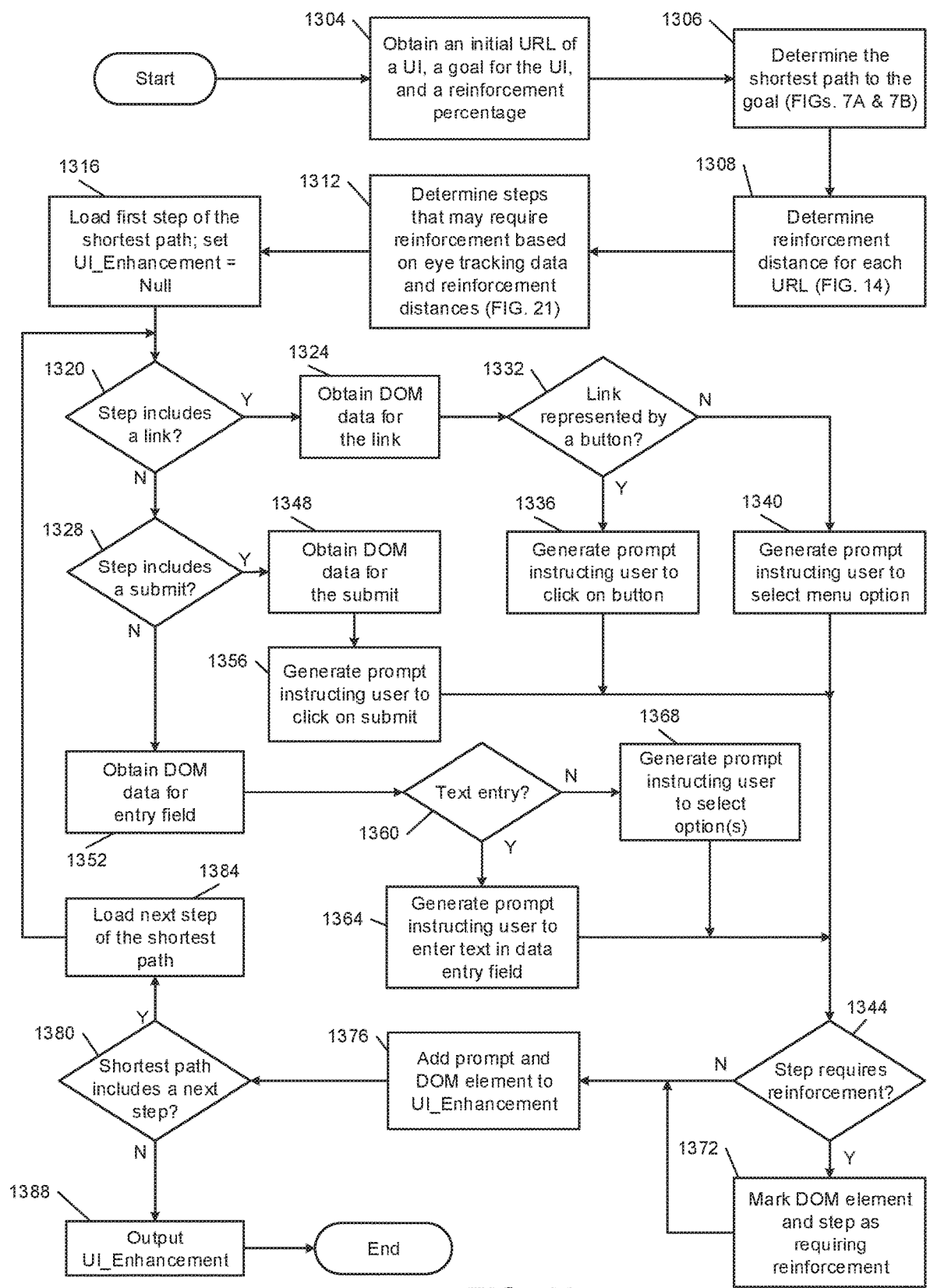
FIG. 13 is a flowchart depicting an example method of enhancing a UI based on eye tracking experiments.

FIG. 13 is a flowchart depicting an example method of generating prompts and reinforcements for a UI using eye tracking experiments. Although the example method is described below with respect to the UI testing and enhancement device 110, the method may be implemented in other devices and/or systems. In various implementations, control may be performed by the UI enhancement module 122 and the shortest path module 120.

Control begins at 1304, where control obtains an initial URL for a UI, a goal for the UI, and a reinforcement percentage. The reinforcement percentage is a threshold used to determine if a step of the shortest path to the goal requires user reinforcement. For example, the reinforcement percentage indicates how often users may deviate from a step of the shortest path before the step is determined to require reinforcement. Control continues with 1306. At 1306, control determines the shortest path in the UI to the goal. In some implementations, control may perform the method disclosed in FIGS. 7A and 7B, as previously described. In other implementations, control may load a previously stored shortest path associated with the goal for the UI—for example, from the storage device 112. Control then progresses to 1308.

At 1308, control determines a reinforcement distance for each URL of the UI that is encountered along the shortest path. The reinforcement distance is the maximum distance that a user may deviate from the applicable shortest path step before control determines that the step may require reinforcement. Control may perform the method described in FIG. 14 to determine the reinforcement distance for each URL. Control then continues with 1312.

At 1312, control determines, based on the determined reinforcement distance for each URL of the UI, the steps of the shortest path that may require reinforcement. For example, control may perform the method disclosed in FIG. 21 to determine which steps may require reinforcement. Control continues with 1316.

At 1316, control loads the first step of the shortest path. Control also initiates UI_Enhancement to Null. UI_Enhancement is used to store prompts and reinforcements related to the UI that may be used to aid a user in reaching the goal. Control then progresses to 1320.

At 1320, control determines whether the step includes a link. If so, control continues with 1324; otherwise, control transfers to 1328. At 1324, control obtains the DOM element that corresponds to the included link. Control continues with 1332 where control determines, based on the obtained DOM element, whether the link is represented by a button. If so, control continues with 1336; otherwise, control transfers to 1340.

At 1336, control generates a prompt that instructs a user to click on the button associated with the link. For example, control may set the prompt to "Click on <<button>>." In the generated prompt, <<button>> is text that describes the button—for example, the name of the button or text associated with the button. Control may obtain the name of, or the text associated with, the button from the obtained DOM element. Control then progresses to 1344, as described below.

At 1340, control generates a prompt that instructs a user to select an option from a menu. For example, control may set the prompt to "Select <<option>> from <<menu>>." In the generated prompt, <<option>> and <<menu>> are texts that describe the option and the menu, respectively. Control may obtain the text from the obtained DOM element. Control continues with 1344, as described below.

Returning to 1328, control determines whether the step includes a submit. If so, control continues with 1348; otherwise, control determines that the step includes a data entry field and control transfers to 1352. At 1348, control obtains the DOM element that corresponds to the submit included in the step. Control continues with 1356, where control generates a prompt that instructs a user to click on the submit. For example, control may set the prompt to "Click on <<submit>>." In the generated prompt, <<submit>> is text that describes the submit—for example, the name of the submit or text associated with the submit. Control may obtain the name of, or the text associated with, the submit from the obtained DOM element. Control then progresses to 1344, as described below.

Returning to 1352, control obtains the DOM element that corresponds to the data entry field. Control continues with 1360 where control determines, based on the obtained DOM element, whether the data entry field is a text entry field. If so, control continues with 1364; otherwise, control may infer that the entry field is a list of one or more options and transfer to 1368. At 1364, control generates a prompt that instructs a user to enter text into the entry field. For example, control may set the prompt to "Enter your data in <<field>>." In the generated prompt, <<field>> is text that describes the entry field—for example, the name of the entry field or text associated with the entry field. Control may obtain the name of, or the text associated with, the entry field from the obtained DOM element. Control then progresses to 1344.

Returning to 1368, control generates a prompt that instructs a user to select an option from the list of options. For example, control may set the prompt to "Select <<option>> from the options in <<field>>." In the generated prompt, <<field>> is text that describes the entry field—for example, the name of the entry field or text associated with the entry field. Control may obtain the name of, or the text associated with, the entry field from the obtained DOM element. Control continues with 1344.

Returning to 1344, control determines whether the step requires user reinforcement based on the received reinforcement percentage. For example, control may use inequality 6 below to determine whether the step requires reinforcement.

$$\frac{Count_{reinforce}}{Count_{total}} * 100 > \text{Reinforcement \%} \quad (6)$$

$Count_{reinforce}$ represents the number of times the step is referenced as potentially requiring reinforcement—each occurrence of an eye tracking data sample deviating from the step by more than the corresponding reinforcement distance. $Count_{total}$ is the total number of times that an eye tracking sample was determined to correspond to the step. If inequality 6 is true, control determines that the step requires reinforcement and control continues with 1372; otherwise, control transfers to 1376.

At 1372, control marks the component of the UI associated with the obtained DOM element as requiring additional reinforcement. In some implementations, the UI component may be highlighted while the prompt is presented to a user. In other implementations, the location of the UI component may be provided to a user. Control then progresses to 1376.

At 1376, control stores the shortest path step, the DOM element, the generated prompt, and any additional reinforcement in UI_Enhancement. Control continues with 1380.

At 1380, control determines whether the shortest path includes a next step. If so, control continues with 1384; otherwise, control transfers to 1388. At 1384, control loads the next step in the shortest path and then returns to 1320.

At 1388, control outputs UI_Enhancement. Control then ends. The UI enhancements generated may be used to generate a new UI that guides a user to the goal. For example, the generated prompts may be incorporated into the UI. The data contained in UI_Enhancement may also be used by an automated system to provide a user with prompts that guide the user to a requested or suggested goal.

In some implementations, control may only generate a prompt in response to determining that a step of the shortest path requires reinforcement. In other words, control may only implement elements 1320, 1324, 1328, 1332, 1336, 1340, 1348, 1352, 1356, 1360, 1364, and 1368 in response to control determining (as at 1344) that the step requires user reinforcement based on the received reinforcement percentage. For example, control may use inequality 6 above to determine whether the step requires reinforcement.

Figure 14:
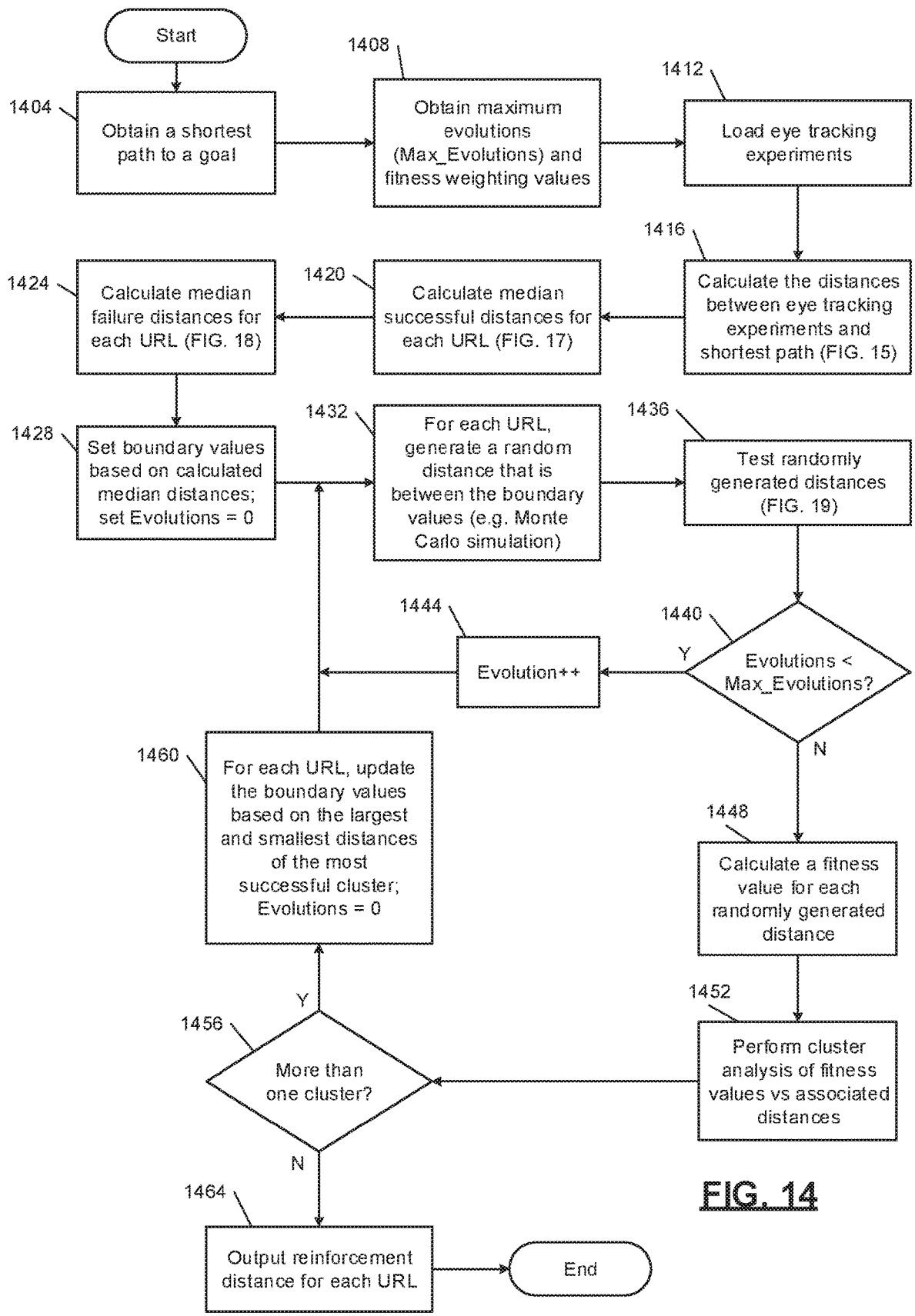
FIG. 14 is a flowchart depicting an example method of determining a reinforcement distance for each URL for a web-based UI.

FIG. 14 is a flowchart depicting an example method for determining a reinforcement distance for each URL of a UI. Although the example method is described below with respect to the UI testing and enhancement device 110, the method may be implemented in other devices and/or systems. In various implementations, control may be performed by the reinforcement module 160 and/or the distance module 164.

Control begins at 1404 where control obtains a shortest path for a goal. In some implementations, control may load a shortest path that has been previously determined and stored—for example in the storage device 112. In other implements, control may perform the method disclosed in FIGS. 7A and 7B. Control continues with 1408 where control obtains testing parameters—for example, a maximum number of evolutions that the system is permitted to take (Max_Evolutions) and a set of fitness weighting values. Control then progresses to 1412.

At 1412, control loads eye tracking experiments that correspond to the UI and the goal. The eye tracking experiments include tracking data of a user navigating the UI. The tracking data is captured at a fixed sampling frequency—for example, every two seconds. Each eye tracking experiment groups the tracking data into pages based on the page of the UI being navigated by the user, in the order that they were viewed by the user. In other words, each page of an eye tracking experiment represents the movements of a user during a single state of the UI. Each data point in the tracking data includes the page of the UI (URL) at the time of capture and a set of coordinates that indicate a location on the screen of the UI. Control continues with 1416.

At 1416, control calculates the differences between the eye tracking experiments and the shortest path. For example, control determines the distances between the tracking data and points along the shortest path. Control may perform the method disclosed in FIG. 15 to calculate the distances. Control then progresses to 1420.

At 1420, control calculates the median successful distance for each URL included in the eye tracking experiments marked as successes—experiments that resulted in the user reaching the goal. Control may perform the method disclosed in FIG. 17 to determine the median successful distances. Control then progresses to 1424.

At 1424, control calculates the median failure distance for each URL included in eye tracking experiments marked as failures. An experiment may be marked as a failure if the user did not reach the goal or if the tracking data deviated from the shortest path. Control may perform the method disclosed in FIG. 18 to determine the median failure distances. Control continues with 1428.

At 1428, control sets boundary values for each URL based on the corresponding median success and failure distances. For example, control sets an upper bound for the URL to the median success distance and sets a lower bound for the URL to the median failure distance. The upper and lower bounds are used to generate guesses of distance of deviations from the shortest path that require reinforcement. Control also initiates the number evolutions performed (Evolutions) to zero. Control then progresses to 1432.

At 1432, for each URL, control generates a random distance based on the boundary values for the URL. For example, control may use the Monte Carlo module 142 to generate a random value between the upper bound for the URL and the lower bound for the URL. Control continues with 1436, where control tests the generated values for the URL. For example, control may perform the method disclosed in FIG. 19 to test the generated distances. Control then progresses to 1440.

At 1440, control determines whether the number of evolutions performed is less than the maximum number of allowed evolutions. If so, control continues with 1444; otherwise, control transfers to 1448. At 1444, control increments Evolutions and returns to 1432.

At 1448, control calculates a fitness value for each randomly generated reinforcement distance. Control may use equation 7 below to calculate each fitness value.

$$FitnessValue = \frac{\begin{pmatrix} W_1 * SuccessCount - \\ W_2 * FalsePositiveCount - \\ W_3 * FalseNegativeCount \end{pmatrix}}{TotalCount} \quad (7)$$

$W_1$, $W_2$, and $W_3$ are the fitness weighting values obtained in 1408. SuccessCount represents the number of times that a prediction, based on the randomly generated reinforcement distance for the URL, correctly predicted the outcome of an eye tracking experiment. FalsePositiveCount represents the number of times that a prediction, based on the randomly generated reinforcement distance for the URL, incorrectly predicted that a successful eye tracking experiment was a failure. FalseNegative represents the number of times that a prediction, based on the randomly generated reinforcement distance for the URL, incorrectly predicted that a failed eye tracking experiment was a success. Control continues with 1452.

At 1452, control performs cluster analysis on a plot of the determined fitness values versus the associated randomly generated distances. In some implementations, control uses the density-based spatial clustering of applications with noise (DBSCAN) algorithm to perform the cluster analysis. In other implementations, control uses the mean shift technique to perform the cluster analysis. In yet other implementations, control may use any suitable cluster analysis technique or algorithm to analyze the plot of fitness values versus randomly generated distances. Control continues with 1456.

At 1456, control determines whether more than one cluster was identified for a single URL during the cluster analysis. If so, control continues with 1460; otherwise, control transfers to 1464. At 1460, control updates the boundary value for each URL based on the most successful cluster of the URL. For example, for each URL, control sets the upper bound for the URL to the largest distance in the most successful cluster and sets the lower bound for the URL to the smallest distance in the most successful cluster. Control also resets the number of performed evolutions to zero. Control then returns to 1432.

Returning to 1464, control outputs the reinforcement distances. For example, for each URL, control outputs the reinforcement distance associated with the URL with the highest fitness value. Control then ends.

Figure 15:
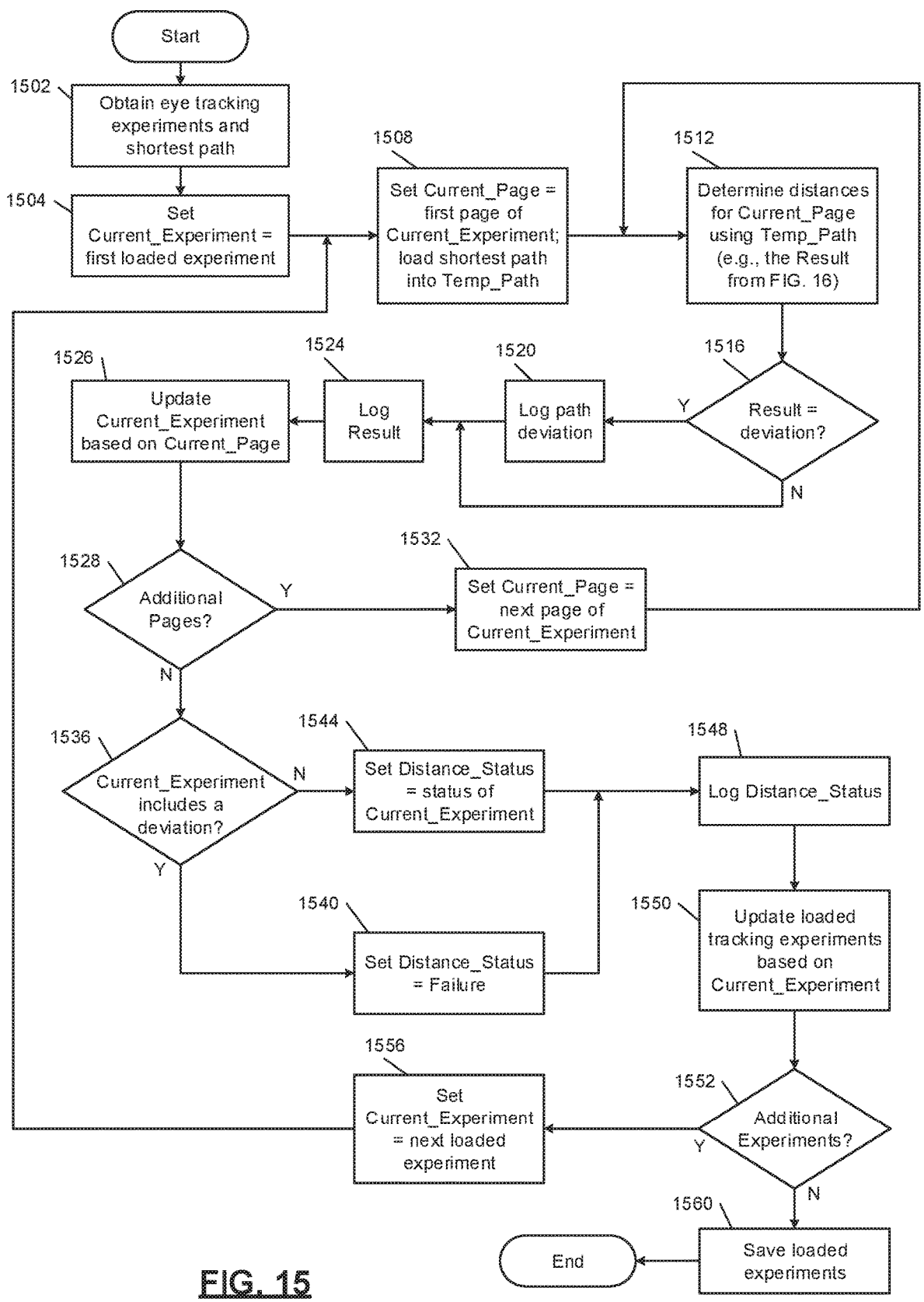
FIG. 15 is a flowchart depicting an example method for determining distances between eye tracking experiments and points along a loaded shortest path.

FIG. 15 is a flowchart depicting an example method for determining the distances between eye tracking experiments and points along a loaded shortest path. Although the example method is described below with respect to the UI testing and enhancement device 110, the method may be implemented in other devices and/or systems. In various implementations, control may be performed by the reinforcement module 160 and/or the distance module 164.

Control begins with 1502. At 1502, control obtains eye tracking experiments and a shortest path. In some implementations, control may load previously stored eye tracking experiments and/or a shortest path—for example, from the storage device 112. In other implementations, control may use eye tracking experiments and/or a shortest path that are already loaded. Control continues with 1504, where control sets variable Current_Experiment to the first loaded eye tracking experiment. Control continues with 1508 where control sets Current_Page to the first page stored in Current_Experiment. At 1508, control also loads the steps of the shortest path into a temporary queue (Temp_Path). Control then progresses to 1512.

At 1512, control determines the distances for the current page using the temporary queue. For example, control may perform the method disclosed in FIG. 16 to load Current_Page and calculate the distances based on the shortest path steps in Temp_Path. Control then progresses to 1516. At 1516, control determines whether the tracking data associated with the current page deviated from the shortest path—for example, whether Result equals deviation. If so, control continues with 1520; otherwise control transfers to 1524. At 1520, control logs the path deviation for the current page. For example, control stores the deviation in Current_Page. Control continues with 1524.

At 1524, control logs the determined distances and associated data for the current page—for example, control may add Result to Current_Page. Control continues with 1526, where control updates Current_Experiment based on the data associated with data stored in Current_Page. Control progresses to 1528, where control determines whether Current_Experiment includes additional pages. If so, control continues with 1532; otherwise, control transfers to 1536. At 1532, control sets Current_Page to the next page stored in Current_Experiment. Control then returns to 1512.

At 1536, control determines whether any of the pages in Current_Experiment include a deviation. If so, control continues with 1540; otherwise, control transfers to 1544. At 1540, control sets the status associated with the distances (Distance_Status) stored in the current experiment to failure. Control then continues with 1548. At 1544, control sets Distance_Status stored in the current experiment to the status of the current experiment (Current_Experiment)—for example, either success or failure. Control continues with 1548.

At 1548, control logs the status associated with the distances stored in the current experiment. For example, control may add Distance_Status to Current_Experiment. Control progresses to 1550, where control updates the loaded eye tracking experiments based on the data associated with the current experiment—in other words, the data stored in Current_Experiment. Control then continues with 1552.

At 1552, control determines whether the loaded eye tracking experiments include another experiment. If so, control continues with 1556; otherwise, control transfers to 1560 where control saves the loaded experiments and control ends. At 1556, control sets Current_Experiment to the next loaded experiment. Control then returns to 1508.

Figure 16:
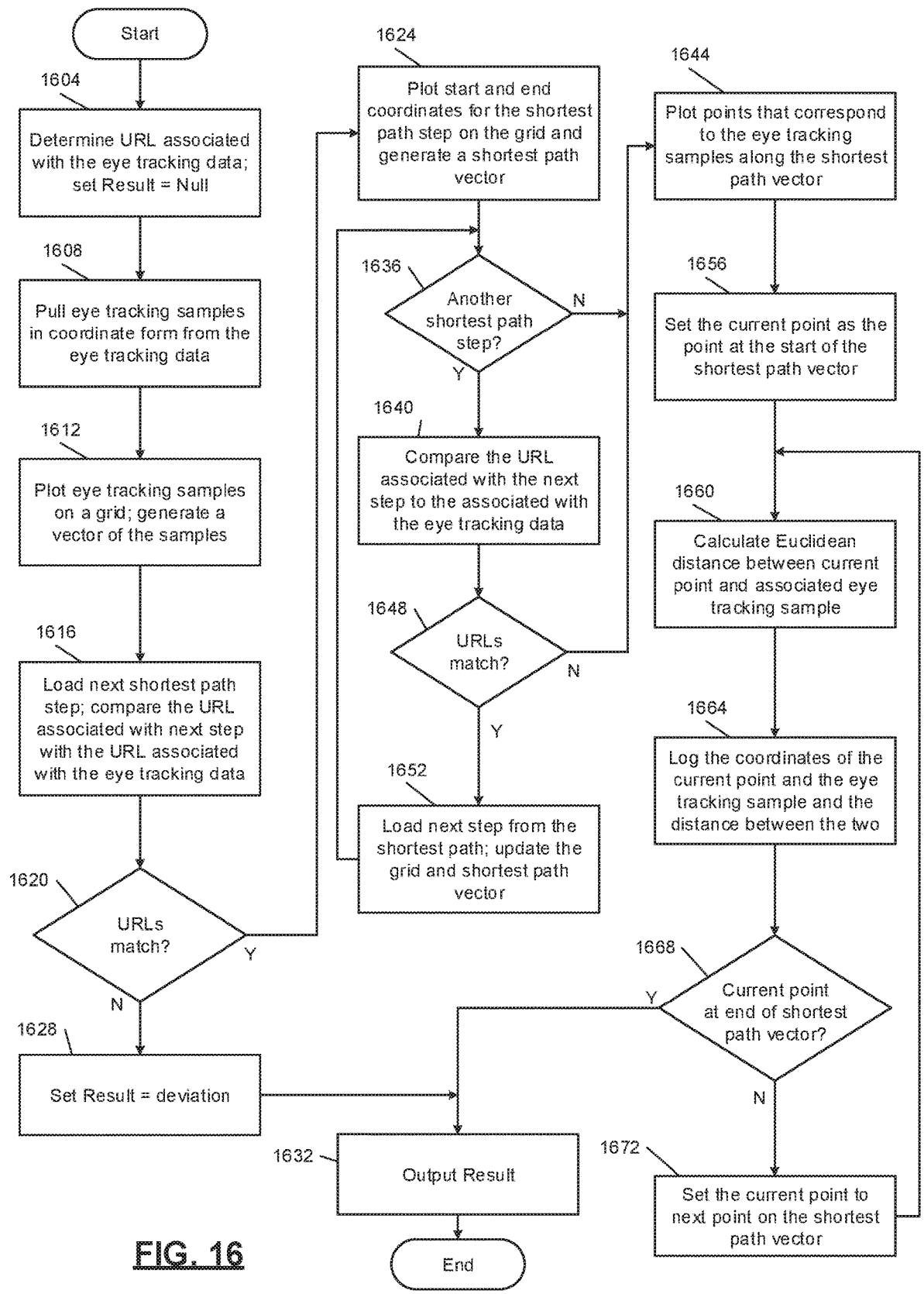
FIG. 16 is a flowchart depicting an example method for determining the distances between tracking data and points along a loaded shortest path for a page of the UI.

FIG. 16 is a flowchart depicting an example method for determining the distances between eye tracking data and points along a loaded shortest path for a page of the UI. Although the example method is described below with respect to the UI testing and enhancement device 110, the method may be implemented in other devices and/or systems. In various implementations, control may be performed by the reinforcement module 160 and/or the distance module 164.

Control begins with 1604 upon receipt of eye tracking data associated with the page of the UI and a queue that contains steps of the shortest path—for example, Current_Page and Temp_Path from 1512 of FIG. 15. At 1604, control determines the URL associated with the eye tracking data and sets Result to Null. Control continues with 1608, where control pulls eye tracking samples in coordinate form from the eye tracking data—for example, Current_Page. Control continues with 1612, where control plots the eye tracking samples on a grid and generates a vector that represents the samples. Control progresses to 1616.

At 1616, control loads a shortest path step—for example, control pops a step from Temp_Path. Control then compares the URL associated with the eye tracking data and the URL associated with the shortest path step. Control progresses to 1620. If the URLs match, control continues with 1624; otherwise, control determines that the eye tracking data deviates from the shortest path and control transfers to 1628. At 1628, control sets the result for the overall determination (Result) to deviation and control continues with 1632. At 1632, control outputs Result and ends.

At 1624, control plots the start and end coordinates of the shortest path step on the grid. Control then generates a shortest path vector between the start and end points of the step. Control progresses to 1636, where control determines whether there is another step in the shortest path—for example, whether the size of Temp_Path is greater than zero. If so, control progresses to 1640; otherwise, control transfers to 1644.

At 1640, control compares the URL associated with the next step in the shortest path with the URL associated with the eye tracking data—for example, control peeks at the next step in Temp_Path without removing the step from the queue. Control then progresses to 1648. If the URLs match, control continues with 1652; otherwise, control transfers to 1644. At 1652, control loads the next shortest path step—for example, control pops a step off of Temp_Path. Control then updates the grid and the shortest path vector based on the next shortest path step. Control then returns to 1636.

At 1644, control plots points that correspond to the tracking samples along the shortest path vector. For example, control plots one point for each plotted eye tracking sample equidistantly along the shortest path vector, beginning at the start of the shortest path vector. Control continues with 1656, where control sets the current point to the point at the start of the shortest path vector. Control then progresses to 1660.

At 1660, control calculates the Euclidean distance between the current point and the eye tracking sample that corresponds to the current point. At 1664, control logs the coordinates of both the current point and the corresponding eye tracking sample, as well as the distance between the two. For example, control may add these values to Result. Control then progresses to 1668 where control determines whether the current point is at the end of shortest path vector. If so, control continues with 1632, where control outputs Results and ends; otherwise, control transfers to 1672. At 1672, control sets the current point to the next point on the shortest path vector and returns to 1660.

Figure 17:
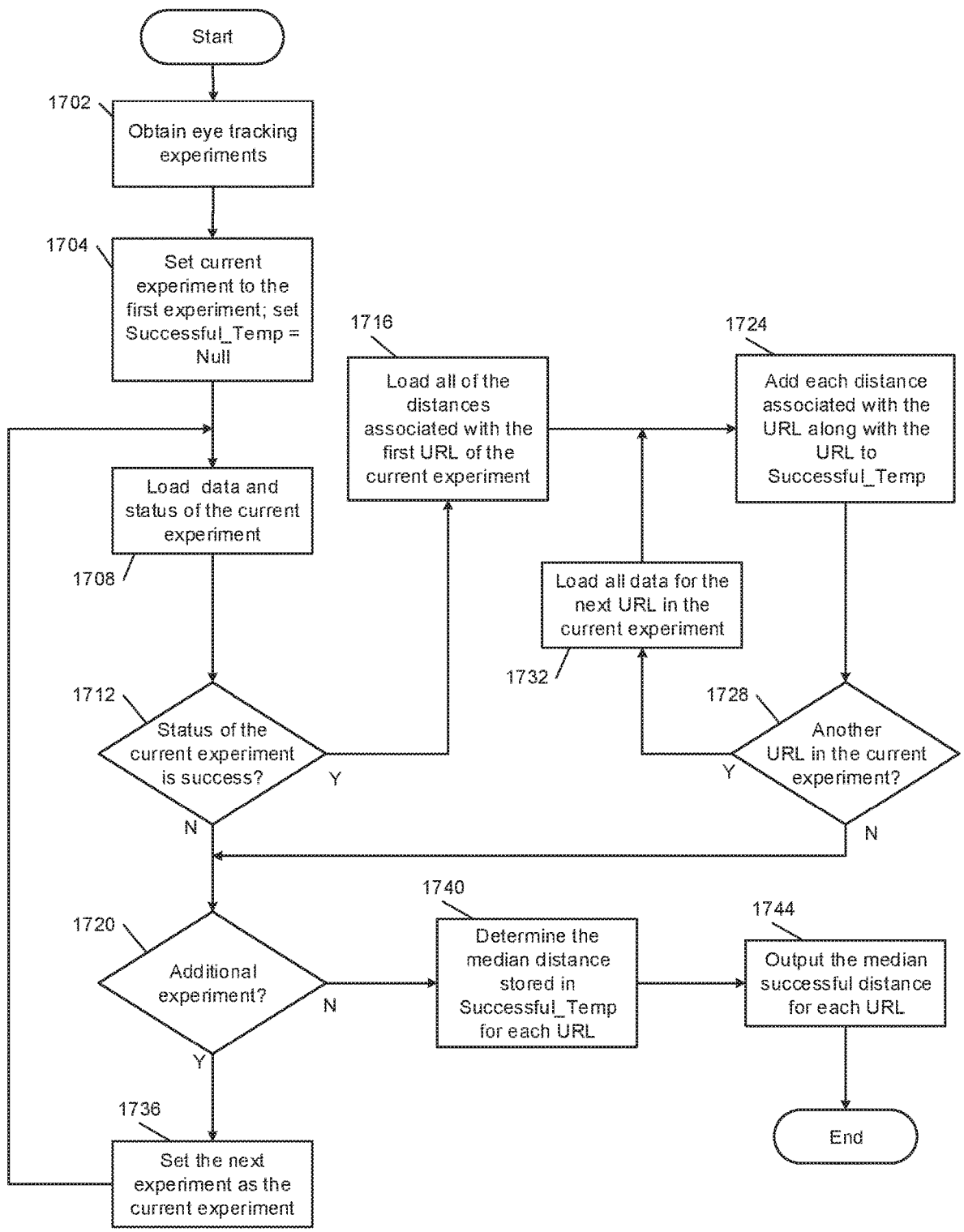
FIG. 17 is a flowchart depicting an example method of determining the median successful distance for each URL in a set of eye tracking experiments based on data stored in the eye tracking experiments.

FIG. 17 is a flowchart depicting an example method of determining the median successful distance for each URL in a set of eye tracking experiments based on data stored in the eye tracking experiments. Although the example method is described below with respect to the UI testing and enhancement device 110, the method may be implemented in other devices and/or systems. In various implementations, control may be performed by the reinforcement module 160 and/or the distance module 164.

Control begins with 1702. At 1702, control obtains eye tracking experiments. In some implementations, control may load previously stored eye tracking experiments—for example, from the storage device 112. In other implements, control may use eye tracking experiments that are already loaded. Control continues with 1704, where control sets the current experiment to the first experiment of the eye tracking experiments and Successful_Temp to Null. Control uses Successful_Temp to store each successful distance and associated URL. Control then progresses to 1708.

At 1708, control loads the data and status of the current experiment. Control continues with 1712, where control determines whether the current experiment is marked as a success—in other words, the test user reached the goal. If so, control continues with 1716; otherwise, control transfers to 1720. At 1716, control loads all of the distances associated with the first URL of the current experiment. Control then progresses to 1724, where control adds each distance associated with the URL along with the URL to Successful_Temp. In other words, each distance stored in Successful_Temp is linked to a URL. Control continues with 1728, where control determines whether there is another URL in the current experiment. If so, control continues with 1732, where control loads all of the distances associated with the next URL in the current experiment and then control returns to 1724; otherwise, control transfers to 1720.

At 1720, control determines whether there is another eye tracking experiment. If so, control continues with 1736; otherwise, control transfers to 1740. At 1736, control loads the data and status of the next experiment and then returns to 1708. At 1740, control determines the median distance stored in Successful_Temp for each URL. Control continues with 1744, where control outputs the median successful distance for each URL in the eye tracking experiments. Control then ends.

Figure 18:
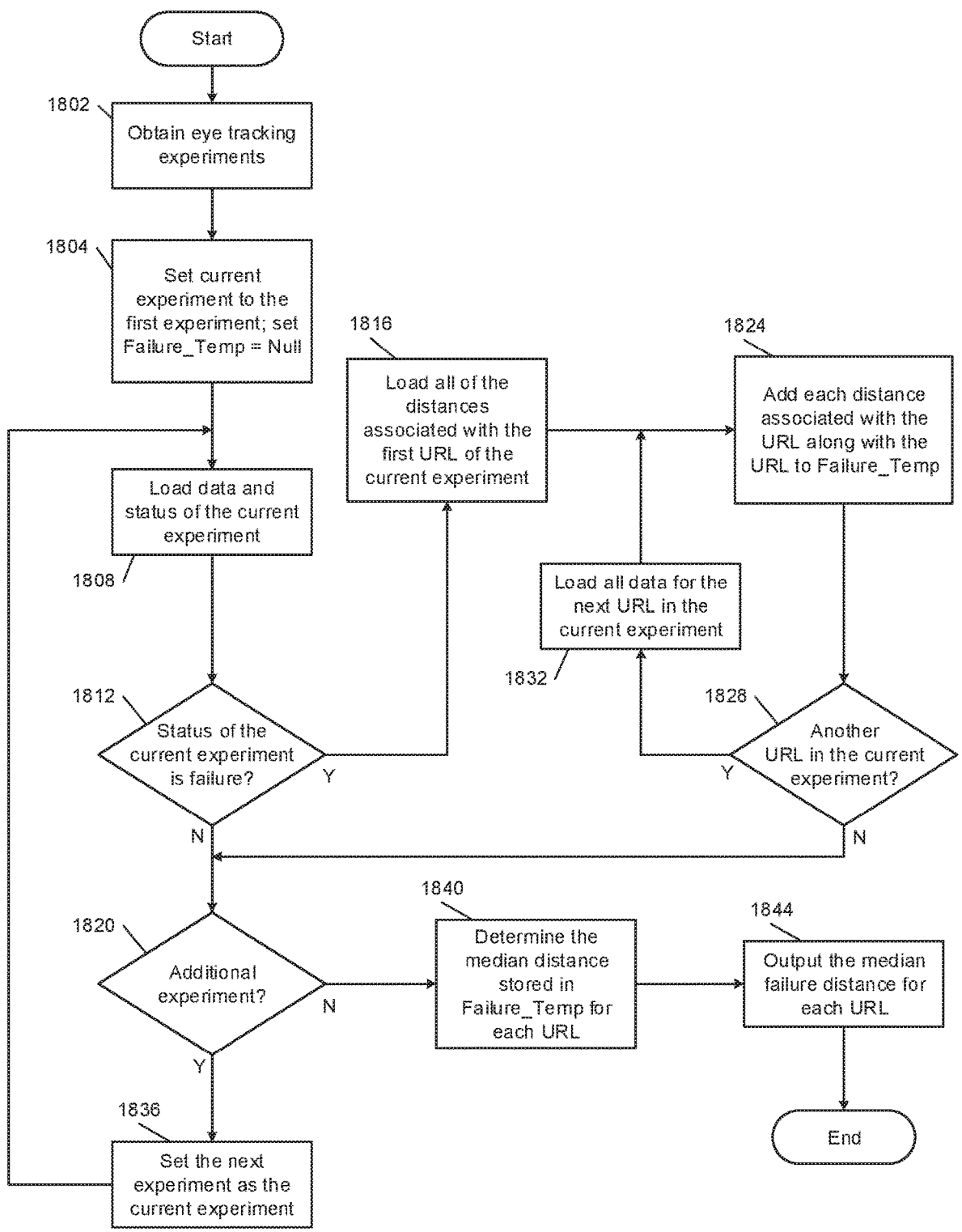
FIG. 18 is a flowchart depicting an example method of determining the median failure distance for each URL in a set of eye tracking experiments based on data stored in the eye tracking experiments.

FIG. 18 is a flowchart depicting an example method of determining the median failure distance for each URL in a set of eye tracking experiments based on data stored in the eye tracking experiments. Although the example method is described below with respect to the UI testing and enhancement device 110, the method may be implemented in other devices and/or systems. In various implementations, control may be performed by the reinforcement module 160 and/or the distance module 164.

Control begins with 1802, where control obtains the eye tracking experiments. In some implementations, control may load previously stored eye tracking experiments—for example, from the storage device 112. In other implements, control may use eye tracking experiments that are already loaded. Control continues with 1804, where control sets the current experiment to the first experiment of the eye tracking experiments and Failure_Temp to Null. Control uses Failure_Temp to store each failure distance and associated URL. Control then progresses to 1808.

At 1808, control loads the data and status of the current experiment. Control continues with 1812 where control determines whether the current experiment is marked as a failure. An experiment may be marked as a failure in response to either the test user failing to reach the goal or the tracking data deviating from the shortest path. If the experiment is marked as a Failure, control continues with 1816; otherwise, control transfers to 1820. At 1816, control loads all of the distances associated with the first URL of the current experiment. Control then progresses to 1824, where control adds each distance associated with the URL along with the URL to Failure_Temp. In other words, each distance stored in Failure_Temp is linked to a URL. Control continues with 1828, where control determines whether there is another URL in the current experiment. If so, control continues with 1832, where control loads all of the distances associated with the next URL in the current experiment and then control returns to 1824; otherwise, control transfers to 1820.

At 1820, control determines whether there is another eye tracking experiment. If so, control continues with 1836; otherwise, control transfers to 1840. At 1836, control loads the data and status of the next experiment and then returns to 1808. At 1840, control determines the median distance stored in Failure_Temp for each URL. Control continues with 1844, where control outputs the median failure distance for each URL in the eye tracking experiments. Control then ends.

Figure 19:
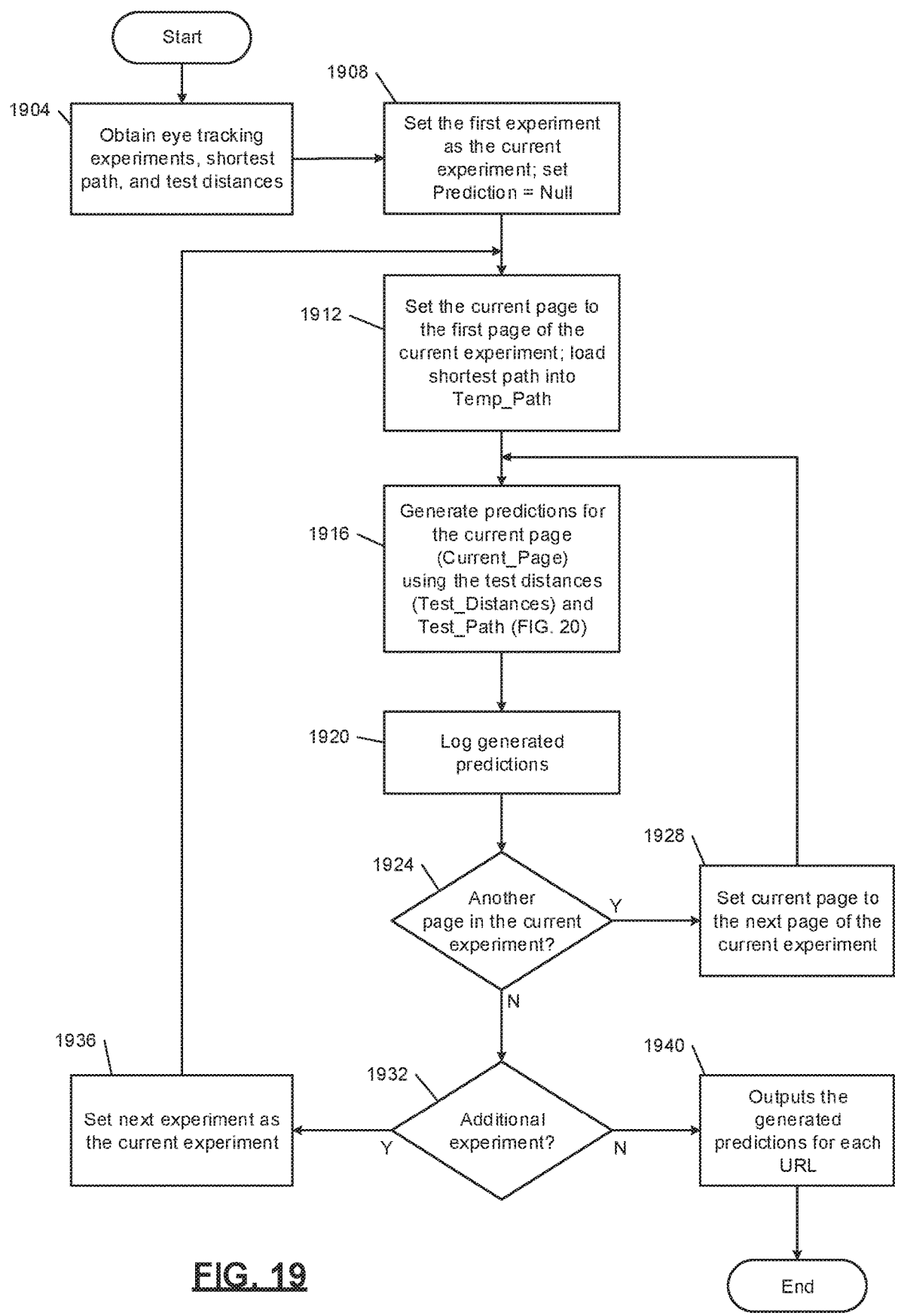
FIG. 19 is a flowchart depicting an example method for comparing predictions of outcomes of eye tracking experiments with previously stored results.

FIG. 19 is a flowchart depicting an example method for comparing predictions of the outcomes of eye tracking experiments with previously stored results. The predictions are based on a shortest path to a goal and a set of test distances that represent an acceptable deviation from the shortest path. Although the example method is described below with respect to the UI testing and enhancement device 110, the method may be implemented in other devices and/or systems. In various implementations, control may be performed by the reinforcement module 160, the distance module 164, and/or the prediction module 168.

Control begins with 1904, where control obtains the eye tracking experiments, shortest path, and test distances. In some implementations, control may load previously stored eye tracking experiments, a shortest path, and/or test distances—for example, from the storage device 112. In other implements, control may use eye tracking experiments, a shortest path, and/or test distances that are already loaded. Control continues with 1908, where control sets the current experiment to the first loaded eye tracking experiment and sets Prediction to Null. Control uses Prediction to store the generated predictions for each URL. Control continues with 1912, where control sets the current page to the first page stored in the current experiment. At 1912, control also loads the shortest path into a temporary queue (Temp_Path). Control then progresses to 1916.

At 1916, control generates predictions for the current page using the test distances and the shortest path steps stored in the temporary queue (Temp_Path). For example, control may perform the method disclosed in FIG. 20 to generate the predictions. Control then progresses to 1920, where control logs the generated prediction—for example, control adds the prediction to Prediction. Control then progresses to 1924.

At 1924, control determines whether there is another page in the current experiment. If so, control progresses to 1928; otherwise, control transfers to 1932. At 1928, control sets the current page to the next page in the current experiment. Control then returns to 1916.

At 1932, control determines whether there is another experiment. If so, control continues with 1936; otherwise, control transfers to 1940. At 1940, control outputs the generated predictions for each URL (Prediction). Control then ends.

Figure 20:
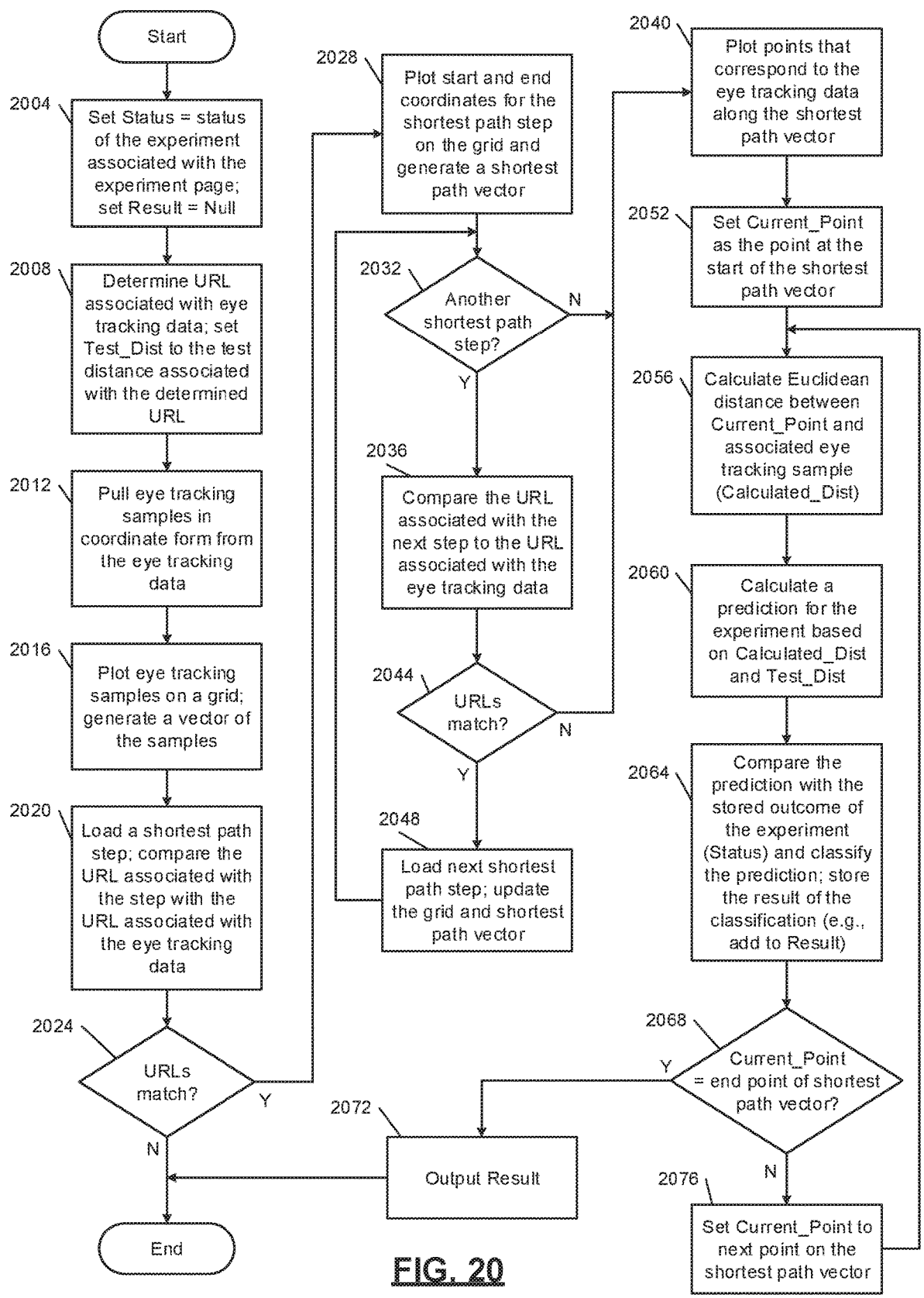
FIG. 20 is a flowchart depicting an example method for comparing a prediction of an outcome of an eye tracking experiment with previously stored results.

FIG. 20 is a flowchart depicting an example method for comparing a prediction of an outcome of an eye tracking experiment, based on an analysis of a single page of the eye tracking experiment, with previously stored results. Although the example method is described below with respect to the UI testing and enhancement device 110, the method may be implemented in other devices and/or systems. In various implementations, control may be performed by the reinforcement module 160, the distance module 164, and/or the prediction module 168.

Control begins with 2004, upon receipt of a page of the eye tracking experiment, test distances, and a queue that contains steps of the shortest path—for example, Current_Page, Test Distances, and Temp_Path from 1916 of FIG. 19. At 2004, control determines and stores the status of the experiment—such as success or failure—associated with the page of eye tracking data. For example, control sets Status to the stored outcome of the experiment associated with the received page. Control also initiates Result to Null. Control uses Result to store the results of the comparisons for the page of eye tracking data. Control then continues with 2008.

At 2008, control determines the URL associated with the page of eye tracking data. Then control determines and stores the test distance associated with the determined URL (Test_Dist). Control continues with 2012, where control pulls eye tracking samples in coordinate form from the eye tracking data—for example, Current_Page. Control then progresses to 2016, where control plots the eye tracking samples on a grid and generates a vector that represents the samples. Control continues with 2020.

At 2020, control loads a shortest path step—for example, control pops a step from Temp_Path. Control then compares the URL associated with the eye tracking data and the URL associated with the shortest path step. Control progresses to 2024. If the URLs match, control continues with 2028; otherwise, control determines that the eye tracking data and the shortest path step are not associated with the same screen of the UI and control ends.

At 2028, control plots the start and end coordinates of the shortest path step on the grid. Control then generates a shortest path vector between the start and end points of the step. Control progresses to 2032, where control determines whether there is another step in the shortest path—for example, the size of Temp_Path is greater than zero. If so, control progresses to 2032; otherwise, control transfers to 2040.

At 2032, control compares the URL associated with the next step in the shortest path with the URL associated with the eye tracking data—for example, control peeks at the next step in Temp_Path without removing the step from the queue. Control then progresses to 2044. If the URLs match, control continues with 2048; otherwise, control transfers to 2040. At 2048, control loads the next shortest path step—for example, control pops a step off of Temp_Path. Control then updates the grid and the shortest path vector based on the step next. Control then returns to 2032.

At 2040, control plots points that correspond to the plotted tracking samples along the shortest vector. For example, control plots one point for each plotted eye tracking sample equidistantly along the shortest path vector, beginning at the start of the vector. Control continues with 2052, where control sets the current point (Current Point) to the point at the start of the shortest path vector. Control then progresses to 2056.

At 2056, control calculates the Euclidean distance between Current Point and the eye tracking sample that corresponds to CurrentPoint (Calculated_Dist). Control progresses to 2060, where control calculates a prediction of the outcome of the experiment based on the distance between tCurrent_Point and the associated tracking sample and the test distance for the URL associated with Current_Point and tracking sample. For example, control determines if Calculated_Dist is greater than Test_Dist. If so, control predicts that the experiment is a failure; otherwise, control predicts that the experiment is a success. Control then progresses to 2064.

At 2064, control compares the calculated prediction with the previously stored status of the experiment (Status) and classifies the prediction. For example, if the prediction and Status match, control determines that the prediction is a success. If control predicted a failed experiment and Status indicates a success, control determines that the prediction is a false positive. Conversely, if control predicted a successful experiment and Status indicates a failure, control determines that the prediction is a false negative. Control then stores the determined prediction status. For example, control adds the determined status along with the associated URL and test distance (Test_Dist) to Result. Control then progresses to 2068.

At 2068, control determines whether Current_Point is at the end of the shortest path vector. If so, control continues with 2072, where control outputs Result and ends; otherwise, control transfers to 2076. At 2076, control sets the current point to the next point on the shortest path vector. Control then returns to 2056.

Figure 21:
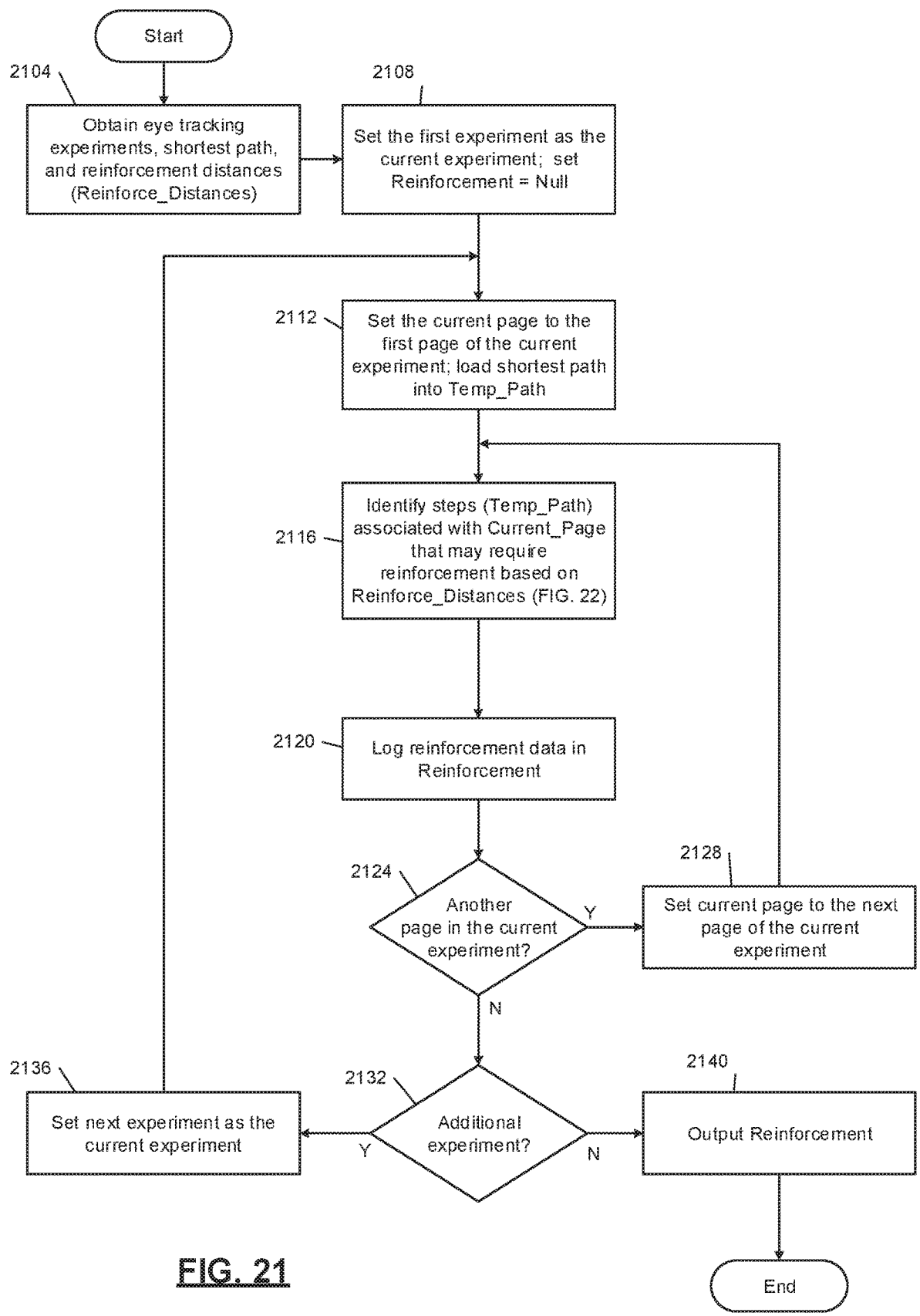
FIG. 21 is a flowchart depicting an example method for determining the steps of a shortest path to a goal in a UI that may require reinforcement.

FIG. 21 is a flowchart depicting an example method for determining the steps of a shortest path to a goal in a UI that may require reinforcement. The determination is based on eye tracking experiments and predetermined reinforcement distances for each URL in the UI. Although the example method is described below with respect to the UI testing and enhancement device 110, the method may be implemented in other devices and/or systems. In various implementations, control may be performed by the reinforcement module 160.

Control begins with 2104, where control obtains eye tracking experiments, the shortest path, and reinforcement distances. In some implementations, control may load previously stored eye tracking experiments, a shortest path, and/or reinforcement distances—for example, from the storage device 112. Control continues with 2108, where control sets the current experiment to the first loaded eye tracking experiment and Reinforcement to Null. Control uses Reinforcement to store information regarding which steps require reinforcement. Control continues with 2112, where control sets the current page to the first page stored in the current experiment. At 2112, control also loads the shortest path into a temporary queue (Temp_Path). Control then progresses to 2116.

At 2116, control generates reinforcement data that identifies the steps associated with the current page that may require reinforcement based on the eye tracking data of the current page and the reinforcement distance. For example, control may perform the method disclosed in FIG. 21 to identify the steps. Control then progresses to 2120, where control logs the generated reinforcement data—for example, control adds the data to Reinforcement. Control then progresses to 2124.

At 2124, control determines whether there is another page in the current experiment. If so, control progresses to 2128; otherwise, control transfers to 2132. At 2128, control sets the current page to the next page in the current experiment. Control then returns to 2116.

At 2132, control determines whether there is another experiment. If so, control continues with 2136; otherwise, control transfers to 2140. At 2136, control sets the next experiment as the current experiment and then control returns to 2112. At 2140, control outputs the reinforcement data (Reinforcement). Control then ends.

Figure 22:
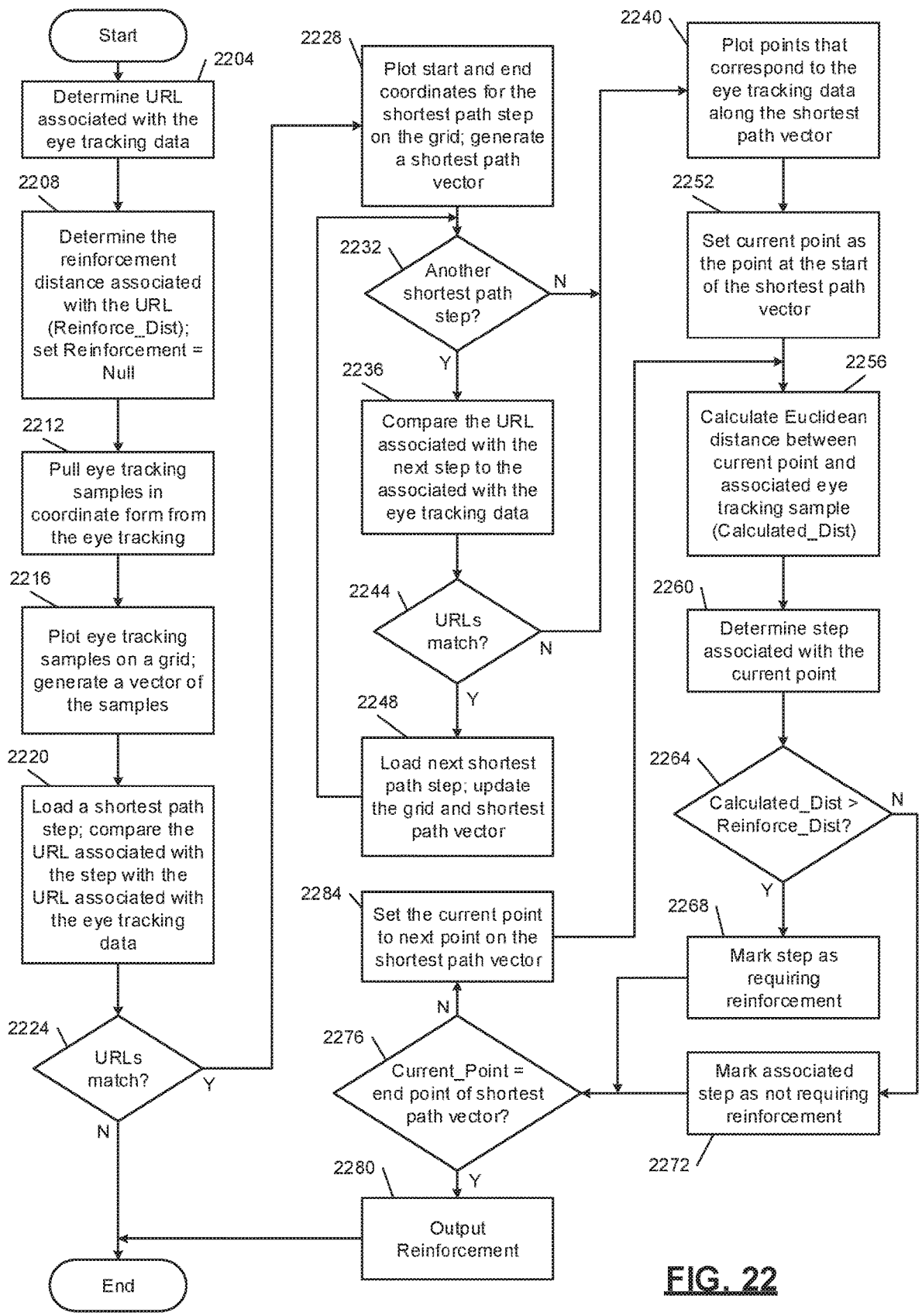
FIG. 22 is a flowchart depicting an example method for determining steps of a shortest path associated with a page of an eye tracking experiment that may need reinforcement.

FIG. 22 is a flowchart depicting an example method for determining steps of a shortest path associated with a page of an eye tracking experiment that may need reinforcement. Although the example method is described below with respect to the UI testing and enhancement device 110, the method may be implemented in other devices and/or systems. In various implementations, control may be performed by the reinforcement module 160.

Control begins with 2204, upon receipt of a page of the eye tracking experiment, reinforcement distances, and a queue that contains steps of the shortest path—for example, Current_Page, Test_Distances, and Temp_Path from 2116 of FIG. 21. At 2204, control determines the URL associated with the page of eye tracking data. Control progresses to 2208, where control determines the reinforcement distance for the URL associated with the page of the eye tracking data and sets Reinforcement to Null. Control uses Reinforcement to store information regarding which steps require reinforcement. Control then continues with 2212.

At 2212, control pulls eye tracking samples in coordinate form from the eye tracking data—for example, Current_Page. Control then progresses to 2216, where control plots the pulled eye tracking samples on a grid and generates a vector that represents the samples. Control continues with 2220.

At 2220, control loads a shortest path step—for example, control pops a step from Temp_Path. Control then compares the URL associated with the eye tracking data and the URL associated with the loaded shortest path step. Control progresses to 2224. If the URLs match, control continues with 2228; otherwise, control determines that the eye tracking data and the shortest path step are not associated with the same screen of the UI and control ends.

At 2228, control plots the start and end coordinates of the loaded shortest path step on the grid. Control then generates a shortest path vector between the start point and the end point of the step. Control progresses to 2232, where control determines whether there is another step in the shortest path—for example, the size of Temp_Path is greater than zero. If so, control progresses to 2236; otherwise, control transfers to 2240.

At 2232, control compares the URL associated with the next step in the shortest path with the URL associated with the eye tracking data—for example, control peeks at the next step in Temp_Path without removing the step from the queue. Control then progresses to 2244. If the URLs match, control continues with 2248; otherwise, control transfers to 2240. At 2248, control loads the next shortest path step—for example, control pops a step from Temp_Path. Control updates the grid and the shortest path vector based on the loaded shortest path step. Control then returns to 2232.

At 2240, control plots points that correspond to the tracking samples along the shortest vector. For example, control plots one point for each plotted eye tracking sample equidistantly along the shortest path vector, beginning at the start of the vector. Control continues with 2252, where control sets the current point to the point at the start of the shortest path vector. Control then progresses to 2256.

At 2256, control calculates the Euclidean distance (Calculated_Dist) between the current point and the eye tracking sample that corresponds to the current point. Control progresses to 2260, where control determines the shortest path step associated with the current point. Control then continues with 2264.

At 2264, control determines whether the calculated distance (Calculated_Dist) is greater than the reinforcement distance (Reinforce_Dist). If so, control determines that the step may need reinforcement and control continues with 2268; otherwise, control transfers to 2272. At 2268, control adds a reference to the shortest path step associated with the current point and an indication that the step may require reinforcement to Reinforcement. Control then continues with 2276. At 2272, control adds a reference to the shortest path step associated with the current point and an indication that the step does not require reinforcement to Reinforcement. Control then progresses to 2276.

At 2276, control determines whether the current point is at the end of the shortest path vector. If so, control continues with 2280; otherwise, control transfers to 2284. At 2284, control sets the current point to the next point on the shortest path vector. Control then returns to 2256. At 2280, control outputs the determined reinforcement results for the shortest path steps associated with the eye tracking data—for example, control outputs Reinforcement. Control then ends.

Figure 23A:
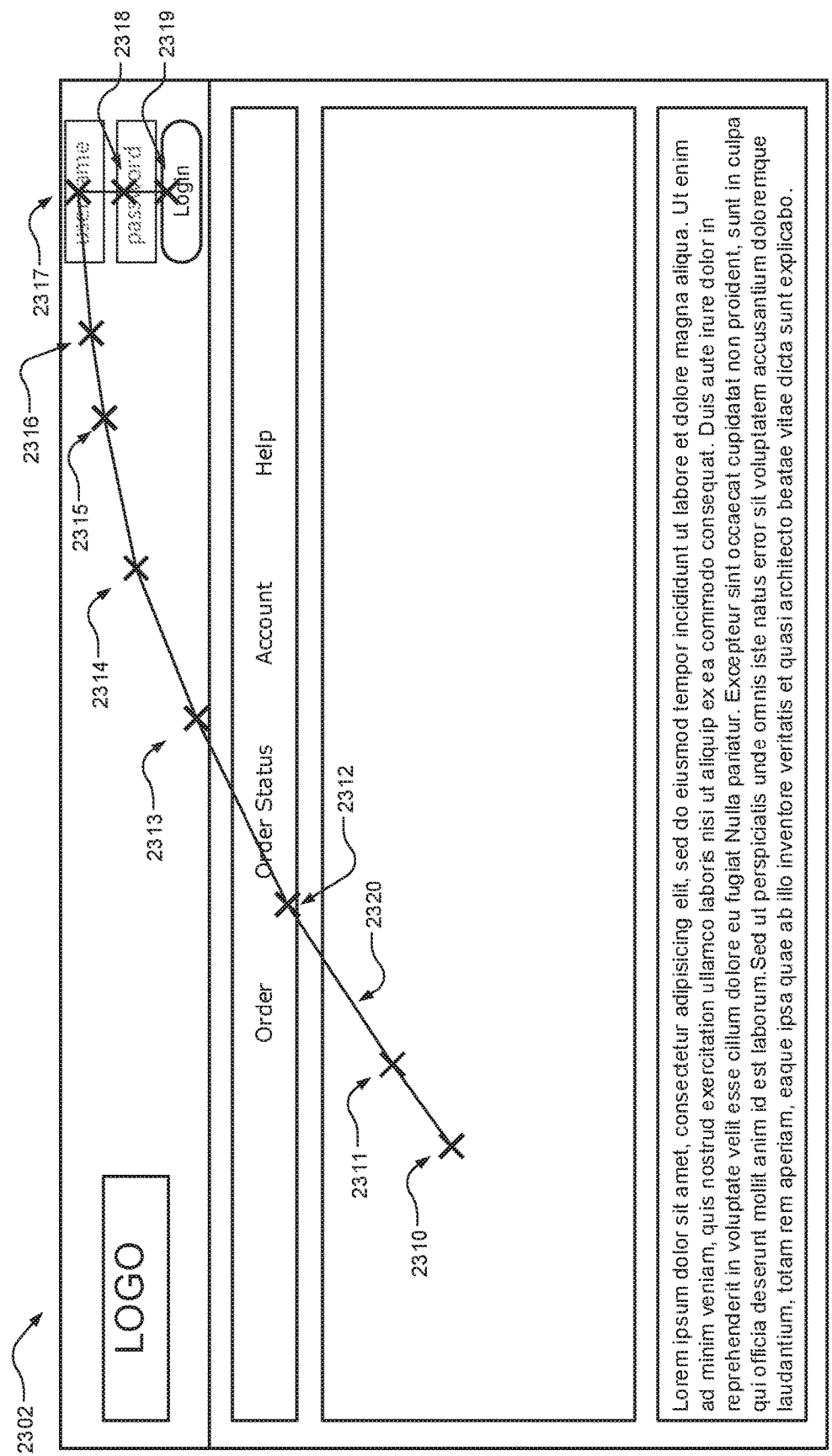
FIGS. 23A-23E are visual representations of an example process of generating an eye tracking vector and a shortest path vector for a page of a UI.

FIGS. 23A-23E are visual representations of the process of generating an example eye tracking vector and an example shortest path vector for a page of a UI. FIG. 23A shows an example page 2302 of a UI. First through tenth eye tracking samples 2310-2319 of an eye tracking experiment that correspond to the page 2302 are plotted on the UI. Each eye tracking sample represents the point of focus of a test user navigating the UI at the time the sample was captured. As an example, the eye tracking samples 2310-2319 may represent the location of a mouse cursor that was captured once every two seconds. An eye tracking vector 2320 that includes each of the plotted eye tracking samples 2310-2319 is generated. The eye tracking vector may be piecewise linear or smoothed and is representative of the path taken by the test user during the eye tracking experiment.

Figure 23B:
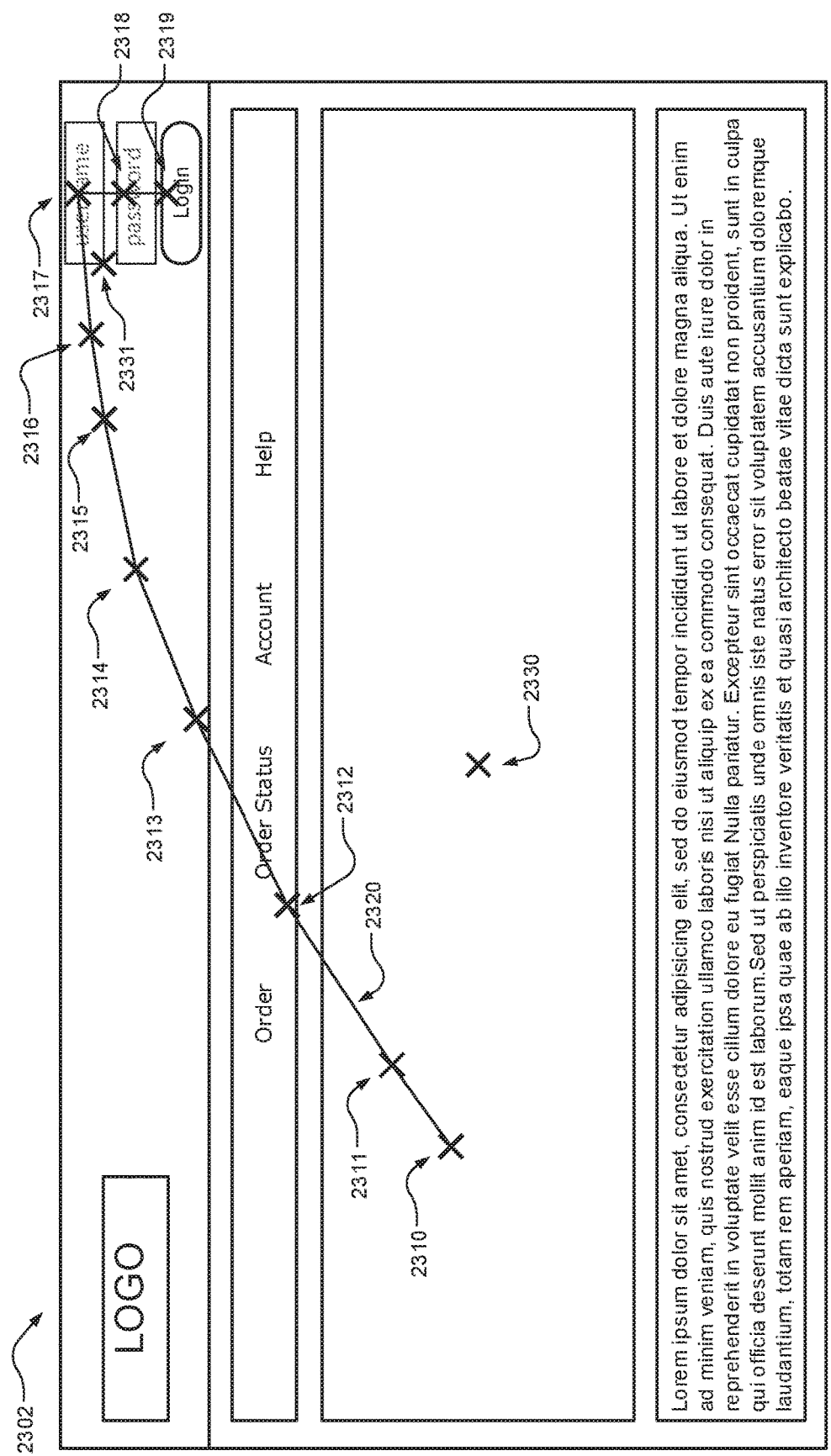
Figure 23C:
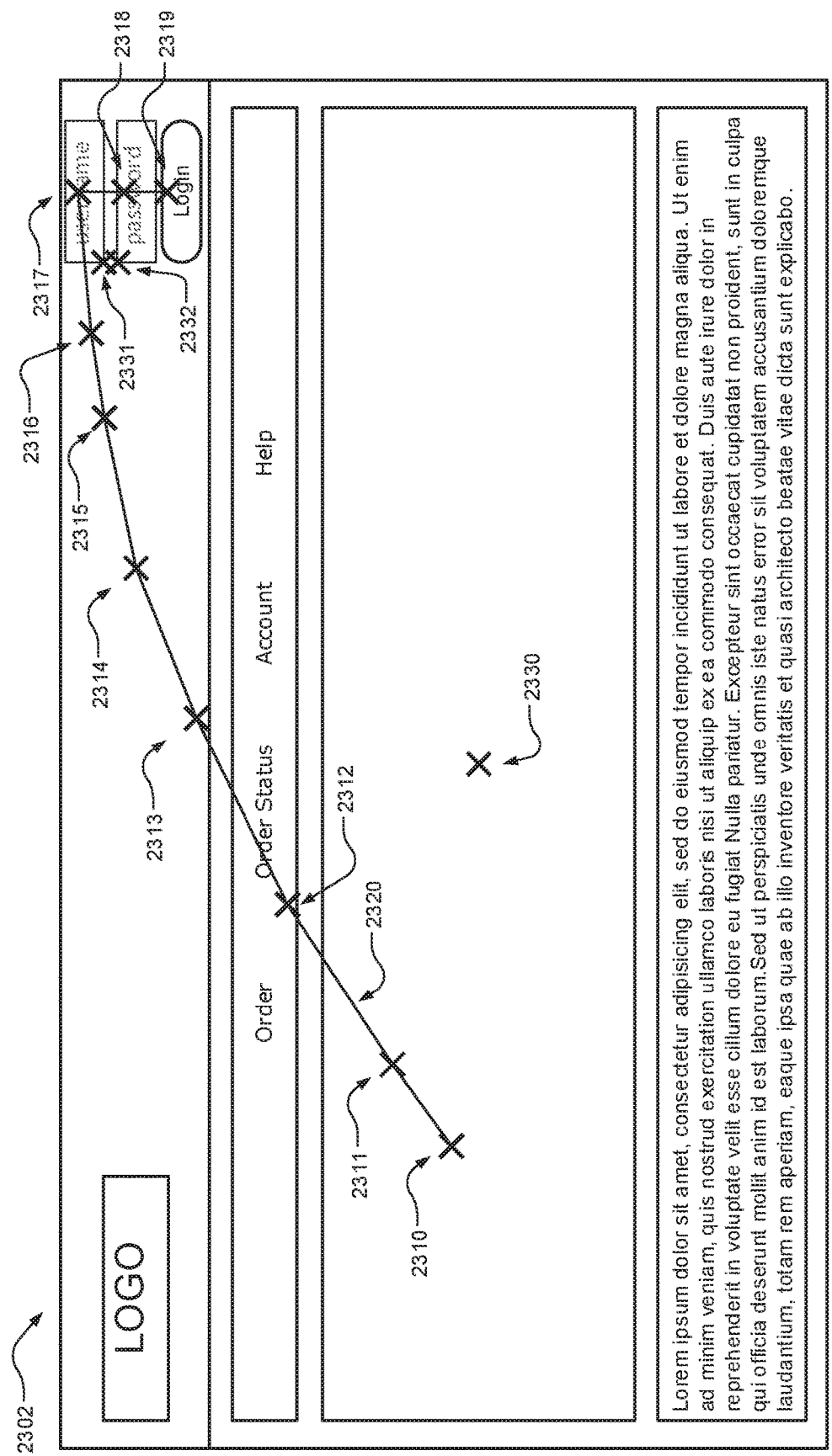
Figure 23D:
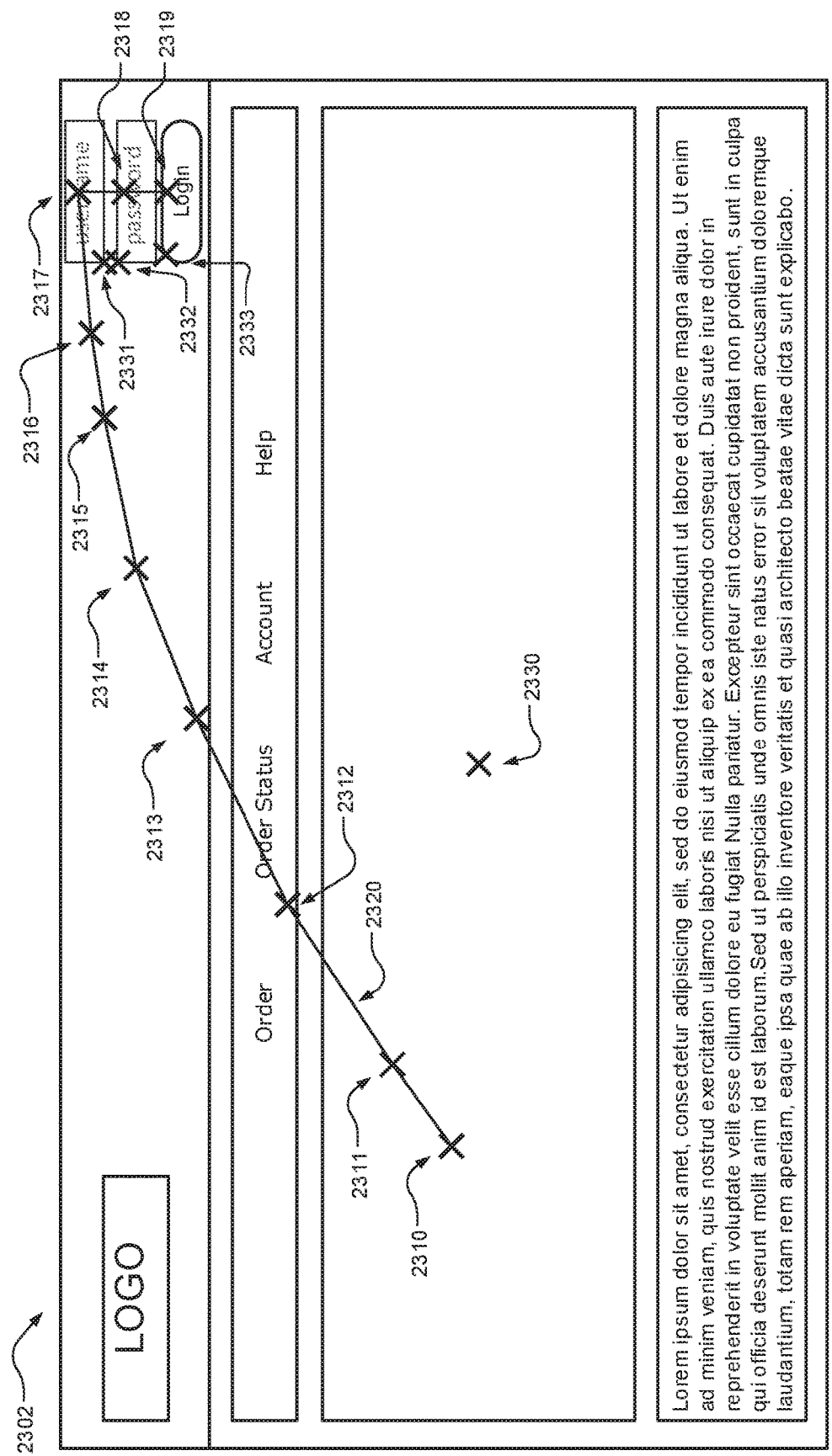

In FIG. 23B, a first shortest path point 2330 that corresponds to the beginning of a first shortest path step and a second shortest path point 2331 that corresponds to the end of the first shortest path step are plotted on the page 2302. In FIG. 23C, a third shortest path point 2332 that corresponds to the end of a second shortest path step that began at the second shortest path point 2331 is plotted on the page 2302. In FIG. 23D, a fourth shortest path point 2333 that corresponds to the end of a third shortest path step that began at the third shortest path point 2332 is plotted on the page 2302.

Figure 23E:
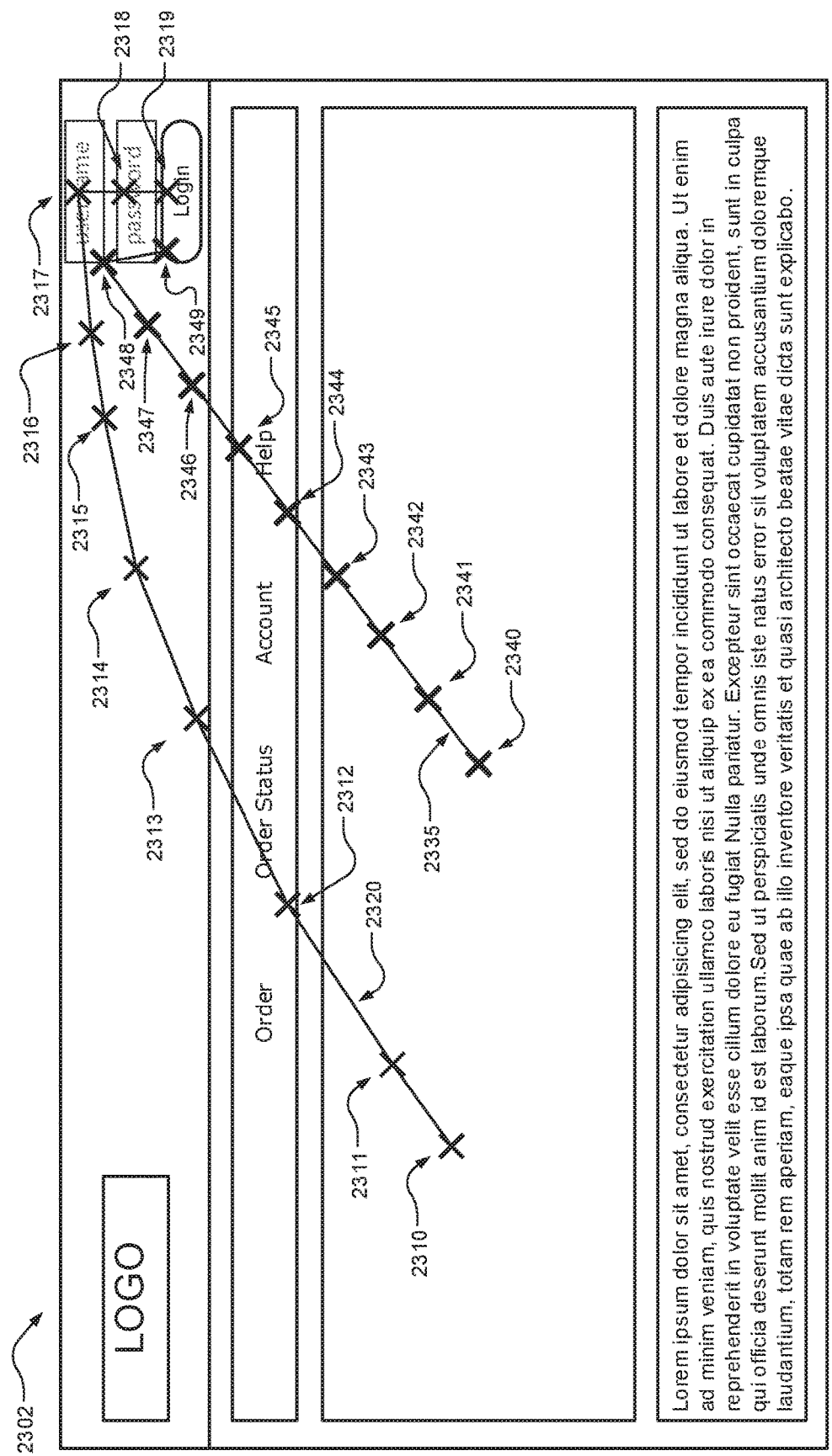

In FIG. 23E, a shortest path 2335 is shown on the page 2302. The shortest path 2335 is a vector between the first shortest path point 2330, the second shortest path point 2331, the third shortest path point 2332, and the fourth shortest path point 2333. The shortest path 2335 represents a path on the page 2302 of the UI that corresponds to the shortest path.

First through tenth shortest path points 2340-2349 are equidistantly plotted along the shortest path 2335. Each point of the shortest path points 2340-2349 corresponds to a similarly numbered and labeled sample of the plotted eye tracking samples 2310-2319 (that is, the final digits match). For example, the first shortest path point 2340 corresponds to the first eye tracking sample 2310 and the second shortest path point 2342 corresponds to the second eye tracking sample 2311.

The shortest path vector points 2340-2349 and the corresponding the eye tracking samples 2310-2319 depicted in FIG. 23E may be used to determine the reinforcement distance for the page 2302. For example, respective distances between the shortest path vector points 2340-2349 and the corresponding eye tracking samples 2310-2319 may radiate how far the test user deviated from the shortest path. Depending on the outcome of the eye tracking experiment, these distances may be used to determine the median successful distance or the median failure distance for the page 2302. In addition, these distances may be used to test the randomly generated reinforcement distances for the page 2302.

Customer Migration

FIG. 24 is a block diagram of an example customer migration system 2400. The customer migration system 2400 includes an interactive voice response (IVR) platform 2402. The IVR platform 2402 includes an IVR device 2404 and an IVR server 2408. The customer migration system 2400 may also include a web application server 2412 and a cobrowse server 2416.

An organization may use the IVR device 2404 to implement a customer service number that a user can call to request information or perform a task. For example, the user may use a telephone 2420 to access the IVR device 2404 via a public switched telephone network (PSTN) 2422, Voice over Internet Protocol (VoIP), or a combination of the two. The IVR device 2404 receives a voice request from the user and communicates with the IVR server 2408 to determine an appropriate response to the user's request.

In some implementations, the IVR device 2404 may use the speech recognition module 2424 to translate verbal inputs provided by the user over the telephone 2420 to a voiceXML browser 2426. In other implementations, the IVR device 2404 may outsource the translation of the verbal inputs to a remote service. For example, the the IVR device 2404 may transmit the verbal inputs received by the voiceXML browser 2426 to the remote service and receive a translation or transcription of the verbal inputs from the remote service. The voiceXML browser 2426 provides the translation to a voiceXML application 2428 of the IVR server 2408.

The voiceXML application 2428 may determine that the user can complete the request using a web application 2430 hosted at the web application server 2412. In response to determining that the user can complete the request using the web application 2430, the voiceXML application 2428 requests a cobrowse configuration from the cobrowse configuration module 2432. The cobrowse configuration module 2432 provides a cobrowse configuration associated with the user's request to the voiceXML application 2428. The cobrowse configuration is used to establish a cobrowse session on the cobrowse server 2416. A cobrowse session provides the voiceXML application 2428 with the current state of the web application 2430 accessed by the user-in other words, the current state of a UI as viewed by the user.

Upon receiving the cobrowse configuration, the voiceXML application 2428 transmits a prompt that instructs the user to access the web application 2430, initiate a cobrowse session, and provide the IVR device 2404 with the session ID of the cobrowse session. The voiceXML browser 2426 receives the prompt and generates an audio prompt for the user—for example, the voiceXML browser 2426 may use the text to speech module 2436 to generate the audio prompt.

The user may access the web application 2430 using a computing device 2438 via the internet 2440. The computing device 2438 may be a desktop computer, a laptop computer, a tablet, a smartphone, or any other computing device able to access the web application server 2412. In some implementations, the user may click on a button within the UI of the loaded web application 2430 to initiate the cobrowse session.

In response to receiving the request to initiate a cobrowse session, the web application 2430 uses a web server cobrowse client 2442 to communicate with the cobrowse server 2416 to initiate a cobrowse session 2444. Upon initiating the cobrowse session 2444, the cobrowse server transmits the session ID of the cobrowse session 2444 to the web server cobrowse client 2442. The web application 2430 displays the session ID in the UI of the web application 2430. Upon receiving the session ID of the cobrowse session 2444, the web server cobrowse client 2442 sends the DOM of the current state of the UI of the web application 2430 to the cobrowse session 2444. Each time the state of the UI of the web application 2430 changes, the web server cobrowse client 2442 sends a new DOM to the cobrowse session 2444.

The user may provide the session ID to the IVR device 2404. The voiceXML browser 2426 translates the session ID and provides it to the voiceXML application 2428. The voiceXML application 2428 provides the translated session ID to a headless browser 2446. The headless browser 2446 uses an IVR cobrowse client 2448 to transmit the translated session ID to the cobrowse session 2444. The cobrowse server 2416, the web server cobrowse client 2442, the cobrowse session 2444, and the IVR cobrowse client 2448 form a cobrowse platform. In some implementations, the cobrowse platform may be provided by a remote service, which may be operated by a third party.

In response to receiving the session ID, the cobrowse session 2444 transmits the DOM of the current state of the UI of the web application 2430 to the IVR cobrowse client 2448, which passes the DOM the headless browser 2446. The headless browser 2446 provides the DOM to the voiceXML application 2428. The voiceXML application 2428 may use the headless browser 2446 and the IVR cobrowse client 2448 to obtain the current DOM of the cobrowse session 2444. In this way, the voiceXML application is able to determine the current state of the UI of the web application 2430.

The voiceXML application 2428 may use the cobrowse configuration module 2432 to provided prompts and reinforcements to the user based on the goal associated with the user's request and the current state of the UI. For example, the cobrowse configuration module 2432 includes information regarding the goal, such as a shortest path to the goal, prompts for each step of the shortest path, and any reinforcements that are associated with the shortest path. In some implementations, the cobrowse configuration module 2432 may include information generated by the UI testing and enhancement device 110 of the system 100. In other implementations, the cobrowse configuration module 2432 may include information generated by another device and/or system.

FIG. 25 is a sequence diagram depicting example requests and associated responses between the user, the IVR device 2404, the voiceXML application 2428, the cobrowse configuration module 2432, the headless browser 2446, the IVR cobrowse client 2448, the cobrowse server 2416, and the web application server 2412 during an example initiation of a cobrowse session.

The sequence diagram begins with the user providing an audio request for a transaction 2510 to the IVR device 2404. The IVR device 2404 translates the request using the speech recognition module 2424 and transmits the translated request 2514 to the voiceXML application 2428. In response to receiving the translated request, the voiceXML application 2428 requests a cobrowse configuration 2516 associated with the translated request from the cobrowse configuration module 2432. The cobrowse configuration module 2432 responds by providing a cobrowse configuration 2520 to the voiceXML application 2428.

In response to receiving the cobrowse configuration, the voiceXML application 2428 transmits a cobrowse prompt 2524 to the IVR device 2404. The IVR device 2404 then provides the user with a cobrowse prompt 2528 that instructs the user to start a cobrowse session using the web application 2430 and provide the IVR device 2404 with the session ID of the cobrowse session. For example, the IVR device 2404 may use the text to speech module 2436 to generate an audio prompt that is presented to the user through the telephone 2420. The IVR device 2404 then waits 2532 for a response from the user—for example, the user providing a session ID of the cobrowse session.

Upon hearing the instructions to start a cobrowse session, the user sends a request to start a cobrowse session 2536 to the web application server 2412. In response to receiving the request to start a cobrowse session, the web application server 2412 transmits a request for a cobrowse session 2540 to the cobrowse server 2416. In response to receiving the cobrowse session request, the cobrowse server 2416 begins a cobrowse session and returns the session ID of the cobrowse session 2544 to the web application server 2412. In response to receiving the session ID, the web application server 2412 provides the session ID 2548 to the user. For example, the web application server 2412 displays the session ID in the UI of the web application 2430.

The user then provides the session ID 2552 to the IVR device 2404. In response to receiving the session ID from the user, the IVR device 2404 translates the session ID and transmits the translated session ID 2556 to the voiceXML application 2428. The voiceXML application 2428 transmits a request to connect to the cobrowse session 2560 to the headless browser 2446. The request to connect to the cobrowse session includes the translated session ID. The headless browser 2446 sends the request to connect to the cobrowse session 2564 to the IVR cobrowse client 2448. In response to receiving the request to connect, the IVR cobrowse client 2448 transmits a request 2568 to connect to the cobrowse session to the cobrowse server 2416.

In response to receiving the request to connect, the cobrowse server 2416 retrieves the current DOM from the cobrowse session 2444 and transmits the current DOM 2572 to the IVR cobrowse client 2448, which then provides the current DOM 2576 to the headless browser 2446. The headless browser 2446 then provides the current DOM 2580 to the voiceXML application 2428. The voiceXML application 2428 uses the current DOM to monitor the user's progress with respect to reaching the goal in the UI.

Figure 26:
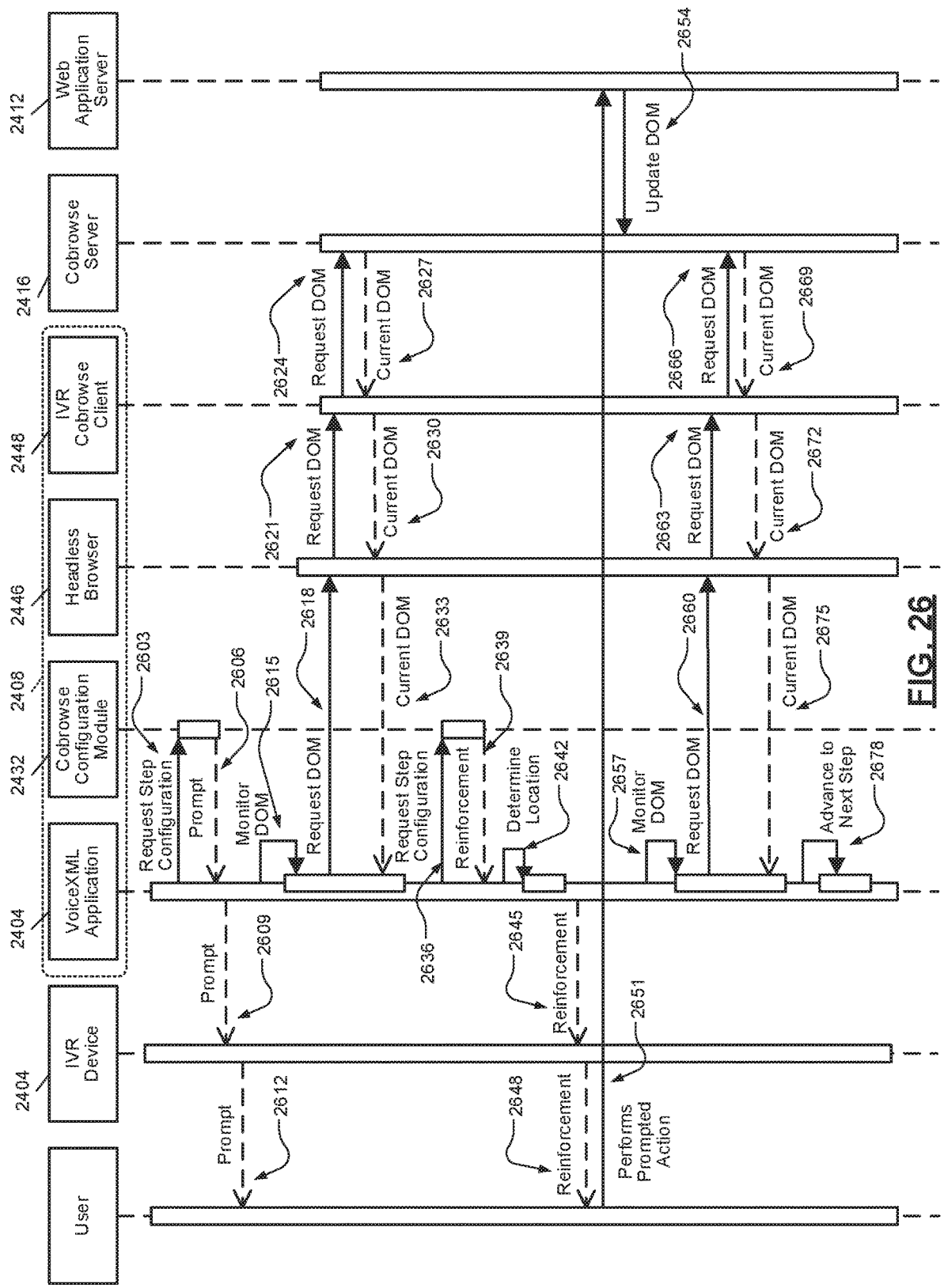
FIG. 26 is a sequence diagram that represents an example cobrowse session of the customer migration system.

FIG. 26 is an example cobrowse sequence diagram depicting example requests and associated responses between the user, the IVR device 2404, the voiceXML application 2428, the cobrowse configuration module 2432, the headless browser 2446, the IVR cobrowse client 2448, the cobrowse server 2416, and the web application server 2412 during a portion of an example cobrowse session. During the portion of the cobrowse session described in the cobrowse sequence diagram 2600, a prompt is presented to the user regarding an action associated with a step in the shortest path to a goal in the UI, and the voiceXML application 2428 monitors the user's progress and provides a reinforcement to aid the user in completing the action associated with the step.

The cobrowse sequence diagram begins with the voiceXML application 2428 requesting configuration data 2603 for the current state of the UI from the cobrowse configuration module 2432. In response, the cobrowse configuration module 2432 provides the voiceXML application 2428 with a prompt 2606 associated with the current step of the shortest path associated with the current state of the UI—for example, "Please enter your user name." The voiceXML application 2428 then provides the prompt 2609 to the IVR device 2404. The IVR device 2404 presents the prompt 2612 to the user. For example, the IVR device 2404 may use the text to speech module 2436 to generate an audio prompt that is presented to the user through the telephone 2420.

After the voiceXML application 2428 provides the prompt 2609 to the IVR device 2404, the voiceXML application 2428 delays for a predetermined period and then begins to monitor the DOM 2615 of the cobrowse session

2444. Specifically, the voiceXML application 2428 requests the DOM 2618 from the headless browser 2446. Upon receiving the request for the DOM 2618, the headless browser 2446 requests the DOM 2621 from the IVR cobrowse client 2448, which causes the IVR cobrowse client 2448 to transmit a request 2624 to the cobrowse server 2416 for the DOM. In response to receiving the request 2624 for the DOM from the IVR cobrowse client 2448, the cobrowse server 2416 transmits the current DOM 2627 of the cobrowse session 2444 to the IVR cobrowse client 2448. The IVR cobrowse client 2448 provides the current DOM 2630 to the headless browser 2446, which in turn provides the current DOM 2633 to the voiceXML application 2428. In this way, the voiceXML application 2428 is able to determine if the user has completed the prompted action.

In response to determining that the DOM does not indicate that the user has performed the prompted action, the voiceXML application 2428 requests a reinforcement 2636 associated with the current step from the cobrowse configuration module 2432. In response to receiving the request for the reinforcement 2636, the cobrowse configuration module 2432 provides a reinforcement 2639 associated with the current step to the voiceXML application 2428. For example, the reinforcement may be a prompt that indicates the location of a data entry field that corresponds to the prompted action.

In response to receiving the reinforcement 2639, the voiceXML application 2428 determines the relative location 2642 of the coordinates included in the reinforcement. The voiceXML application 2428 then provides the reinforcement 2645 to the IVR device 2404 which presents the reinforcement 2648 to the user. For example, the IVR device 2404 may use the text to speech module 2436 to generate an audio reinforcement.

Upon hearing the audio reinforcement, the user may perform the initially prompted action 2651. For example, the user may enter a username in the appropriate text entry field of the UI. In response to the user entering text in a text data entry field, the state of the UI changes and the web application server 2412 provides an updated DOM 2654 to the cobrowse server 2416.

After providing the reinforcement 2645 to the IVR device 2404, the voiceXML application 2428 delays for a predetermined period and then begins monitoring the DOM 2657 by requesting the DOM 2660 from the headless browser 2446 which requests the DOM 2663 from the IVR cobrowse client 2448. In response to receiving the request for the DOM 2663, the IVR cobrowse client 2448 transmits a request for the DOM 2666 to the cobrowse server 2416. In response to receiving the request for the DOM 2666, the cobrowse server 2416 transmits the current DOM 2669 to the IVR cobrowse client 2448. Upon receiving the current DOM 2669, the IVR cobrowse client 2448 provides the current DOM 2672 to the headless browser 2446, which in turn provides the current DOM 2675 to the voiceXML application 2428. In response to receiving the current DOM 2675, the voiceXML application 2428 determines if the initially prompted action has been completed. If so, the voiceXML application 2428 advances to the next step 2678 in the shortest path. The customer migration system 2400 continues in this manner, until the voiceXML application 2428 determines that the user has reached the goal.

Figure 27A:
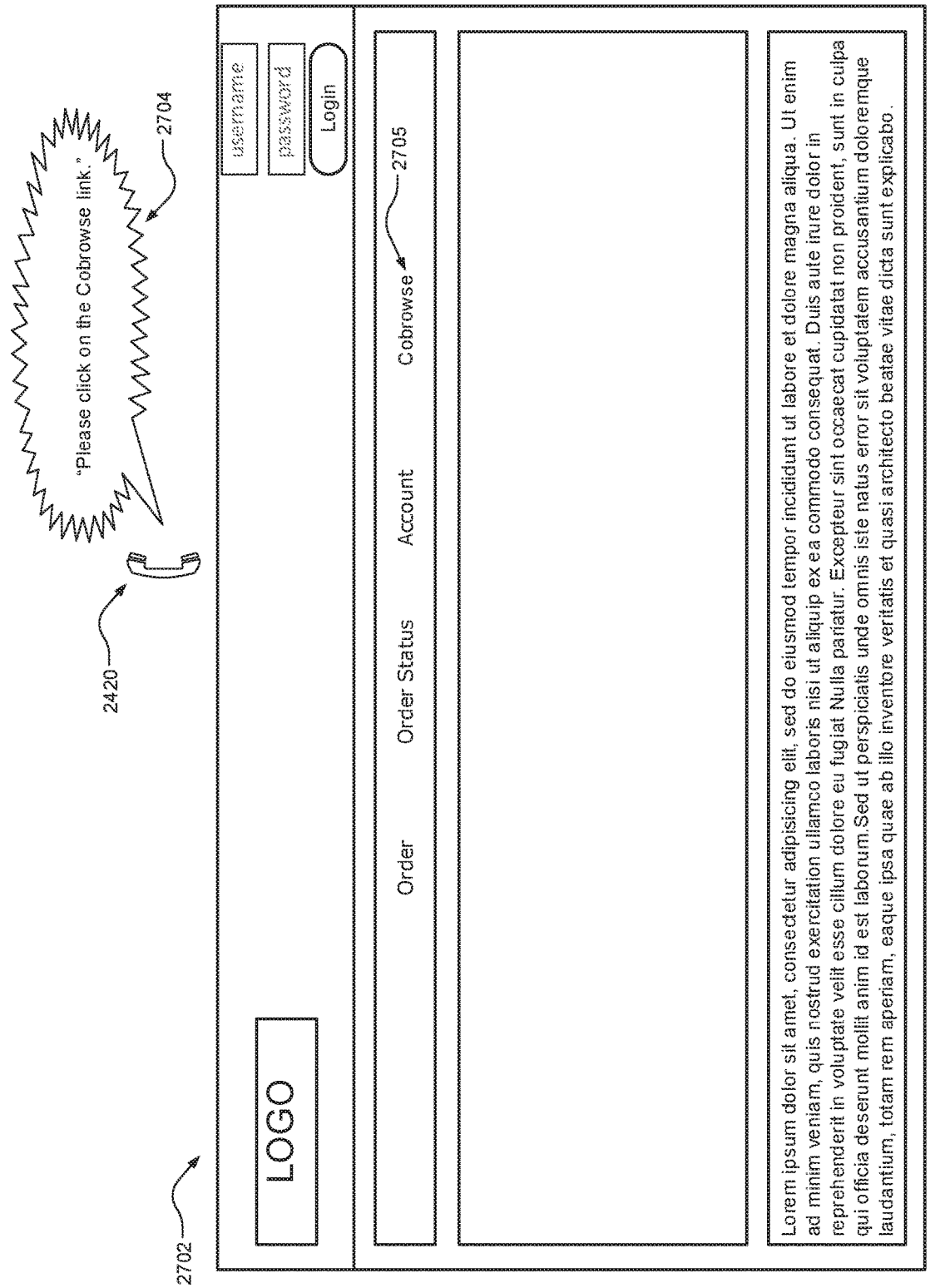
FIGS. 27A-27D are depictions of an example cobrowse session of a customer migration system, according to the principles of the present disclosure.

FIGS. 27A-27D are depictions of an example cobrowse session of the customer migration system 2400. In FIG. 27A, the output of a screen of the computing device 2438 displaying a first state 2702 of the UI of the web application 2430 is shown. For example, the first state 2702 is the initial state of the UI of the web application 2430. The IVR device 2404 generates a first audio prompt 2704 through the telephone 2420 that instructs the user to click on a cobrowse link 2705 located in the first state 2702 to initiate a cobrowse session. In response to the user clicking on the cobrowse link 2705, the web application server 2412 initiates the cobrowse session 2444 on the cobrowse server 2416. In response to initiating the cobrowse session 2444, the cobrowse server 2416 provides the web application server 2412 with the session ID of the cobrowse session 2444.

Figure 27B:
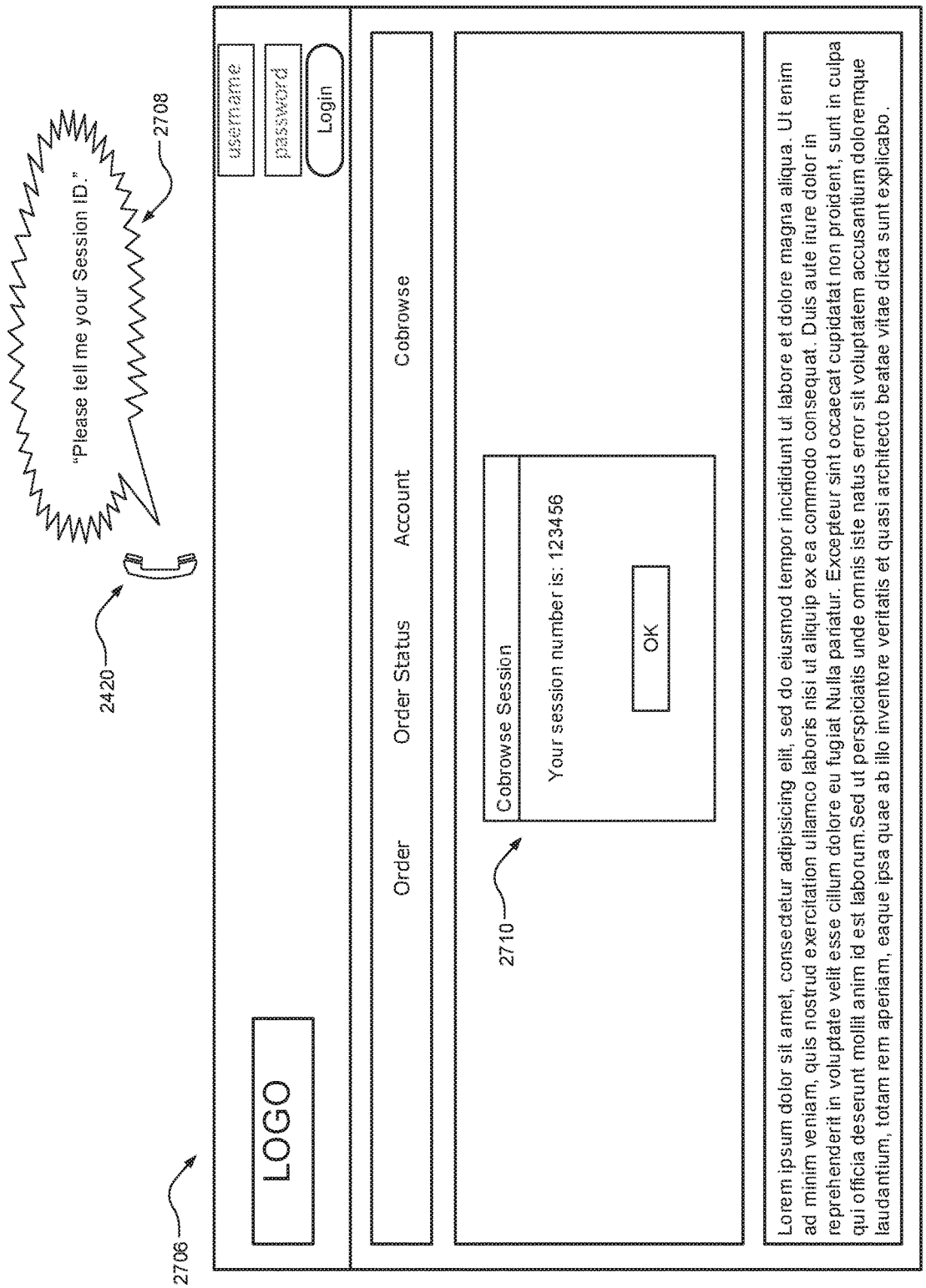

In FIG. 27B, in response to receiving the session ID of the cobrowse session 2444, the web application 2430 changes the state of the UI such that the output of the screen of the computing device 2438 displays a second state 2706 of the UI of the web application 2430. The second state 2706 of the UI includes a window 2710 that contains the session ID of the cobrowse session 2444—(123456). In response to generating the first audio prompt 2704, the IVR device 2404 generates a second audio prompt 2708 through the telephone 2420 that requests the user to provide the IVR device 2404 with the session ID of the cobrowse session 2444.

Figure 27C:
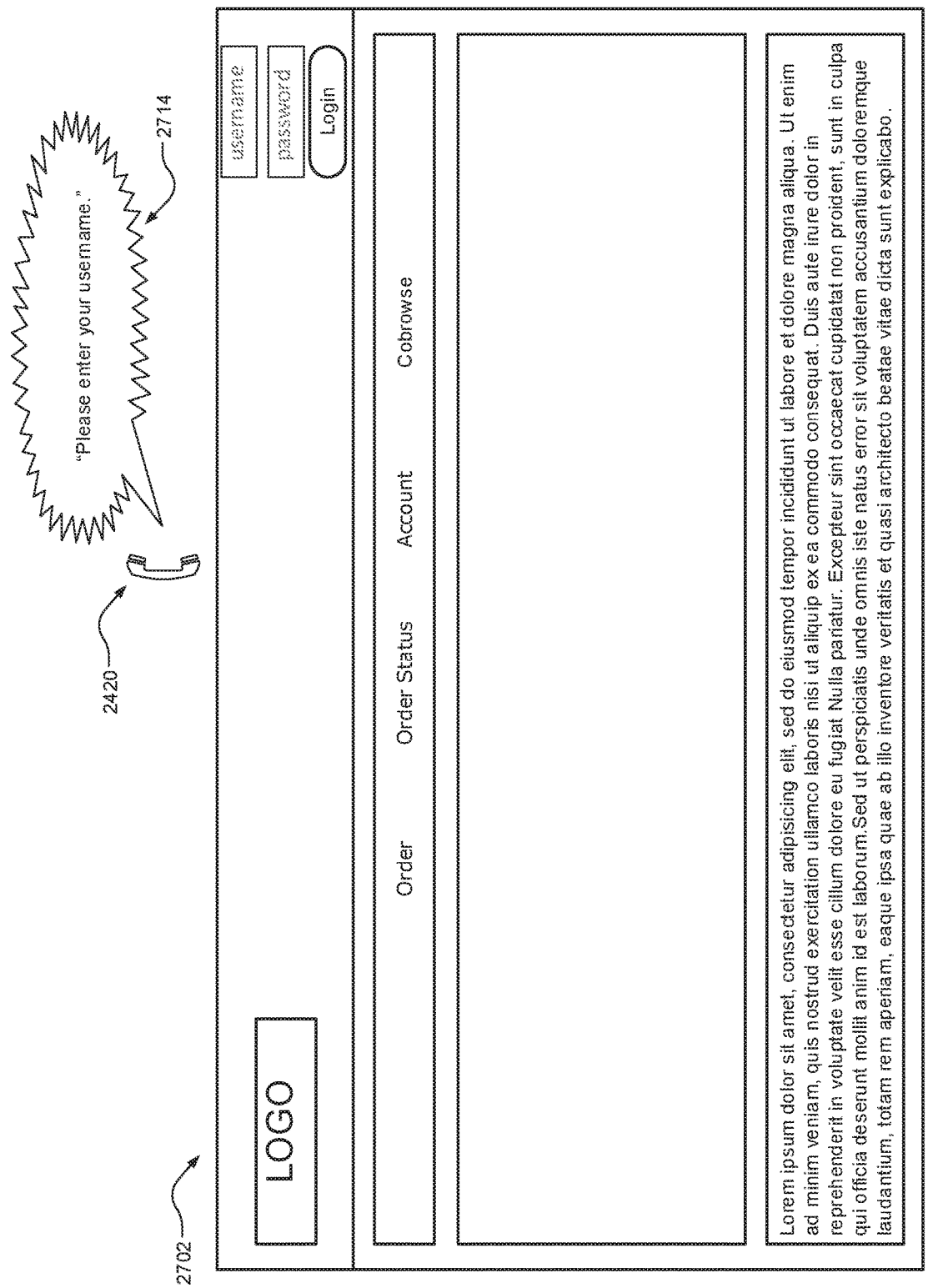

In FIG. 27C, in response to the user clicking an OK button in the window 2710, the web application 2430 changes the state of the UI, such that the screen of the computing device 2438 displays the first state 2702. In other words, the output of the screen of the computing device no longer includes the window 2710. In response to changing the state of the UI, the web application server 2412 provides a DOM of the first state 2702 to the cobrowse server 2416. In response to the user providing the IVR device 2404 with the session ID of the cobrowse session 2444, the IVR device 2404 provides the IVR server 2408 with the session ID.

The IVR server 2408 then connects to the cobrowse session 2444 and receives the current DOM of the cobrowse session—or example, the DOM of the first state 2702. The IVR server 2408, based on the DOM of the first state 2702 and prompt data from the cobrowse configuration module 2432, causes the IVR device 2404 to generate a third audio prompt 2714. The third audio prompt 2714 instructs the user to enter their username into the web application.

Figure 27D:
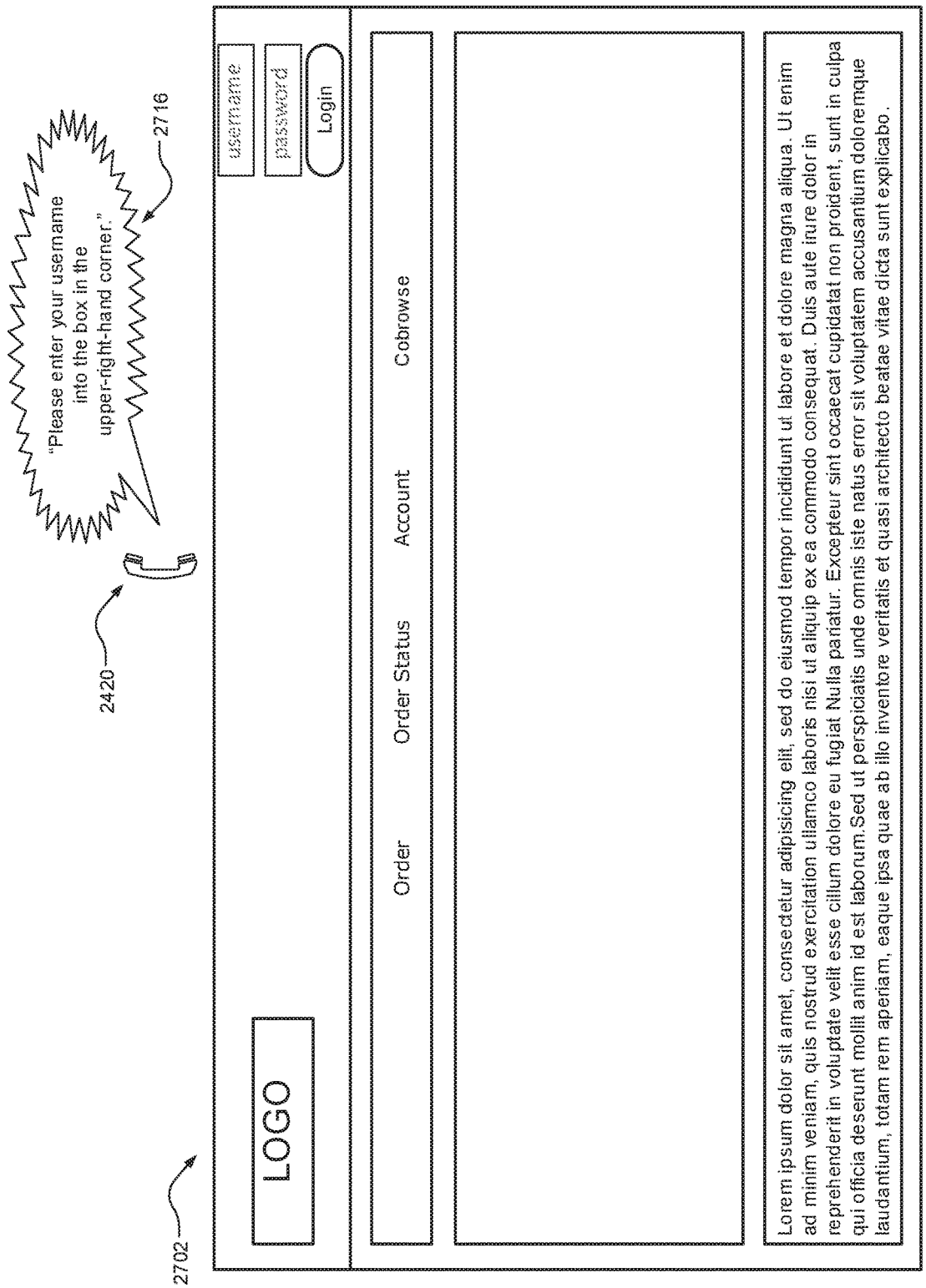

In FIG. 27D, in response to determining that the user has not completed the action associated with the third audio prompt 2714, the IVR server 2408, based on the DOM of the first state 2702 and reinforcement information from the cobrowse configuration module 2432, causes the IVR device 2404 to generate an audio reinforcement 2716. The audio reinforcement 2716 instructs the user to perform the original action and provides the user with additional information relevant to completing the action. For example, the audio reinforcement 2716 provides the user with the location of the data entry field to be used to enter their username. In this way, the IVR server 2408 is able to guide the user through the web application 2430 to a specific goal.

High-Volume Pharmacy

Figure 28:
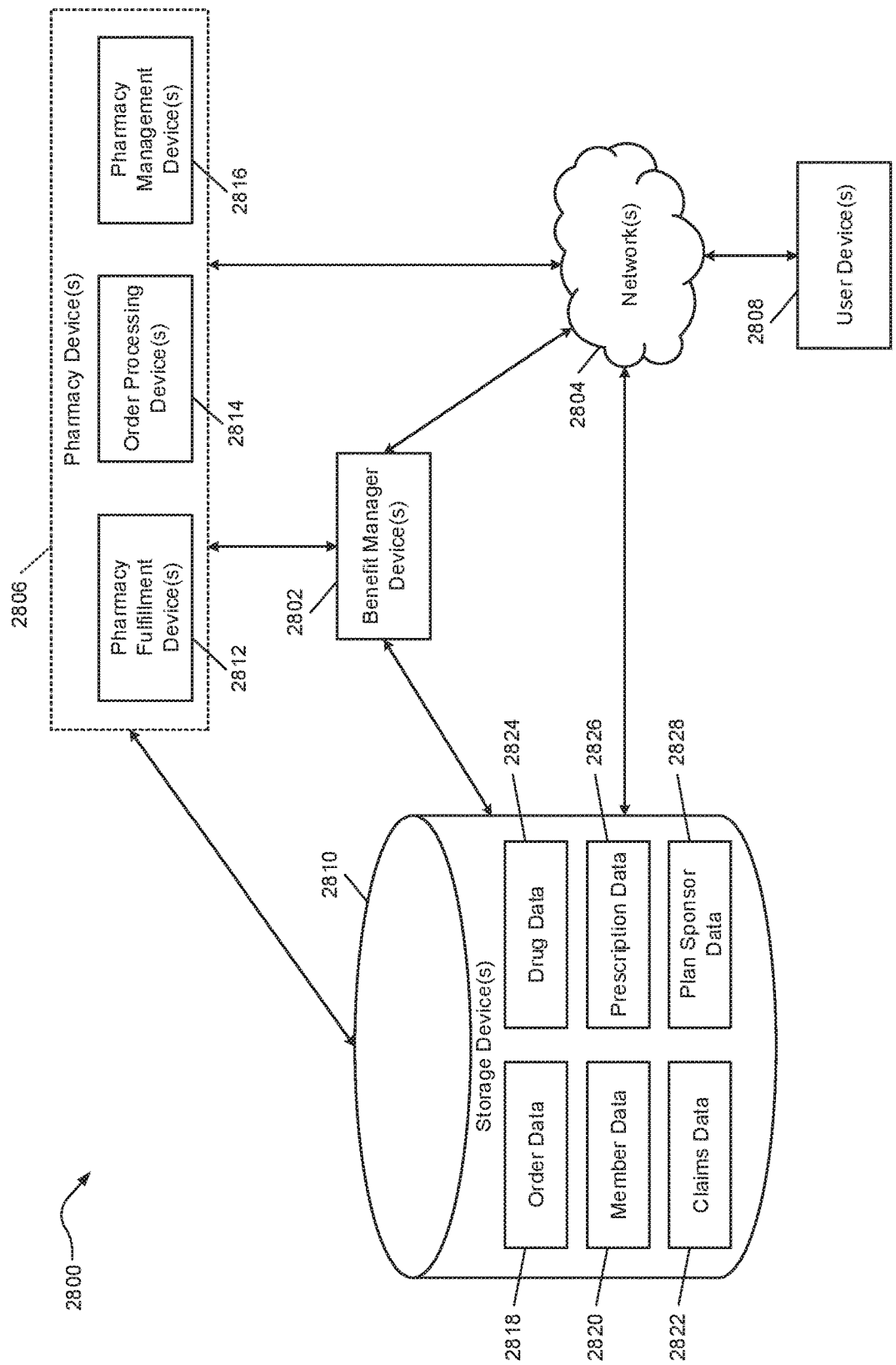
FIG. 28 is a functional block diagram of an example system including a high-volume pharmacy.

FIG. 28 is a block diagram of an example implementation of a system 2800 for a high-volume pharmacy. While the system 2800 is generally described as being deployed in a high-volume pharmacy or a fulfillment center (for example, a mail order pharmacy, a direct delivery pharmacy, etc.), the system 2800 and/or components of the system 2800 may otherwise be deployed (for example, in a lower-volume pharmacy, etc.). A high-volume pharmacy may be a pharmacy that is capable of filling at least some prescriptions mechanically. The system 2800 may include a benefit manager device 2802 and a pharmacy device 2806 in communication with each other directly and/or over a network 2804.

The system 2800 may also include one or more user device(s) 2808. A user, such as a pharmacist, patient, data analyst, health plan administrator, etc., may access the benefit manager device 2802 or the pharmacy device 2806 using the user device 2808. The user device 2808 may be a desktop computer, a laptop computer, a tablet, a smartphone, etc.

The benefit manager device 2802 is a device operated by an entity that is at least partially responsible for creation and/or management of the pharmacy or drug benefit. While the entity operating the benefit manager device 2802 is typically a pharmacy benefit manager (PBM), other entities may operate the benefit manager device 2802 on behalf of themselves or other entities (such as PBMs). For example, the benefit manager device 2802 may be operated by a health plan, a retail pharmacy chain, a drug wholesaler, a data analytics or other type of software-related company, etc. In some implementations, a PBM that provides the pharmacy benefit may provide one or more additional benefits including a medical or health benefit, a dental benefit, a vision benefit, a wellness benefit, a radiology benefit, a pet care benefit, an insurance benefit, a long term care benefit, a nursing home benefit, etc. The PBM may, in addition to its PBM operations, operate one or more pharmacies. The pharmacies may be retail pharmacies, mail order pharmacies, etc.

Some of the operations of the PBM that operates the benefit manager device 2802 may include the following activities and processes. A member (or a person on behalf of the member) of a pharmacy benefit plan may obtain a prescription drug at a retail pharmacy location (e.g., a location of a physical store) from a pharmacist or a pharmacist technician. The member may also obtain the prescription drug through mail order drug delivery from a mail order pharmacy location, such as the system 2800. In some implementations, the member may obtain the prescription drug directly or indirectly through the use of a machine, such as a kiosk, a vending unit, a mobile electronic device, or a different type of mechanical device, electrical device, electronic communication device, and/or computing device. Such a machine may be filled with the prescription drug in prescription packaging, which may include multiple prescription components, by the system 2800. The pharmacy benefit plan is administered by or through the benefit manager device 2802.

The member may have a copayment for the prescription drug that reflects an amount of money that the member is responsible to pay the pharmacy for the prescription drug. The money paid by the member to the pharmacy may come from, as examples, personal funds of the member, a health savings account (HSA) of the member or the member's family, a health reimbursement arrangement (HRA) of the member or the member's family, or a flexible spending account (FSA) of the member or the member's family. In some instances, an employer of the member may directly or indirectly fund or reimburse the member for the copayments.

The amount of the copayment required by the member may vary across different pharmacy benefit plans having different plan sponsors or clients and/or for different prescription drugs. The member's copayment may be a flat copayment (in one example, $10), coinsurance (in one example, 10%), and/or a deductible (for example, responsibility for the first $500 of annual prescription drug expense, etc.) for certain prescription drugs, certain types and/or classes of prescription drugs, and/or all prescription drugs. The copayment may be stored in a storage device 2810 or determined by the benefit manager device 2802.

In some instances, the member may not pay the copayment or may only pay a portion of the copayment for the prescription drug. For example, if a usual and customary cost for a generic version of a prescription drug is $4, and the member's flat copayment is $20 for the prescription drug, the member may only need to pay $4 to receive the prescription drug. In another example involving a worker's compensation claim, no copayment may be due by the member for the prescription drug.

In addition, copayments may also vary based on different delivery channels for the prescription drug. For example, the copayment for receiving the prescription drug from a mail order pharmacy location may be less than the copayment for receiving the prescription drug from a retail pharmacy location.

In conjunction with receiving a copayment (if any) from the member and dispensing the prescription drug to the member, the pharmacy submits a claim to the PBM for the prescription drug. After receiving the claim, the PBM (such as by using the benefit manager device 2802) may perform certain adjudication operations including verifying eligibility for the member, identifying/reviewing an applicable formulary for the member to determine any appropriate copayment, coinsurance, and deductible for the prescription drug, and performing a drug utilization review (DUR) for the member. Further, the PBM may provide a response to the pharmacy (for example, the pharmacy system 2800) following performance of at least some of the aforementioned operations.

As part of the adjudication, a plan sponsor (or the PBM on behalf of the plan sponsor) ultimately reimburses the pharmacy for filling the prescription drug when the prescription drug was successfully adjudicated. The aforementioned adjudication operations generally occur before the copayment is received and the prescription drug is dispensed. However in some instances, these operations may occur simultaneously, substantially simultaneously, or in a different order. In addition, more or fewer adjudication operations may be performed as at least part of the adjudication process.

The amount of reimbursement paid to the pharmacy by a plan sponsor and/or money paid by the member may be determined at least partially based on types of pharmacy networks in which the pharmacy is included. In some implementations, the amount may also be determined based on other factors. For example, if the member pays the pharmacy for the prescription drug without using the prescription or drug benefit provided by the PBM, the amount of money paid by the member may be higher than when the member uses the prescription or drug benefit. In some implementations, the amount of money received by the pharmacy for dispensing the prescription drug and for the prescription drug itself may be higher than when the member uses the prescription or drug benefit. Some or all of the foregoing operations may be performed by executing instructions stored in the benefit manager device 2802 and/or an additional device.

Examples of the network 2804 include a Global System for Mobile Communications (GSM) network, a code division multiple access (CDMA) network, 3rd Generation Partnership Project (3GPP), an Internet Protocol (IP) network, a Wireless Application Protocol (WAP) network, or an IEEE 802.11 standards network, as well as various combinations of the above networks. The network 2804 may include an optical network. The network 2804 may be a local area network or a global communication network, such as the Internet. In some implementations, the network 2804 may include a network dedicated to prescription orders: a prescribing network such as the electronic prescribing network operated by Surescripts of Arlington, Va.

Moreover, although the system shows a single network 2804, multiple networks can be used. The multiple networks may communicate in series and/or parallel with each other to link the devices 2802-2810.

The pharmacy device 2806 may be a device associated with a retail pharmacy location (e.g., an exclusive pharmacy location, a grocery store with a retail pharmacy, or a general sales store with a retail pharmacy) or other type of pharmacy location at which a member attempts to obtain a prescription. The pharmacy may use the pharmacy device 2806 to submit the claim to the PBM for adjudication.

Additionally, in some implementations, the pharmacy device 2806 may enable information exchange between the pharmacy and the PBM. For example, this may allow the sharing of member information such as drug history that may allow the pharmacy to better service a member (for example, by providing more informed therapy consultation and drug interaction information). In some implementations, the benefit manager device 2802 may track prescription drug fulfillment and/or other information for users that are not members, or have not identified themselves as members, at the time (or in conjunction with the time) in which they seek to have a prescription filled at a pharmacy.

The pharmacy device 2806 may include a pharmacy fulfillment device 2812, an order processing device 2814, and a pharmacy management device 2816 in communication with each other directly and/or over the network 2804. The order processing device 2814 may receive information regarding filling prescriptions and may direct an order component to one or more devices of the pharmacy fulfillment device 2812 at a pharmacy. The pharmacy fulfillment device 2812 may fulfill, dispense, aggregate, and/or pack the order components of the prescription drugs in accordance with one or more prescription orders directed by the order processing device 2814.

In general, the order processing device 2814 is a device located within or otherwise associated with the pharmacy to enable the pharmacy fulfilment device 2812 to fulfill a prescription and dispense prescription drugs. In some implementations, the order processing device 2814 may be an external order processing device separate from the pharmacy and in communication with other devices located within the pharmacy.

For example, the external order processing device may communicate with an internal pharmacy order processing device and/or other devices located within the system 2800. In some implementations, the external order processing device may have limited functionality (e.g., as operated by a user requesting fulfillment of a prescription drug), while the internal pharmacy order processing device may have greater functionality (e.g., as operated by a pharmacist).

The order processing device 2814 may track the prescription order as it is fulfilled by the pharmacy fulfillment device 2812. The prescription order may include one or more prescription drugs to be filled by the pharmacy. The order processing device 2814 may make pharmacy routing decisions and/or order consolidation decisions for the particular prescription order. The pharmacy routing decisions include what device(s) in the pharmacy are responsible for filling or otherwise handling certain portions of the prescription order. The order consolidation decisions include whether portions of one prescription order or multiple prescription orders should be shipped together for a user or a user family. The order processing device 2814 may also track and/or schedule literature or paperwork associated with each prescription order or multiple prescription orders that are being shipped together. In some implementations, the order processing device 2814 may operate in combination with the pharmacy management device 2816.

The order processing device 2814 may include circuitry, a processor, a memory to store data and instructions, and communication functionality. The order processing device 2814 is dedicated to performing processes, methods, and/or instructions described in this application. Other types of electronic devices may also be used that are specifically configured to implement the processes, methods, and/or instructions described in further detail below.

In some implementations, at least some functionality of the order processing device 2814 may be included in the pharmacy management device 2816. The order processing device 2814 may be in a client-server relationship with the pharmacy management device 2816, in a peer-to-peer relationship with the pharmacy management device 2816, or in a different type of relationship with the pharmacy management device 2816. The order processing device 2814 and/or the pharmacy management device 2816 may communicate directly (for example, such as by using a local storage) and/or through the network 2804 (such as by using a cloud storage configuration, software as a service, etc.) with the storage device 2810.

The storage device 2810 may include: non-transitory storage (for example, memory, hard disk, CD-ROM, etc.) in communication with the benefit manager device 2802 and/or the pharmacy device 2806 directly and/or over the network 2804. The non-transitory storage may store order data 2818, member data 2820, claims data 2822, drug data 2824, prescription data 2826, and/or plan sponsor data 2828. Further, the system 2800 may include additional devices, which may communicate with each other directly or over the network 2804.

The order data 2818 may be related to a prescription order. The order data may include type of the prescription drug (for example, drug name and strength) and quantity of the prescription drug. The order data 2818 may also include data used for completion of the prescription, such as prescription materials. In general, prescription materials include an electronic copy of information regarding the prescription drug for inclusion with or otherwise in conjunction with the fulfilled prescription. The prescription materials may include electronic information regarding drug interaction warnings, recommended usage, possible side effects, expiration date, date of prescribing, etc. The order data 2818 may be used by a high-volume fulfillment center to fulfill a pharmacy order.

In some implementations, the order data 2818 includes verification information associated with fulfillment of the prescription in the pharmacy. For example, the order data 2818 may include videos and/or images taken of (i) the prescription drug prior to dispensing, during dispensing, and/or after dispensing, (ii) the prescription container (for example, a prescription container and sealing lid, prescription packaging, etc.) used to contain the prescription drug prior to dispensing, during dispensing, and/or after dispensing, (iii) the packaging and/or packaging materials used to ship or otherwise deliver the prescription drug prior to dispensing, during dispensing, and/or after dispensing, and/or (iv) the fulfillment process within the pharmacy. Other types of verification information such as barcode data read from pallets, bins, trays, or carts used to transport prescriptions within the pharmacy may also be stored as order data 2818.

The member data 2820 includes information regarding the members associated with the PBM. The information stored as member data 2820 may include personal information, personal health information, protected health information, etc. Examples of the member data 2820 include name, address, telephone number, e-mail address, prescription drug history, etc. The member data 2820 may include a plan sponsor identifier that identifies the plan sponsor associated with the member and/or a member identifier that identifies the member to the plan sponsor. The member data 2820 may include a member identifier that identifies the plan sponsor associated with the user and/or a user identifier that identifies the user to the plan sponsor. The member data 2820 may also include dispensation preferences such as type of label, type of cap, message preferences, language preferences, etc.

The member data 2820 may be accessed by various devices in the pharmacy (for example, the high-volume fulfillment center, etc.) to obtain information used for fulfillment and shipping of prescription orders. In some implementations, an external order processing device operated by or on behalf of a member may have access to at least a portion of the member data 2820 for review, verification, or other purposes.

In some implementations, the member data 2820 may include information for persons who are users of the pharmacy but are not members in the pharmacy benefit plan being provided by the PBM. For example, these users may obtain drugs directly from the pharmacy, through a private label service offered by the pharmacy, the high-volume fulfillment center, or otherwise. In general, the use of the terms "member" and "user" may be used interchangeably.

The claims data 2822 includes information regarding pharmacy claims adjudicated by the PBM under a drug benefit program provided by the PBM for one or more plan sponsors. In general, the claims data 2822 includes an identification of the client that sponsors the drug benefit program under which the claim is made, and/or the member that purchased the prescription drug giving rise to the claim, the prescription drug that was filled by the pharmacy (e.g., the national drug code number, etc.), the dispensing date, generic indicator, generic product identifier (GPI) number, medication class, the cost of the prescription drug provided under the drug benefit program, the copayment/coinsurance amount, rebate information, and/or member eligibility, etc. Additional information may be included.

In some implementations, other types of claims beyond prescription drug claims may be stored in the claims data 2822. For example, medical claims, dental claims, wellness claims, or other types of health-care-related claims for members may be stored as a portion of the claims data 2822.

In some implementations, the claims data 2822 includes claims that identify the members with whom the claims are associated. Additionally or alternatively, the claims data 2822 may include claims that have been de-identified (that is, associated with a unique identifier but not with a particular, identifiable member).

The drug data 2824 may include drug name (e.g., technical name and/or common name), other names by which the drug is known, active ingredients, an image of the drug (such as in pill form), etc. The drug data 2824 may include information associated with a single medication or multiple medications.

The prescription data 2826 may include information regarding prescriptions that may be issued by prescribers on behalf of users, who may be members of the pharmacy benefit plan—for example, to be filled by a pharmacy. Examples of the prescription data 2826 include user names, medication or treatment (such as lab tests), dosing information, etc. The prescriptions may include electronic prescriptions or paper prescriptions that have been scanned. In some implementations, the dosing information reflects a frequency of use (e.g., once a day, twice a day, before each meal, etc.) and a duration of use (e.g., a few days, a week, a few weeks, a month, etc.).

In some implementations, the order data 2818 may be linked to associated member data 2820, claims data 2822, drug data 2824, and/or prescription data 2826.

The plan sponsor data 2828 includes information regarding the plan sponsors of the PBM. Examples of the plan sponsor data 2828 include company name, company address, contact name, contact telephone number, contact e-mail address, etc.

Figure 29:
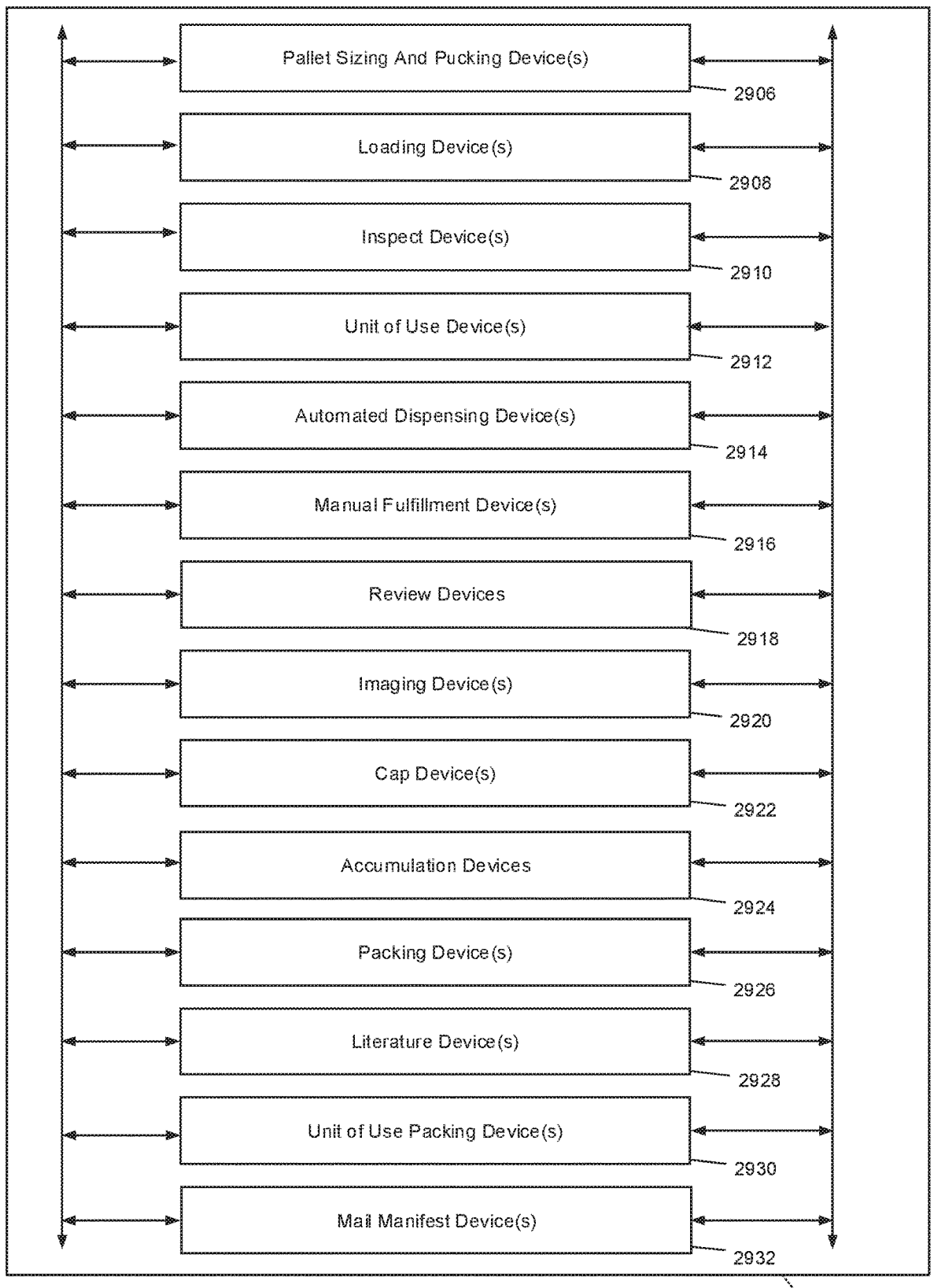
FIG. 29 is a functional block diagram of an example pharmacy fulfillment device, which may be deployed within the system of FIG. 28.

FIG. 29 illustrates the pharmacy fulfillment device 2812 according to an example implementation. The pharmacy fulfillment device 2812 may be used to process and fulfill prescriptions and prescription orders. After fulfillment, the fulfilled prescriptions are packed for shipping.

The pharmacy fulfillment device 2812 may include devices in communication with the benefit manager device 2802, the order processing device 2814, and/or the storage device 2810, directly or over the network 2804. Specifically, the pharmacy fulfillment device 2812 may include pallet sizing and pucking device(s) 2906, loading device(s) 2908, inspect device(s) 2910, unit of use device(s) 2912, automated dispensing device(s) 2914, manual fulfillment device(s) 2916, review devices 2918, imaging device(s) 2920, cap device(s) 2922, accumulation devices 2924, packing device(s) 2926, literature device(s) 2928, unit of use packing device(s) 2930, and mail manifest device(s) 2932. Further, the pharmacy fulfillment device 2812 may include additional devices, which may communicate with each other directly or over the network 2804.

In some implementations, operations performed by one of these devices 2906-2932 may be performed sequentially, or in parallel with the operations of another device as may be coordinated by the order processing device 2814. In some implementations, the order processing device 2814 tracks a prescription with the pharmacy based on operations performed by one or more of the devices 2906-2932.

In some implementations, the pharmacy fulfillment device 2812 may transport prescription drug containers, for example, among the devices 2906-2932 in the high-volume fulfillment center, by use of pallets. The pallet sizing and pucking device 2906 may configure pucks in a pallet. A pallet may be a transport structure for a number of prescription containers, and may include a number of cavities. A puck may be placed in one or more than one of the cavities in a pallet by the pallet sizing and pucking device 2906. The puck may include a receptacle sized and shaped to receive a prescription container. Such containers may be supported by the pucks during carriage in the pallet. Different pucks may have differently sized and shaped receptacles to accommodate containers of differing sizes, as may be appropriate for different prescriptions.

The arrangement of pucks in a pallet may be determined by the order processing device 2814 based on prescriptions that the order processing device 2814 decides to launch. The arrangement logic may be implemented directly in the pallet sizing and pucking device 2906. Once a prescription is set to be launched, a puck suitable for the appropriate size of container for that prescription may be positioned in a pallet by a robotic arm or pickers. The pallet sizing and pucking device 2906 may launch a pallet once pucks have been configured in the pallet.

The loading device 2908 may load prescription containers into the pucks on a pallet by a robotic arm, a pick and place mechanism (also referred to as pickers), etc. In various implementations, the loading device 2908 has robotic arms or pickers to grasp a prescription container and move it to and from a pallet or a puck. The loading device 2908 may also print a label that is appropriate for a container that is to be loaded onto the pallet, and apply the label to the container. The pallet may be located on a conveyor assembly during these operations (e.g., at the high-volume fulfillment center, etc.).

The inspect device 2910 may verify that containers in a pallet are correctly labeled and in the correct spot on the pallet. The inspect device 2910 may scan the label on one or more containers on the pallet. Labels of containers may be scanned or imaged in full or in part by the inspect device 2910. Such imaging may occur after the container has been lifted out of its puck by a robotic arm, picker, etc., or may be otherwise scanned or imaged while retained in the puck. In some implementations, images and/or video captured by the inspect device 2910 may be stored in the storage device 2810 as order data 2818.

The unit of use device 2912 may temporarily store, monitor, label, and/or dispense unit of use products. In general, unit of use products are prescription drug products that may be delivered to a user or member without being repackaged at the pharmacy. These products may include pills in a container, pills in a blister pack, inhalers, etc. Prescription drug products dispensed by the unit of use device 2912 may be packaged individually or collectively for shipping, or may be shipped in combination with other prescription drugs dispensed by other devices in the high-volume fulfillment center.

At least some of the operations of the devices 2906-2932 may be directed by the order processing device 2814. For example, the manual fulfillment device 2916, the review device 2918, the automated dispensing device 2914, and/or the packing device 2926, etc. may receive instructions provided by the order processing device 2814.

The automated dispensing device 2914 may include one or more devices that dispense prescription drugs or pharmaceuticals into prescription containers in accordance with one or multiple prescription orders. In general, the automated dispensing device 2914 may include mechanical and electronic components with, in some implementations, software and/or logic to facilitate pharmaceutical dispensing that would otherwise be performed in a manual fashion by a pharmacist and/or pharmacist technician. For example, the automated dispensing device 2914 may include high-volume fillers that fill a number of prescription drug types at a rapid rate and blister pack machines that dispense and pack drugs into a blister pack. Prescription drugs dispensed by the automated dispensing devices 2914 may be packaged individually or collectively for shipping, or may be shipped in combination with other prescription drugs dispensed by other devices in the high-volume fulfillment center.

The manual fulfillment device 2916 controls how prescriptions are manually fulfilled. For example, the manual fulfillment device 2916 may receive or obtain a container and enable fulfillment of the container by a pharmacist or pharmacy technician. In some implementations, the manual fulfillment device 2916 provides the filled container to another device in the pharmacy fulfillment devices 2812 to be joined with other containers in a prescription order for a user or member.

In general, manual fulfillment may include operations at least partially performed by a pharmacist or a pharmacy technician. For example, a person may retrieve a supply of the prescribed drug, may make an observation, may count out a prescribed quantity of drugs and place them into a prescription container, etc. Some portions of the manual fulfillment process may be automated by use of a machine. For example, counting of capsules, tablets, or pills may be at least partially automated (such as through use of a pill counter). Prescription drugs dispensed by the manual fulfillment device 2916 may be packaged individually or collectively for shipping, or may be shipped in combination with other prescription drugs dispensed by other devices in the high-volume fulfillment center.

The review device 2918 may process prescription containers to be reviewed by a pharmacist for proper pill count, exception handling, prescription verification, etc. Fulfilled prescriptions may be manually reviewed and/or verified by a pharmacist, as may be required by state or local law. A pharmacist or other licensed pharmacy person who may dispense certain drugs in compliance with local and/or other laws may operate the review device 2918 and visually inspect a prescription container that has been filled with a prescription drug. The pharmacist may review, verify, and/or evaluate drug quantity, drug strength, and/or drug interaction concerns, or otherwise perform pharmacist services. The pharmacist may also handle containers which have been flagged as an exception, such as containers with unreadable labels, containers for which the associated prescription order has been canceled, containers with defects, etc. In an example, the manual review can be performed at a manual review station.

The imaging device 2920 may image containers once they have been filled with pharmaceuticals. The imaging device 2920 may measure a fill height of the pharmaceuticals in the container based on the obtained image to determine if the container is filled to the correct height given the type of pharmaceutical and the number of pills in the prescription. Images of the pills in the container may also be obtained to detect the size of the pills themselves and markings thereon. The images may be transmitted to the order processing device 2814 and/or stored in the storage device 2810 as part of the order data 2818.

The cap device 2922 may be used to cap or otherwise seal a prescription container. In some implementations, the cap device 2922 may secure a prescription container with a type of cap in accordance with a user preference (e.g., a preference regarding child resistance, etc.), a plan sponsor preference, a prescriber preference, etc. The cap device 2922 may also etch a message into the cap, although this process may be performed by a subsequent device in the high-volume fulfillment center.

The accumulation device 2924 accumulates various containers of prescription drugs in a prescription order. The accumulation device 2924 may accumulate prescription containers from various devices or areas of the pharmacy. For example, the accumulation device 2924 may accumulate prescription containers from the unit of use device 2912, the automated dispensing device 2914, the manual fulfillment device 2916, and the review device 2918. The accumulation device 2924 may be used to group the prescription containers prior to shipment to the member.

The literature device 2928 prints, or otherwise generates, literature to include with each prescription drug order. The literature may be printed on multiple sheets of substrates, such as paper, coated paper, printable polymers, or combinations of the above substrates. The literature printed by the literature device 2928 may include information required to accompany the prescription drugs included in a prescription order, other information related to prescription drugs in the order, financial information associated with the order (for example, an invoice or an account statement), etc.

In some implementations, the literature device 2928 folds or otherwise prepares the literature for inclusion with a prescription drug order (e.g., in a shipping container). In other implementations, the literature device 2928 prints the literature and is separate from another device that prepares the printed literature for inclusion with a prescription order.

The packing device 2926 packages the prescription order in preparation for shipping the order. The packing device 2926 may box, bag, or otherwise package the fulfilled prescription order for delivery. The packing device 2926 may further place inserts (e.g., literature or other papers, etc.) into the packaging received from the literature device 2928. For example, bulk prescription orders may be shipped in a box, while other prescription orders may be shipped in a bag, which may be a wrap seal bag.

The packing device 2926 may label the box or bag with an address and a recipient's name. The label may be printed and affixed to the bag or box, be printed directly onto the bag or box, or otherwise associated with the bag or box. The packing device 2926 may sort the box or bag for mailing in an efficient manner (e.g., sort by delivery address, etc.). The packing device 2926 may include ice or temperature sensitive elements for prescriptions that are to be kept within a temperature range during shipping (for example, this may be necessary in order to retain efficacy). The ultimate package may then be shipped through postal mail, through a mail order delivery service that ships via ground and/or air (e.g., UPS, FEDEX, or DHL, etc.), through a delivery service, through a locker box at a shipping site (e.g., AMAZON locker or a PO Box, etc.), or otherwise.

The unit of use packing device 2930 packages a unit of use prescription order in preparation for shipping the order. The unit of use packing device 2930 may include manual scanning of containers to be bagged for shipping to verify each container in the order. In an example implementation, the manual scanning may be performed at a manual scanning station. The pharmacy fulfillment device 2812 may also include a mail manifest device 2932 to print mailing labels used by the packing device 2926 and may print shipping manifests and packing lists.

While the pharmacy fulfillment device 2812 in FIG. 29 is shown to include single devices 2906-2932, multiple devices may be used. When multiple devices are present, the multiple devices may be of the same device type or models, or may be a different device type or model. The types of devices 2906-2932 shown in FIG. 29 are example devices. In other configurations of the system 2800, lesser, additional, or different types of devices may be included.

Moreover, multiple devices may share processing and/or memory resources. The devices 2906-2932 may be located in the same area or in different locations. For example, the devices 2906-2932 may be located in a building or set of adjoining buildings. The devices 2906-2932 may be interconnected (such as by conveyors), networked, and/or otherwise in contact with one another or integrated with one another (e.g., at the high-volume fulfillment center, etc.). In addition, the functionality of a device may be split among a number of discrete devices and/or combined with other devices.

Figure 30:
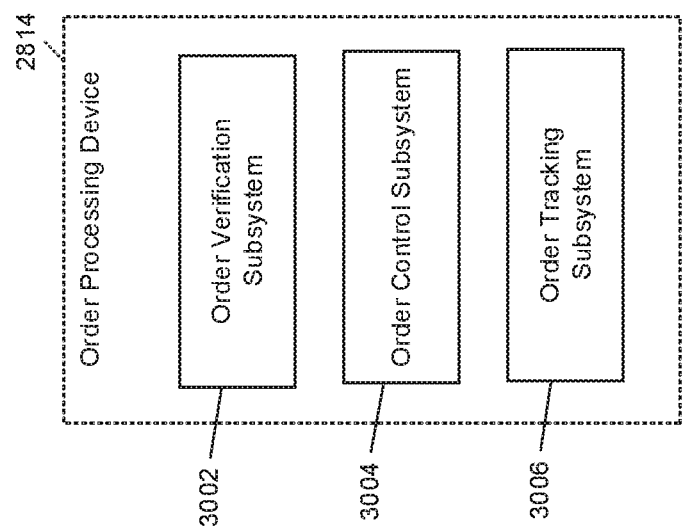
FIG. 30 is a functional block diagram of an example order processing device, which may be deployed within the system of FIG. 28.

FIG. 30 illustrates the order processing device 2814 according to an example implementation. The order processing device 2814 may be used by one or more operators to generate prescription orders, make routing decisions, make prescription order consolidation decisions, track literature with the system 2800, and/or view order status and other order related information. For example, the prescription order may be comprised of order components.

The order processing device 2814 may receive instructions to fulfill an order without operator intervention. An order component may include a prescription drug fulfilled by use of a container through the system 2800. The order processing device 2814 may include an order verification subsystem 3002, an order control subsystem 3004, and/or an order tracking subsystem 3006. Other subsystems may also be included in the order processing device 2814.

The order verification subsystem 3002 may communicate with the benefit manager device 2802 to verify the eligibility of the member and review the formulary to determine appropriate copayment, coinsurance, and deductible for the prescription drug and/or perform a DUR (drug utilization review). Other communications between the order verification subsystem 3002 and the benefit manager device 2802 may be performed for a variety of purposes.

The order control subsystem 3004 controls various movements of the containers and/or pallets along with various filling functions during their progression through the system 2800. In some implementations, the order control subsystem 3004 may identify the prescribed drug in one or more than one prescription orders as capable of being fulfilled by the automated dispensing device 2914. The order control subsystem 3004 may determine which prescriptions are to be launched and may determine that a pallet of automated-fill containers is to be launched.

The order control subsystem 3004 may determine that an automated-fill prescription of a specific pharmaceutical is to be launched and may examine a queue of orders awaiting fulfillment for other prescription orders, which will be filled with the same pharmaceutical. The order control subsystem 3004 may then launch orders with similar automated-fill pharmaceutical needs together in a pallet to the automated dispensing device 2914. As the devices 2906-2932 may be interconnected by a system of conveyors or other container movement systems, the order control subsystem 3004 may control various conveyors: for example, to deliver the pallet from the loading device 2908 to the manual fulfillment device 2916 from the literature device 2928, paperwork as needed to fill the prescription.

The order tracking subsystem 3006 may track a prescription order during its progress toward fulfillment. The order tracking subsystem 3006 may track, record, and/or update order history, order status, etc. The order tracking subsystem 3006 may store data locally (for example, in a memory) or as a portion of the order data 2818 stored in the storage device 2810.

CONCLUSION

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules) are described using various terms, including "connected," "engaged," "interfaced," and "coupled." Unless explicitly described as being "direct," when a relationship between first and second elements is described in the above disclosure, that relationship encompasses a direct relationship where no other intervening elements are present between the first and second elements, and also an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A. The term subset does not necessarily require a proper subset. In other words, a first subset of a first set may be coextensive with (equal to) the first set.

In this application, including the definitions below, the term "module" or the term "controller" may be replaced with the term "circuit." The term "module" may refer to, be part of, or include processor hardware (shared, dedicated, or group) that executes code and memory hardware (shared, dedicated, or group) that stores code executed by the processor hardware.

The module may include one or more interface circuits. In some examples, the interface circuit(s) may implement wired or wireless interfaces that connect to a local area network (LAN) or a wireless personal area network (WPAN). Examples of a LAN are Institute of Electrical and Electronics Engineers (IEEE) Standard 802.11-2016 (also known as the WIFI wireless networking standard) and IEEE Standard 802.3-2015 (also known as the ETHERNET wired networking standard). Examples of a WPAN are the BLUETOOTH wireless networking standard from the Bluetooth Special Interest Group and IEEE Standard 802.15.4.

The module may communicate with other modules using the interface circuit(s). Although the module may be depicted in the present disclosure as logically communicating directly with other modules, in various implementations the module may actually communicate via a communications system. The communications system includes physical and/or virtual networking equipment such as hubs, switches, routers, and gateways. In some implementations, the communications system connects to or traverses a wide area network (WAN) such as the Internet. For example, the communications system may include multiple LANs connected to each other over the Internet or point-to-point leased lines using technologies including Multiprotocol Label Switching (MPLS) and virtual private networks (VPNs).

In various implementations, the functionality of the module may be distributed among multiple modules that are connected via the communications system. For example, multiple modules may implement the same functionality distributed by a load balancing system. In a further example, the functionality of the module may be split between a server (also known as remote, or cloud) module and a client (or, user) module.

The term code, as used above, may include software, firmware, and/or microcode, and may refer to programs, routines, functions, classes, data structures, and/or objects. Shared processor hardware encompasses a single microprocessor that executes some or all code from multiple modules. Group processor hardware encompasses a microprocessor that, in combination with additional microprocessors, executes some or all code from one or more modules. References to multiple microprocessors encompass multiple microprocessors on discrete dies, multiple microprocessors on a single die, multiple cores of a single microprocessor, multiple threads of a single microprocessor, or a combination of the above.

Shared memory hardware encompasses a single memory device that stores some or all code from multiple modules. Group memory hardware encompasses a memory device that, in combination with other memory devices, stores some or all code from one or more modules.

The term memory hardware is a subset of the term computer-readable medium. The term computer-readable medium, as used herein, does not encompass transitory electrical or electromagnetic signals propagating through a medium (such as on a carrier wave); the term computer-readable medium is therefore considered tangible and non-transitory. Non-limiting examples of a non-transitory computer-readable medium are nonvolatile memory devices (such as a flash memory device, an erasable programmable read-only memory device, or a mask read-only memory device), volatile memory devices (such as a static random access memory device or a dynamic random access memory device), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

The computer programs include processor-executable instructions that are stored on at least one non-transitory computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C #, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. A computer system for testing a user interface (UI), the computer system comprising:
processor hardware and
memory hardware including:
a test creation module configured to obtain testing parameters, wherein the testing parameters include (i) a location at which the UI can be accessed and (ii) criteria for a goal associated with the UI, wherein the criteria for a goal is matching of a particular text string;
a test execution module configured to (i) obtain a state of the UI based on the location and (ii) set a current position to a predetermined location within the UI; and
an analysis module configured to:
analyze a designated state of the UI,
in response to determining that the designated state satisfies the criteria for the goal, output a success indicator, and
in response to determining that the designated state of the UI does not satisfy the criteria for the goal, determine a set of possible submit, link, or entry actions based on UI submit link, or entry elements within the designated state and set the outcome to the set of possible actions,
wherein the test execution module is configured to:
provide a state of the UI to the analysis module and receive the output from the analysis module,
in response to the received output being the set of possible actions:
select an action from the set of possible actions, wherein the action is associated with a first UI element,
execute the selected action,
identify a point of the first UI element,
update a test distance based on (i) coordinates of the point and (ii) coordinates of the current position,
set the current position to the point, and
supplement test data with (i) the selected action and (ii) the set of possible actions,
in response to the received output being the success indicator, store the test distance and the test data in a collection of completed tests,
determine a shortest path to the goal in the UI based on the collection of completed tests;
a training module configured to, in response to the received output being the success indicator:
train a plurality of neural networks using the test data,
determine a performance of the plurality of neural networks after training based on probabilities stored in the collection of completed tests, and
in response to determining that a value of the performance of the plurality of neural networks after training is greater than a predetermined value, set a status of the plurality of neural networks to trained; and
a Monte Carlo module configured to perform a Monte Carlo simulation to:
in response to the status of the plurality of neural networks being trained, update each probability stored in the test data based on an output of at least one neural network of the plurality of neural networks, and
in response to the status of the plurality of neural networks not being trained, update each probability stored in the test data with a random value generated by the Monte Carlo module.

2. The computer system of claim 1 wherein:
the testing parameters include a number of permitted tests;
the test execution module is configured to increment a counter in response to the received output being the success indicator; and
determining the shortest path includes selecting, in response to determining that a value of the counter is greater than or equal to the number of permitted tests, a completed test of the collection of completed tests with the shortest test distance.

3. The computer system of claim 1 wherein:
the point is a closest point of the first UI element to the current position; and
updating the test distance includes (i) determining a distance between the coordinates of the current position and the coordinates of the point and (ii) adding the determined distance to the test distance.

4. The computer system of claim 1 wherein:
the analysis module is configured to, for each action in the set of possible actions, (i) determine a probability that performing the action will result in the goal and (ii) store the determined probability in the set of possible actions; and
selecting the action from the set of possible includes selecting the action from the set of possible actions based on probabilities stored in the set of possible actions.

5. The computer system of claim 4 further comprising:
a neural network module configured to operate the plurality of neural networks,
wherein the analysis module is configured to selectively use at least one neural network of the plurality of neural networks to determine the probability that performing the action will result in the goal.

6. The computer system of claim 5 wherein the plurality of neural networks includes at least one of a long short-term memory neural network and a convolutional neural network.

7. A method for testing a user interface (UI), the method comprising:
obtaining testing parameters, wherein the testing parameters include (i) a location at which the UI can be accessed and (ii) criteria for a goal associated with the UI, wherein the criteria for a goal is matching of a particular text string;
obtaining a state of the UI based on the location;
setting a current position to a predetermined location within the UI;
analyzing a designated state of the UI;
in response to determining that the designated state satisfies the criteria for the goal, setting an output to a success indicator;

in response to determining that the designated state does not satisfy the criteria for the goal, (i) determining a set of possible submit, link, or entry actions based on UI submit, link, or entry elements within the designated state and (ii) setting the output to the set of possible actions;

in response to the output being the set of possible actions:
  selecting an action from the set of possible actions, wherein the action is associated with a first UI element,
  executing the selected action,
  identifying a point of the first UI element,
  updating a test distance based on (i) coordinates of the point and (ii) coordinates of the current position,
  setting the current position to the point, and
  supplement test data with (i) the selected action and (ii) the set of possible actions;

in response to the output being the success indicator, storing the test distance and the test data in a collection of completed tests;

determining a shortest path to the goal in the UI based on the collection of completed tests;

in response to the output being the success indicator:
  training a plurality of neural networks using the test data,
  determining a performance of the plurality of neural networks after training based on the probabilities stored in the collection of completed tests, and
  in response to determining that a value of the performance of the plurality of neural networks after training is greater than a predetermined value, setting a status of the plurality of neural networks to trained; and performing a Monte Carlo simulation to:
  in response to the status of the plurality of neural networks being trained, update each probability stored in the test data based on an output of at least one neural network of the plurality of neural networks, and
  in response to the status of the plurality of neural networks not being trained, update each probability stored in the test data with a random value generated by the Monte Carlo simulation.

8. The method of claim 7 wherein:
the testing parameters include a number of permitted tests;
the method further comprises incrementing a counter in response to the output being the success indicator; and
determining the shortest path includes, in response to determining that a value of the counter is greater than or equal to the number of permitted tests, selecting a completed test of the collection of completed tests with the shortest test distance.

9. The method of claim 7 wherein:
the point is a closest point of the first UI element to the current position, and
updating the test distance includes (i) determining a distance between the coordinates of the current position and the coordinates of the point and (ii) adding the determined distance to the test distance.

10. The method of claim 7 further comprising:
for each action in the set of possible actions, (i) determining a probability that performing the action will result in the goal and (ii) storing the determined probability in the set of possible actions,
wherein selecting the action from the set of possible includes selecting the action from the set of possible actions based on probabilities stored in the set of possible actions.

11. A non-transitory computer-readable medium storing processor-executable instructions, the instructions comprising:
  obtaining testing parameters, wherein the testing parameters include (i) a location at which a user interface (UI) can be accessed and (ii) criteria for a goal associated with the UI, wherein the criteria for a goal is matching of a particular text string;
  obtaining a state of the UI based on the location;
  setting a current position to a predetermined location within the UI;
  analyzing a designated state of the UI;
  in response to determining that the designated state satisfies the criteria for the goal, setting an output to a success indicator;
  in response to determining that the designated state does not satisfy the criteria for the goal, (i) determining a set of possible submit, link, or entry actions based on UI submit, link, or entry elements within the designated state and (ii) setting the output to the set of possible actions;
  in response to the output being the set of possible actions:
    selecting an action from the set of possible actions, wherein the action is associated with a first UI element,
    executing the selected action,
    identifying a point of the first UI element,
    updating a test distance based on (i) coordinates of the point and (ii) coordinates of the current position,
    setting the current position to the point, and
    supplementing test data with (i) the selected action and (ii) the set of possible actions;
  in response to the output being the success indicator, storing the test distance and the test data in a collection of completed tests;
  determining a shortest path to the goal in the UI based on the collection of completed tests;
  in response to the output being the success indicator:
    training a plurality of neural networks using the test data,
    determining a performance of the plurality of neural networks after training based on the probabilities stored in the collection of completed tests, and
    setting, in response to determining that a value of the performance of the plurality of neural networks after training is greater than a predetermined value, a status of the plurality of neural networks to trained; and
  performing a Monte Carlo simulation to:
    in response to the status of the plurality of neural networks being trained, update each probability stored in the test data based on an output of at least one neural network of the plurality of neural networks, and
    in response to the status of the plurality of neural networks not being trained, update each probability stored in the test data with a random value generated by the Monte Carlo simulation.

12. The non-transitory computer-readable medium of claim 11 wherein:
the testing parameters include a number of permitted tests;

the instructions further comprise incrementing a counter in response to the output being the success indicator; and determining the shortest path includes, in response to determining that a value of the counter is greater than or equal to the number of permitted tests, selecting a completed test of the collection of completed tests with the shortest test distance.

13. The non-transitory computer-readable medium of claim 11 wherein:

the point is a closest point of the first UI element to the current position; and updating the test distance includes (i) determining a distance between the coordinates of the current position and the coordinates of the point and (ii) adding the determined distance to the test distance.

14. The non-transitory computer-readable medium of claim 11, wherein:

the instructions further comprise, for each action in the set of possible actions, (i) determining a probability that performing the action will result in the goal and (ii) storing the determined probability in the set of possible actions; and selecting the action from the set of possible includes selecting the action from the set of possible actions based on probabilities stored in the set of possible actions.

\* \* \* \* \*